(12) United States Patent
Onuki et al.

(10) Patent No.: US 11,721,370 B2
(45) Date of Patent: *Aug. 8, 2023

(54) SEMICONDUCTOR DEVICE

(71) Applicant: Semiconductor Energy Laboratory Co., Ltd., Kanagawa-ken (JP)

(72) Inventors: Tatsuya Onuki, Kanagawa (JP); Takanori Matsuzaki, Kanagawa (JP); Kiyoshi Kato, Kanagawa (JP); Shunpei Yamazaki, Tokyo (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/232,708

(22) Filed: Apr. 16, 2021

(65) Prior Publication Data

US 2021/0280221 A1 Sep. 9, 2021

Related U.S. Application Data

(63) Continuation of application No. 16/643,755, filed as application No. PCT/IB2018/056697 on Sep. 3, 2018, now Pat. No. 10,984,840.

(30) Foreign Application Priority Data

Sep. 6, 2017 (JP) .................. 2017-170766
Sep. 6, 2017 (JP) .................. 2017-171116

(51) Int. Cl.
  *G11C 7/02* (2006.01)
  *G11C 7/06* (2006.01)
  *G11C 14/00* (2006.01)
(52) U.S. Cl.
  CPC ............ *G11C 7/06* (2013.01); *G11C 14/0009* (2013.01)

(58) Field of Classification Search
  CPC .............................. G11C 7/06; G11C 14/0009
  (Continued)

(56) References Cited

U.S. PATENT DOCUMENTS 6,445,026 B1    9/2002   Kubota et al.
7,551,471 B2    6/2009   Yamazaki
(Continued)

FOREIGN PATENT DOCUMENTS

CN     001727972 A    2/2006
CN     101064361 A    10/2007
(Continued)

OTHER PUBLICATIONS

International Search Report (Application No. PCT/IB2018/056697) dated Nov. 27, 2018.
(Continued)

*Primary Examiner* — Vu A Le
(74) *Attorney, Agent, or Firm* — Husch Blackwell LLP

(57) ABSTRACT

To provide a novel semiconductor device.
The semiconductor device includes cell arrays and peripheral circuits; the cell arrays include memory cells; the peripheral circuits includes a first driver circuit, a second driver circuit, a first amplifier circuit, a second amplifier circuit, a third amplifier circuit, and a fourth amplifier circuit; the first driver circuit and the second driver circuit have a function of supplying a selection signal to the cell array; the first amplifier circuit and the second amplifier circuit have a function of amplifying a potential input from the cell array; the third amplifier circuit and the fourth amplifier circuit have a function of amplifying a potential input from the first amplifier circuit or the second amplifier circuit; the first driver circuit, the second driver circuit, the first amplifier circuit, the second amplifier circuit, the third amplifier circuit, and the fourth amplifier circuit include a (Continued)

region overlapping with the cell array; and the memory cells include a metal oxide in a channel formation region.

16 Claims, 28 Drawing Sheets

(58) Field of Classification Search
USPC .......................................................... 365/207
See application file for complete search history.

(56) References Cited

U.S. PATENT DOCUMENTS

| | | | |
|---|---|---|---|
| 7,692,617 B2 | 4/2010 | Kim et al. | |
| 7,902,539 B2 | 3/2011 | Moniwa et al. | |
| 8,071,456 B2 | 12/2011 | Moniwa et al. | |
| 8,338,817 B2 | 12/2012 | Moniwa et al. | |
| 8,508,967 B2 | 8/2013 | Yamazaki et al. | |
| 8,809,927 B2 | 8/2014 | Takemura | |
| 9,042,161 B2 | 5/2015 | Koyama et al. | |
| 9,076,505 B2 | 7/2015 | Atsumi et al. | |
| 9,230,615 B2 | 1/2016 | Takemura | |
| 9,263,116 B2 | 2/2016 | Koyama et al. | |
| 9,310,657 B2 | 4/2016 | Kim et al. | |
| 9,478,276 B2 | 10/2016 | Onuki | |
| 9,542,977 B2 | 1/2017 | Onuki et al. | |
| 9,627,034 B2 | 4/2017 | Matsuzaki | |
| 9,691,782 B1* | 6/2017 | Hwang ............. H01L 27/11573 | |
| 9,704,562 B2 | 7/2017 | Onuki et al. | |
| 9,728,243 B2 | 8/2017 | Kato | |
| 9,741,400 B2 | 8/2017 | Nagatsuka et al. | |
| 9,837,546 B2 | 12/2017 | Yamazaki et al. | |
| 9,874,794 B2 | 1/2018 | Kim et al. | |
| 9,990,965 B2 | 6/2018 | Atsumi | |
| 10,019,025 B2 | 7/2018 | Yamazaki | |
| 10,025,149 B2 | 7/2018 | Kim et al. | |
| 10,037,294 B2 | 7/2018 | Onuki et al. | |
| 10,062,790 B2 | 8/2018 | Yamazaki et al. | |
| 10,210,915 B2 | 2/2019 | Onuki | |
| 10,304,523 B2 | 5/2019 | Kato et al. | |
| 10,424,671 B2 | 9/2019 | Yamazaki et al. | |
| 10,522,691 B2 | 12/2019 | Yamazaki et al. | |
| 10,622,059 B2 | 4/2020 | Onuki | |
| 11,031,403 B2 | 6/2021 | Yamazaki et al. | |
| 11,101,300 B2 | 8/2021 | Onuki et al. | |
| 11,164,871 B2 | 11/2021 | Matsuzaki et al. | |
| 2005/0073871 A1* | 4/2005 | Luk ....................... H01L 27/108 257/E27.084 | |
| 2009/0101968 A1 | 4/2009 | Sugioka | |
| 2012/0057396 A1 | 3/2012 | Yamazaki et al. | |
| 2012/0063208 A1 | 3/2012 | Koyama et al. | |
| 2012/0193697 A1 | 8/2012 | Takemura | |
| 2013/0148411 A1 | 6/2013 | Atsumi et al. | |
| 2016/0104521 A1 | 4/2016 | Onuki et al. | |
| 2016/0163374 A1 | 6/2016 | Koyama et al. | |
| 2016/0322368 A1* | 11/2016 | Sun .................... H01L 29/78391 |
| 2017/0033109 A1 | 2/2017 | Yamazaki | |
| 2017/0033111 A1 | 2/2017 | Yamazaki et al. | |
| 2017/0221899 A1 | 8/2017 | Uesugi et al. | |
| 2017/0229174 A1* | 8/2017 | Or-Bach ............. H01L 27/2436 |
| 2019/0088676 A1 | 3/2019 | Tagami et al. | |
| 2020/0194590 A1 | 6/2020 | Yamazaki et al. | |
| 2021/0125988 A1 | 4/2021 | Yamazaki et al. | |
| 2022/0157818 A1 | 5/2022 | Matsuzaki et al. | |

FOREIGN PATENT DOCUMENTS

| | | |
|---|---|---|
| CN | 101447501 A | 6/2009 |
| DE | 11 2011 103 061 T5 | 7/2013 |
| JP | 2001/003190 | 1/2003 |
| JP | 2009-105195 A | 5/2009 |
| JP | 2012-178555 A | 9/2012 |
| JP | 2012-256820 A | 12/2012 |
| JP | 2012-256821 A | 12/2012 |
| JP | 2013-168631 A | 8/2013 |
| JP | 2016-127193 A | 7/2016 |
| JP | 2017-028237 A | 2/2017 |
| JP | 2017-034249 A | 2/2017 |
| JP | 2018-190976 A | 11/2018 |
| JP | 2019-029666 A | 2/2019 |
| KR | 2012-0089588 A | 8/2012 |
| KR | 2013-0119421 A | 10/2013 |
| KR | 2016-0115829 A | 10/2016 |
| KR | 2017-0015179 A | 2/2017 |
| WO | WO 2012/029638 A1 | 3/2012 |
| WO | WO 2012/036001 A1 | 3/2012 |
| WO | WO 2018/167588 A1 | 9/2018 |
| WO | WO 2018/197994 A1 | 11/2018 |
| WO | WO 2019/021098 A1 | 1/2019 |
| WO | WO 2019/048987 A1 | 3/2019 |

OTHER PUBLICATIONS

Written Opinion (Application No. PCT/IB2018/056697) dated Nov. 27, 2018.

Chinese Office Action (Application No. 201880056418.0) dated Feb. 15, 2023.

* cited by examiner

FIG. 11A
FIG. 11C
FIG. 11B
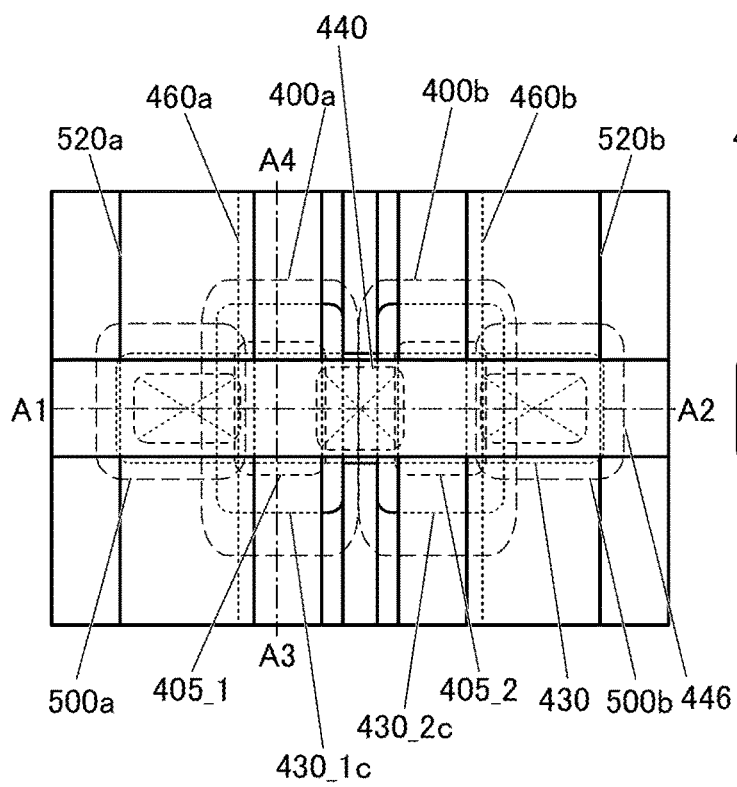
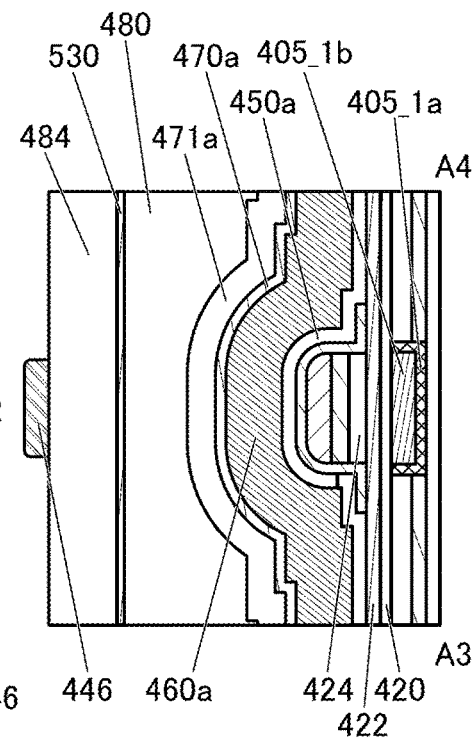
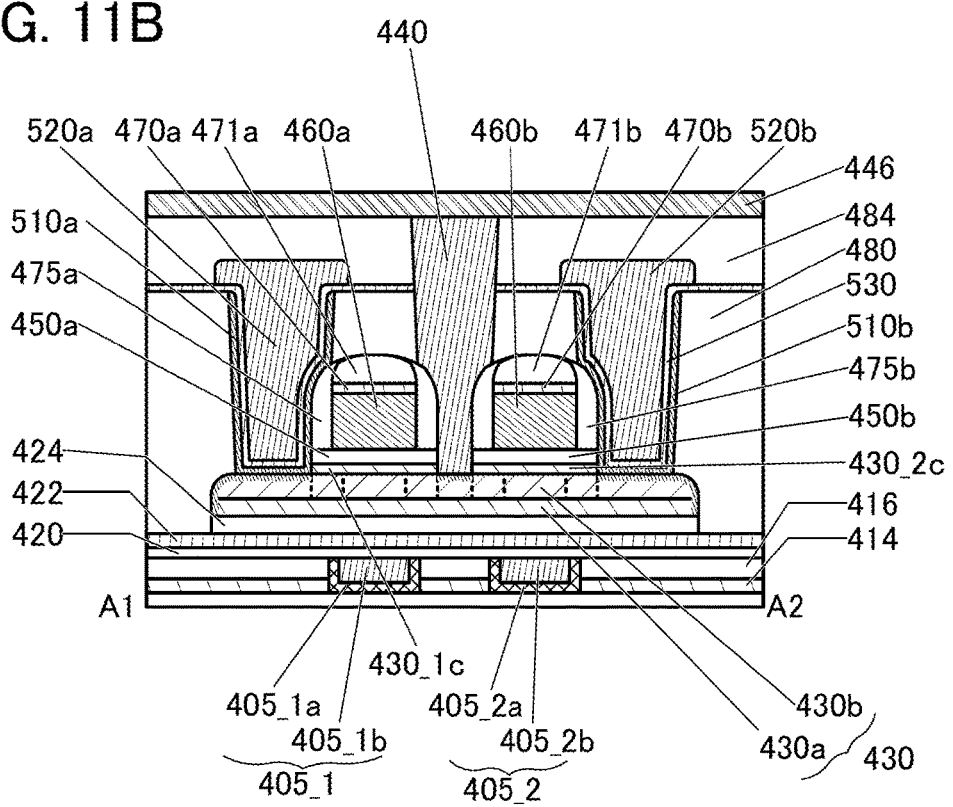

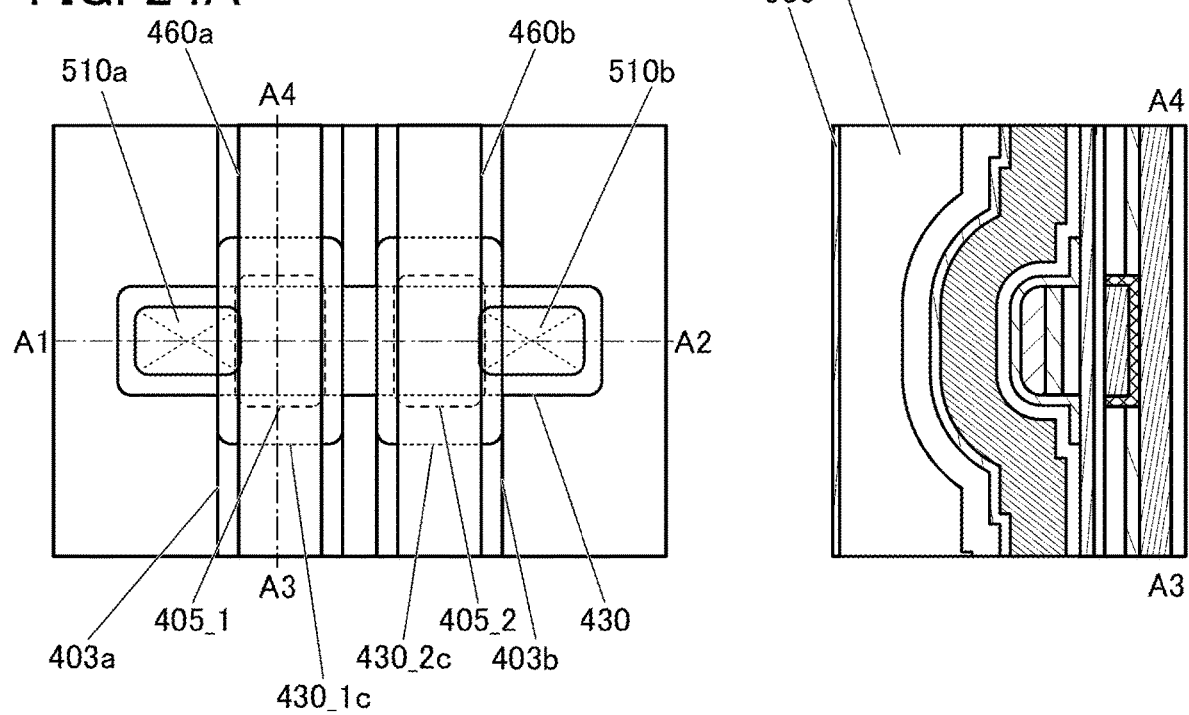
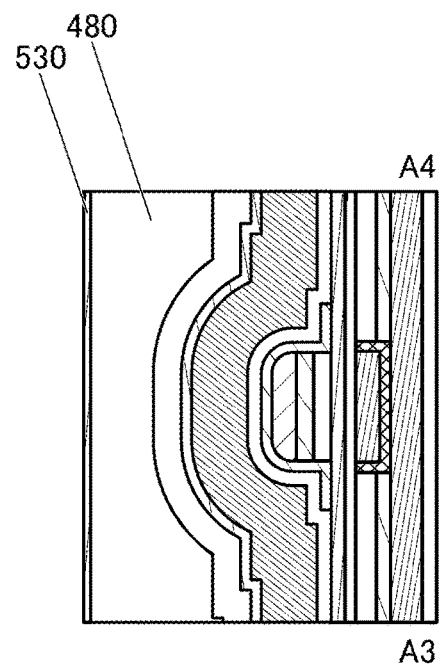
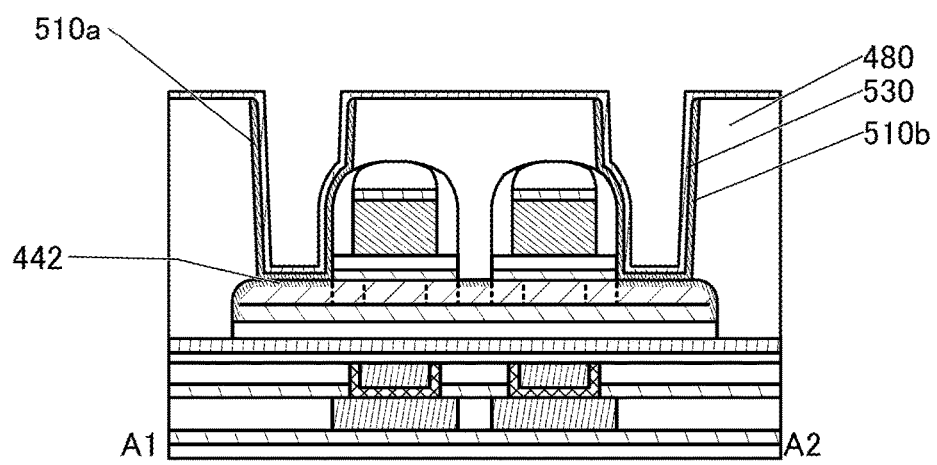
FIG. 24A
FIG. 24C
FIG. 24B

SEMICONDUCTOR DEVICE

This application is a continuation of copending U.S. application Ser. No. 16/643,755, filed on Mar. 2, 2020 which is a 371 of international application PCT/IB2018/056697 filed on Sep. 3, 2018 which are all incorporated herein by reference.

TECHNICAL FIELD

One embodiment of the present invention relates to a semiconductor device, a computer, and an electronic device.

Note that one embodiment of the present invention is not limited to the above technical field. Examples of the technical field of one embodiment of the present invention disclosed in this specification and the like include a semiconductor device, an imaging device, a display device, a light-emitting apparatus, a power storage device, a memory device, a display system, an electronic device, a lighting device, an input device, an input/output device, a driving method thereof, and a manufacturing method thereof.

The semiconductor device in this specification and the like means every device which can function by utilizing semiconductor characteristics. A transistor, a semiconductor circuit, an arithmetic device, a memory device, and the like are each an embodiment of the semiconductor device. In addition, a display device, an imaging device, an electro-optical device, a power generation device (including a thin film solar cell, an organic thin film solar cell, and the like), and an electronic device may include a semiconductor device.

BACKGROUND ART

A DRAM (Dynamic Random Access Memory) is widely used as a memory incorporated in various kinds of electronic devices. A DRAM has been miniaturized in accordance with a scaling law like other semiconductor integrated circuits. Patent Document 1 discloses a manufacturing method of a transistor suitable for miniaturization of a DRAM.

Patent Document 2 discloses an example in which a transistor using an oxide semiconductor is used for a DRAM. The transistor using an oxide semiconductor has an extremely low leakage current in an off state (off-state current), and thus enables fabrication of a low-power-consumption memory having long refresh intervals.

PRIOR ART DOCUMENTS

Patent Document

[Patent Document 1] Japanese Published Patent Application No. 2016-127193
[Patent Document 2] Japanese Published Patent Application No. 2017-28237

SUMMARY OF THE INVENTION

Problems to be Solved by the Invention

An object of one embodiment of the present invention is to provide a novel semiconductor device. Another object of one embodiment of the present invention is to provide a semiconductor device with a small circuit area. Another object of one embodiment of the present invention is to provide a semiconductor device with low power consumption. Another object of one embodiment of the present invention is to provide a semiconductor device capable of high-speed operation.

One embodiment of the present invention does not have to achieve all the above objects and only needs to achieve at least one of the objects. The descriptions of the above objects do not preclude the existence of other objects. Objects other than these objects will be apparent from and can be derived from the descriptions of the specification, the claims, the drawings, and the like.

Means for Solving the Problems

A semiconductor device of one embodiment of the present invention is a semiconductor device that includes a plurality of cell arrays and a plurality of peripheral circuits and in which the cell arrays include a plurality of memory cells; the peripheral circuits includes a first driver circuit, a second driver circuit, a first amplifier circuit, a second amplifier circuit, a third amplifier circuit, and a fourth amplifier circuit; the first driver circuit and the second driver circuit have a function of supplying a selection signal to the cell array; the first amplifier circuit and the second amplifier circuit have a function of amplifying a potential input from the cell array; the third amplifier circuit and the fourth amplifier circuit have a function of amplifying a potential input from the first amplifier circuit or the second amplifier circuit; the first driver circuit, the second driver circuit, the first amplifier circuit, the second amplifier circuit, the third amplifier circuit, and the fourth amplifier circuit include a region overlapping with the cell array; and the memory cells include a metal oxide in a channel formation region.

In the semiconductor device of one embodiment of the present invention, the first driver circuit may be adjacent to the second driver circuit, the second amplifier circuit, and the third amplifier circuit; the second driver circuit may be adjacent to the first driver circuit, the first amplifier circuit, and the fourth amplifier circuit; the first amplifier circuit may be adjacent to the second driver circuit, the second amplifier circuit, the third amplifier circuit, and the fourth amplifier circuit; and the second amplifier circuit may be adjacent to the first driver circuit, the first amplifier circuit, the third amplifier circuit, and the fourth amplifier circuit.

In the semiconductor device of one embodiment of the present invention, the first driver circuit and the second driver circuit may be electrically connected to the cell arrays through a plurality of first wirings; the first amplifier circuit and the second amplifier circuit may be electrically connected to the cell arrays through a plurality of second wirings; the third amplifier circuit and the fourth amplifier circuit may be electrically connected to a third wiring; the third wiring is provided so as to cross the plurality of peripheral circuits; and the third wiring does not need to be in contact with the plurality of first wirings and the plurality of second wirings.

In the semiconductor device of one embodiment of the present invention, the cell arrays may include first to fourth sub arrays; the first driver circuit may have a function of supplying a selection signal to the first sub array and the second sub array; the second driver circuit may have a function of supplying a selection signal to the third sub array and the fourth sub array; and the first amplifier circuit and the second amplifier circuit may have a function of amplifying a potential input from the first sub array and the third sub array or a potential input from the second sub array and the fourth sub array.

A computer of one embodiment of the present invention is a computer including the above semiconductor device used in a cache memory or a main memory device.

An electronic devices of one embodiment of the present invention is an electronic device incorporating the above semiconductor device or the above computer.

Effect of the Invention

One embodiment of the present invention can provide a novel semiconductor device. Another embodiment of the present invention can provide a semiconductor device with a small circuit area. Another embodiment of the present invention can provide a semiconductor device with low power consumption. Another embodiment of the present invention can provide a semiconductor device capable of high-speed operation.

Note that the descriptions of the effects do not disturb the existence of other effects. One embodiment of the present invention does not have to have all of these effects. Effects other than these will be apparent from and can be derived from the descriptions of the specification, the claims, the drawings, and the like.

BRIEF DESCRIPTION OF THE DRAWINGS

FIGS. 2A-2B3 are diagrams illustrating configuration examples of a semiconductor device and memory cells.

FIGS. 11A-11C are diagrams illustrating a structure example of a semiconductor device.

FIGS. 24A-24C are diagrams illustrating a method for manufacturing a semiconductor device.

FIGS. 28A-28E2 are diagrams of electronic devices.

MODE FOR CARRYING OUT THE INVENTION

Figure 1:
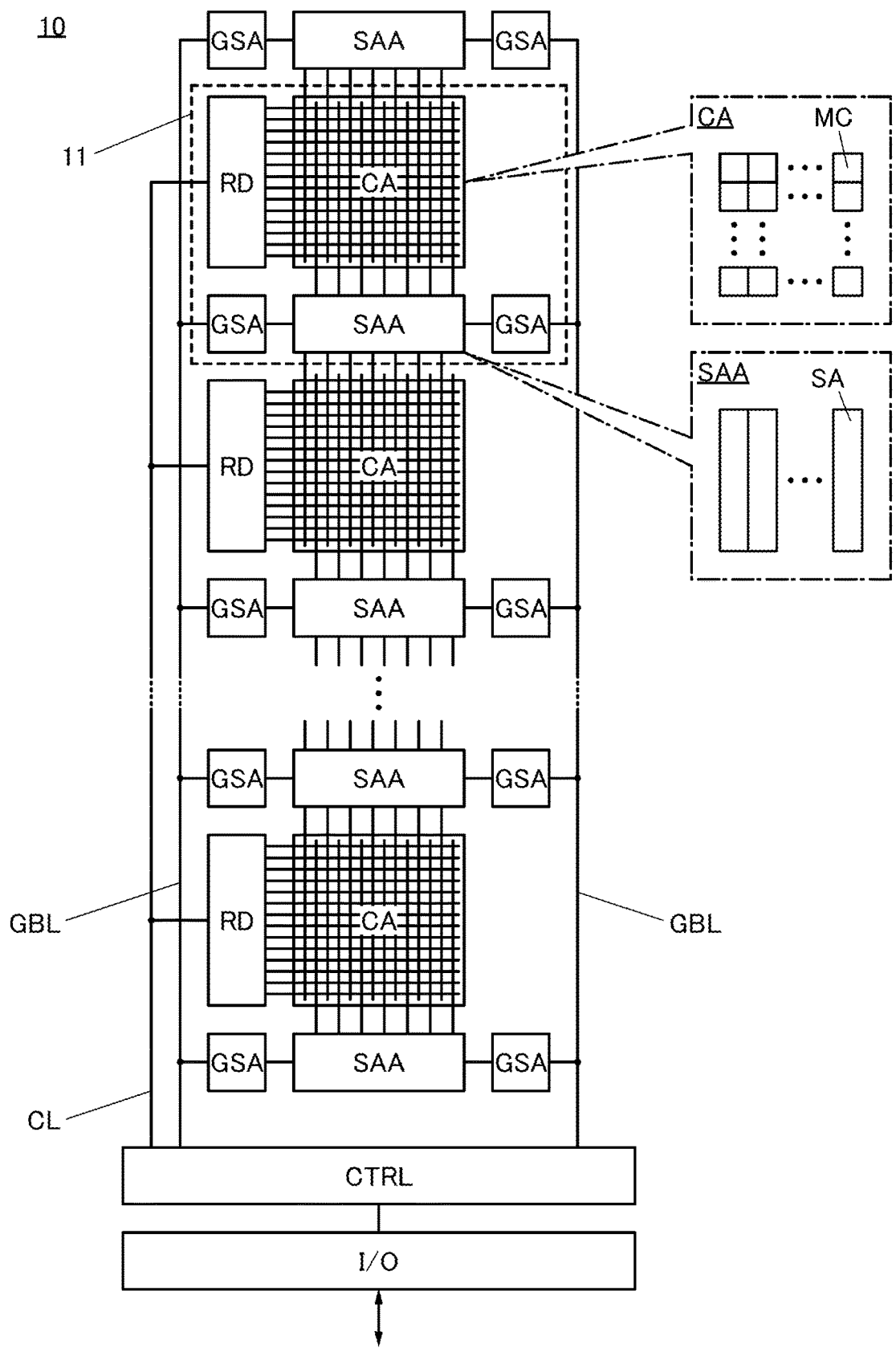
FIG. 1 is a diagram illustrating a configuration example of a semiconductor device.

Embodiments of the present invention will be described in detail below with reference to the drawings. Note that the present invention is not limited to the descriptions in the following embodiments and it is easily understood by those skilled in the art that the modes and details can be variously changed without departing from the scope and spirit of the present invention. Therefore, the present invention should not be interpreted as being limited to the descriptions of the embodiments below.

In this specification and the like, a metal oxide means an oxide of metal in a broad sense. Metal oxides are classified into an oxide insulator, an oxide conductor (including a transparent oxide conductor), an oxide semiconductor, and the like. For example, in the case where a metal oxide is used in a channel formation region of a transistor, the metal oxide is called an oxide semiconductor in some cases. That is to say, in the case where a metal oxide has at least one of an amplifying function, a rectifying function, and a switching function, the metal oxide can be called a metal oxide semiconductor. A transistor including a metal oxide in a channel formation region is also referred to as an OS transistor below.

In this specification and the like, metal oxides containing nitrogen are also collectively referred to as a metal oxide in some cases. A metal oxide containing nitrogen may be referred to as a metal oxynitride. The details of a metal oxide will be described later.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relation shown in drawings or texts, a connection relationship other than one shown in drawings or texts is described in the drawings or the texts. Here, X and Y each denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting device, or a load) is not connected between X and Y, and is the case where X and Y are connected without an element that allows electrical connection between X and Y (e.g., a switch, a transistor, a capacitor, an inductor, a resistor, a diode, a display element, a light-emitting device, or a load) placed therebetween.

In an example of the case where X and Y are electrically connected, at least one element that allows electrical connection between X and Y (e.g., a switch, a transistor, a capacitor, an inductor, a resistor, a diode, a display element, a light-emitting device, or a load) can be connected between X and Y. Note that a switch has a function of being controlled to be turned on or off. That is, a switch has a function of being turned on or off to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. Note that even if another circuit is sandwiched between X and Y, for example, X and Y are regarded as being functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

In this specification and the like, expressions "one of a source and a drain" (or a first electrode or a first terminal) and "the other of the source and the drain" (or a second electrode or a second terminal) are used in description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. Note that in this specification and the like, a channel formation region refers to a region where a channel is formed; this region is formed by application of a potential to the gate, so that current can flow between the source and the drain.

Furthermore, functions of a source and a drain might be switched when a transistor of opposite polarity is employed or a direction of current flow is changed in circuit operation, for example. Thus, the terms of source and drain are interchangeable for use in this specification and the like.

In this specification and the like, in the case where a transistor has two or more gates, these gates are referred to as a first gate and a second gate or a front gate and a back gate in some cases. In particular, the term "front gate" can be replaced by the simple term "gate". In addition, the term "back gate" can be replaced by the simple term "gate".

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a formation of a plurality of "electrodes" and "wirings" formed in an integrated manner.

In this specification and the like, voltage and potential can be interchanged with each other as appropriate. The voltage refers to a potential difference from a reference potential. When the reference potential is a ground potential, for example, the voltage can be replaced by the potential. The ground potential does not necessarily mean 0 V. Potentials are relative values, and the potential applied to a wiring or the like is changed depending on the reference potential, in some cases.

In this specification and the like, the terms "wiring", "signal line", "power supply line", and the like can be interchanged with each other depending on circumstances or conditions. For example, the term "wiring" can be changed into the term "signal line" in some cases. In addition, the term "wiring" can be changed into the term such as "power supply line" in some cases. Inversely, the term such as "signal line" or "power supply line" can be changed into the term "wiring" in some cases. The term such as "power supply line" can be changed into the term such as "signal line" in some cases. Conversely, the term such as "signal line" can be changed into the term such as "power supply line" in some cases. The term "potential" that is applied to a wiring can be changed into the term "signal" or the like depending on circumstances or conditions. Conversely, the term "signal" or the like can be changed into the term "potential" in some cases.

Even when a diagram shows that independent components are electrically connected to each other, one component has functions of a plurality of components in some cases. For example, when part of a wiring also functions as an electrode, one conductive film has a function of the wiring and a function of the electrode. Thus, electrical connection in this specification includes in its category such a case where one conductive film has functions of a plurality of components.

Embodiment 1

In this embodiment, configuration examples of a semiconductor device of embodiments of the present invention will be described.
<Semiconductor Device>

FIG. 1 illustrates a configuration example of a semiconductor device 10 of one embodiment of the present invention. The semiconductor device 10 has a function of a memory device. Thus, the semiconductor device 10 can also be referred to as a memory device.

The semiconductor device 10 includes cell arrays CA, driver circuits RD, sense amplifier arrays SAA, global sense amplifiers GSA, a control circuit CTRL, and an input/output circuit I/O. In FIG. 1, a region composed of the cell array CA, the driver circuit RD, the sense amplifier array SAA, and two global sense amplifiers GSA is referred to as a block 11. The semiconductor device 10 includes a plurality of blocks 11.

The cell array CA is composed of a plurality of memory cells MC arranged in a matrix. The memory cell MC is a memory circuit having a function of storing data. Data stored in the memory cell MC may be 1-bit data (binary data) or data of two or more bits (multilevel data). Furthermore, the data may be analog data.

The driver circuit RD is a row decoder having a function of selecting the memory cells MC in a predetermined row. Specifically, the driver circuit RD has a function of supplying a signal for selecting the memory cell MC to/from which data is to be written or read out (hereinafter also referred to as a selection signal).

The sense amplifier array SAA is an amplifier circuit having a function of amplifying an input signal and outputting the amplified signal to the cell array CA or the global sense amplifier GSA. Specifically, the sense amplifier array SAA has a function of amplifying a potential corresponding to data to be written to the cell array CA (hereinafter this potential is also referred to as a write potential) and outputting the potential to the cell array CA, and a function of amplifying a potential corresponding to data read out from the cell array CA (hereinafter this potential is also referred to as a read potential) and outputting the potential to the global sense amplifier GSA. The sense amplifier array SAA has a function of selecting data to be output to the global sense amplifier GSA.

The sense amplifier array SAA can be composed of a plurality of sense amplifiers SA. A specific configuration example of the sense amplifier SA will be described later.

The global sense amplifier GSA is an amplifier circuit having a function of amplifying a signal that is input and outputting the amplified signal to the sense amplifier array SAA or the control circuit CTRL. Specifically, the global sense amplifier GSA has a function of amplifying a write potential input through a wiring GBL from the control circuit CTRL and outputting the amplified write potential to the sense amplifier array SAA. The global sense amplifier GSA has a function of amplifying a read potential input from the sense amplifier array SAA and outputting the amplified potential to the control circuit CTRL through the wiring GBL. The global sense amplifier GSA has a function of selecting data to be output to the wiring GBL.

The global sense amplifier GSA can be composed of a plurality of SA, like the sense amplifier array SAA, for example.

Figure 2A:
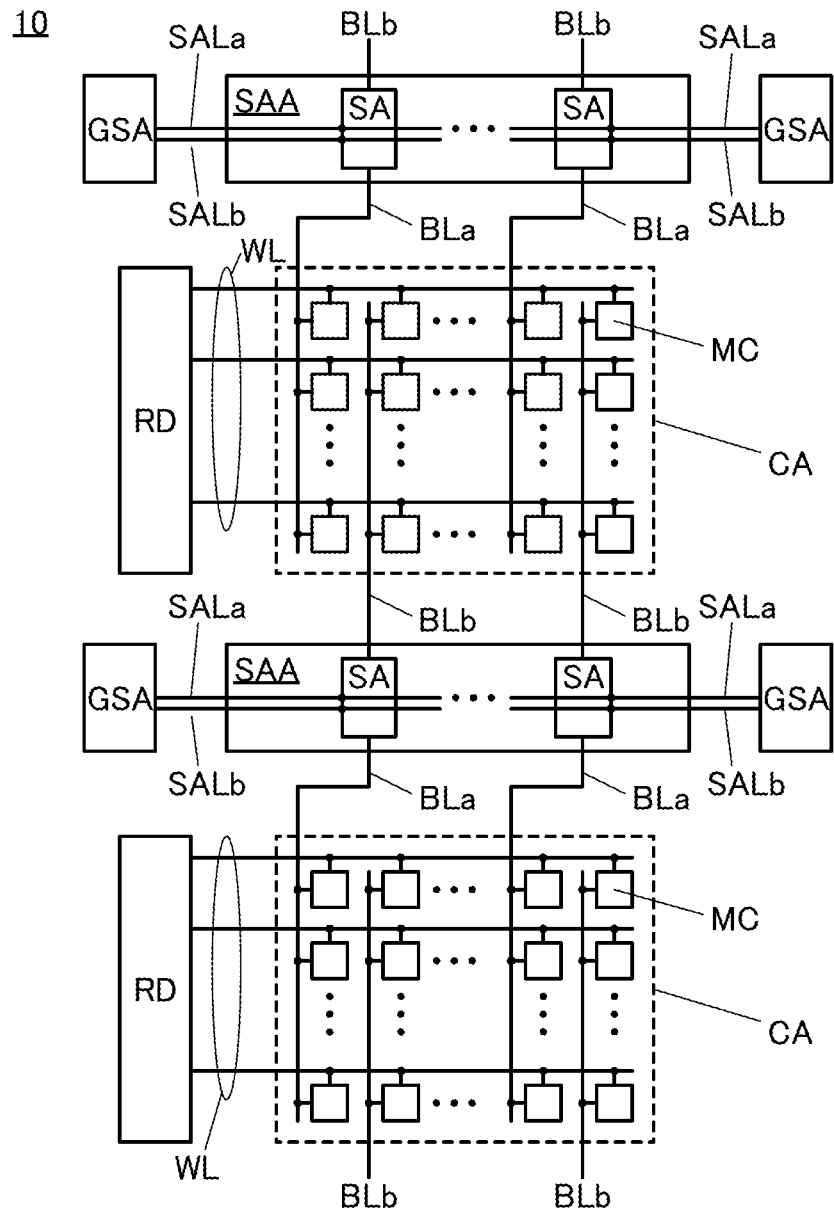
Figure 2A:
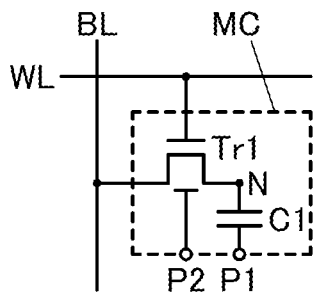
Figure 2A:
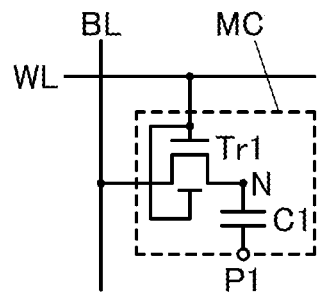
Figure 2A:
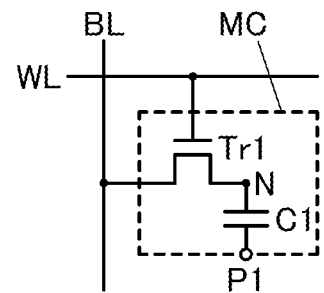

FIG. 2(A) illustrates a specific example of connection relation between the cell arrays CA, the driver circuits RD, the sense amplifier arrays SAA, and the global sense amplifiers GSA. The memory cells MC are connected to wirings WL and wirings BL. A selection signal is supplied from the driver circuit RD to the memory cell MC through the wiring WL. A write potential is supplied to the memory cell MC from the sense amplifier array SAA to the memory cell MC through the wiring BL. A read potential is supplied from the memory cell MC to the sense amplifier array SAA through the wiring BL.

The plurality of sense amplifiers SA included in the sense amplifier array SAA are each connected to a pair of wirings BL. FIG. 2(A) illustrates a configuration example in which the wirings BL (wirings BLa) connected to the memory cells MC in odd-numbered columns included in one of the cell arrays CA and the wirings BL (wirings BLb) connected to the memory cells MC in even-numbered columns included in the other cell array CA are connected to the same sense amplifier SA. The potential difference between the wiring BLa and the wiring BLb is amplified by the sense amplifier SA. The amplified read potential is output to the global sense amplifier GSA through a wiring SALa and a wiring SALb. Furthermore, in data writing, the potential difference between the wiring SALa and the wiring SALb is amplified by the sense amplifier SA, and the amplified potential is output as a write potential to the wiring BLa and the wiring BLb.

FIG. 2(A) illustrates an example where the sense amplifier array SAA is connected to two global sense amplifiers GSA. In this case, half of the sense amplifiers SA included in the sense amplifier array SSA are connected to one of the global sense amplifiers GSA, and the rest of the sense amplifiers SA are connected to the other global sense amplifier GSA.

The sense amplifiers SA each have a function of selecting whether to output a potential to the wiring SALa and the wiring SALb. Thus, a potential to be output from the sense amplifier array SAA to the global sense amplifier GSA can be selected.

FIG. 2(B-1) to FIG. 2(B-3) illustrate specific configuration examples of the memory cell MC. The memory cell MC illustrated in FIG. 2(B-1) includes a transistor Tr1 and a capacitor C1. A gate of the transistor Tr1 is connected to the wiring WL, one of a source and a drain thereof is connected to one electrode of the capacitor C1, and the other of the source and the drain thereof is connected to the wiring BL. The other electrode of the capacitor C1 is connected to a terminal P1. A node that is connected to one of the source and the drain of the transistor Tr1 and the one electrode of the capacitor C1 is referred to as a node N.

A predetermined potential is supplied to the node N from the wiring BL through the transistor Tr1. When the transistor Tr1 is off, the node N is in a floating state and thus the potential of the node N is retained. This enables storage of data in the memory cell MC. Note that the on/off state of the transistor Tr1 can be controlled by a potential (selection signal) supplied to the wiring WL.

The transistor Tr1 includes a back gate connected to a terminal P2. The threshold voltage of the transistor Tr1 can be controlled by controlling the potential of the terminal P2. For example, a fixed potential (e.g., a negative constant potential) or a potential varying depending on the operation of the memory cell MC may be used as the potential to be supplied to the terminal P2.

Here, an OS transistor is preferably used as the transistor Tr1. A metal oxide has a larger energy gap and a lower carrier density than other semiconductors such as silicon; thus, the off-state current of an OS transistor is extremely low. Note that off-state current refers to current that flows between a source and a drain when a transistor is off Therefore, when an OS transistor is used as the transistor Tr1, a potential can be retained at the node N for a long period, and operation in which another writing is performed at predetermined intervals (refresh operation) becomes unnecessary or the frequency of refresh operations can be extremely low. Thus, the power consumption of the semiconductor device 10 can be reduced.

In addition, an OS transistor has a higher withstand voltage than a transistor including silicon (single crystal silicon or the like) in its channel formation region (hereinafter, such a transistor is also referred to as a Si transistor).

Therefore, when the transistor Tr1 is an OS transistor, the range of potentials retained at the node N can be widened.

As a metal oxide, a Zn oxide, a Zn—Sn oxide, a Ga—Sn oxide, an In—Ga oxide, an In—Zn oxide, an In-M-Zn oxide (M is Ti, Ga, Y, Zr, La, Ce, Nd, Sn, or Hf), or the like can be used, for example. In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like. The case where an n-channel OS transistor is used as the transistor Tr1 is specifically described here.

As illustrated in FIG. 2(B-2), the back gate of the transistor Tr1 may be connected to a front gate. This can increase the on-state current of the transistor Tr1. The transistor Tr1 does not need to include a back gate as illustrated in FIG. 2(B-3).

The control circuit CTRL illustrated in FIG. 1 has a function of overseeing the whole operation of the semiconductor device 10 and controlling data reading and data writing. Specifically, the control circuit CTRL has a function of generating a variety of control signals for data reading and data writing by processing a signal input from the outside. For example, the control circuit CTRL generates a signal for controlling the operation of the driver circuit RD, and the signal is supplied to the driver circuit RD through the wiring CL.

The input/output circuit I/O has a function of receiving data from the outside and transmitting data to the outside. The input/output circuit I/O is connected to the control circuit CTRL.

In order to increase the operation speed of the semiconductor device 10, parasitic capacitance added to the wiring BL is preferably reduced. In order to reduce parasitic capacitance, it is preferable that the number of memory cells MC connected to one wiring BL be small and the number of intersection portions of the wirings BL and the wirings WL be small. Thus, a plurality of cell arrays CA are preferably provided as illustrated in FIG. 1 to reduce the number of memory cells MC included in one cell array CA. However, with the increase in the number of the cell arrays CA, the number of the sense amplifier arrays SAA also increases. Therefore, if the cell arrays CA are each divided to increase the operation speed, an increase in the number of the sense amplifier arrays SAA might increase the circuit area.

Figure 3A:
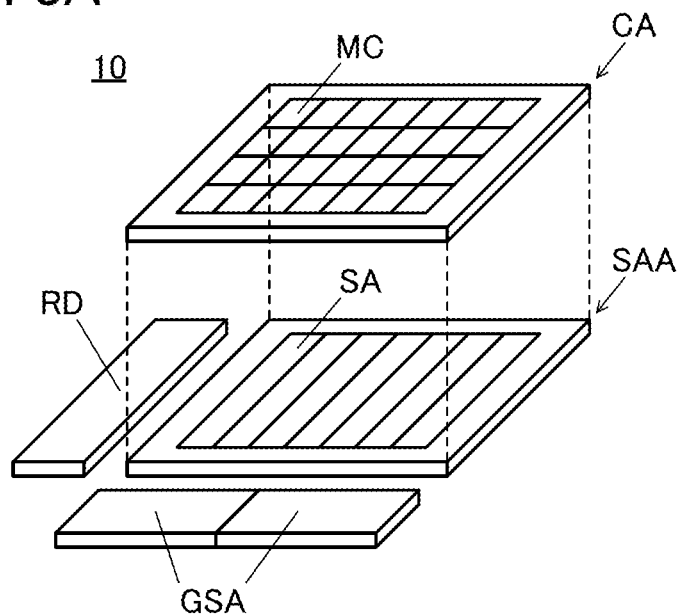
FIGS. 3A and 3B are diagrams illustrating examples of a stacked-layer structure of a semiconductor device.

An OS transistor can be stacked above another element (e.g., a transistor). Thus, the use of an OS transistor in the memory cell MC allows the cell array CA to be stacked above the sense amplifier array SAA as illustrated in FIG. 3(A). This can reduce or preclude an increase in the circuit area even in the case where the number of the sense amplifier arrays SAA is increased. Thus, while an increase in area is inhibited, the parasitic capacitance of the wiring BL can be reduced, and the operation speed of the semiconductor device 10 can be increased.

Figure 3B:
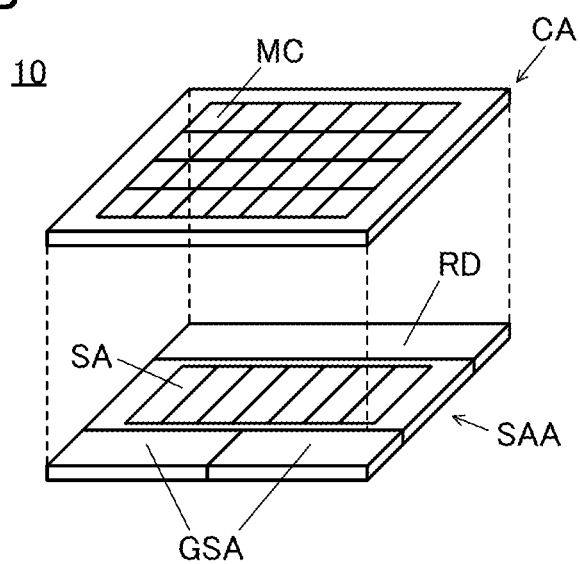

Furthermore, a circuit other than the sense amplifier array SAA can also be provided at a position overlapping with the cell array CA. For example, as illustrated in FIG. 3(B), the driver circuit RD and the global sense amplifier GSA in addition to the sense amplifier array SAA may be positioned so as to overlap with the cell array CA. This can further reduce the circuit area of the semiconductor device 10.

In the case where a circuit other than the sense amplifier array SAA is positioned at a position overlapping with the cell array CA, the circuit area of the sense amplifier array SAA is preferably as small as possible. For example, the number of the memory cells MC connected to one sense amplifier SA is doubled and the number of the sense amplifiers SA is reduced by half, whereby the area of the sense amplifier array SAA can be reduced by half.

Figure 4:
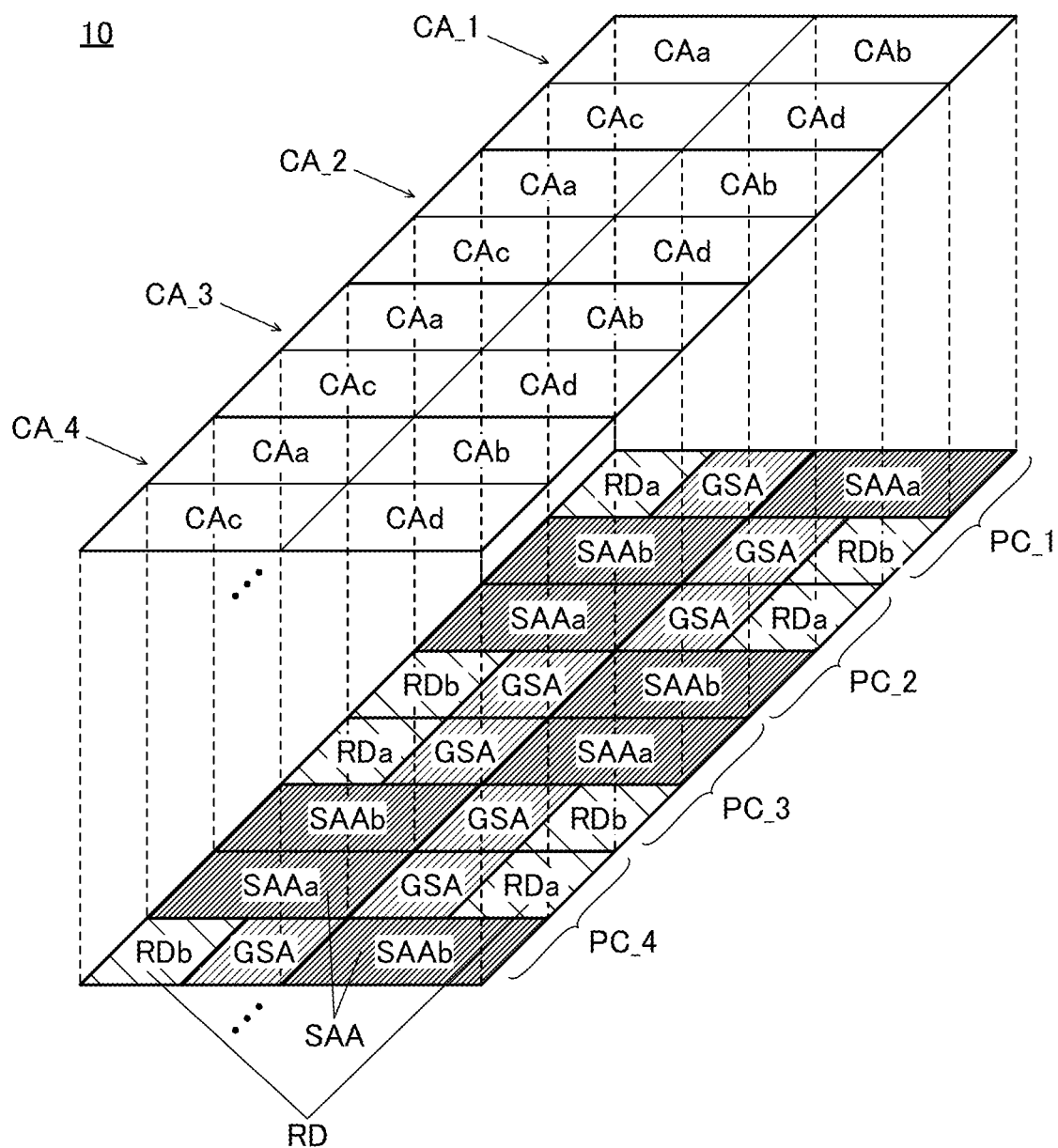
FIG. 4 is a diagram illustrating a configuration example of a semiconductor device.

FIG. 4 illustrates a specific example of the stacked-layer structure illustrated in FIG. 3(B). In FIG. 4, the driver circuits RD, the sense amplifier arrays SAA, and the global sense amplifiers GSA are positioned so as to overlap with the cell arrays CA. Note that peripheral circuits PC correspond to circuits other than the cell arrays CA, specifically, circuits each composed of the driver circuits RD, the sense amplifier arrays SAA, and the global sense amplifiers GSA. FIG. 4 illustrates four cell arrays CA (CA_1 to CA_4), and four peripheral circuits PC (PC_1 to PC_4) arranged in a region overlapping with the cell arrays CA_1 to CA_4, as a typical example.

In the peripheral circuit PC, the driver circuit RD is divided into driver circuits RDa and RDb, and the sense amplifier array SAA is divided into sense amplifier arrays SAAa and SAAb. That is, a circuit composed of the driver circuits RDa and RDb corresponds to the driver circuit RD in FIG. 1. A circuit composed of the sense amplifier arrays SAAa and SAAb corresponds to the sense amplifier array SAA in FIG. 1.

The driver circuits RDa and RDb, the sense amplifier arrays SAAa and SAAb, and the global sense amplifiers GSA are arranged as illustrated in FIG. 4. Specifically, the driver circuit RDa is adjacent to the driver circuit RDb, the sense amplifier array SAAb, and the global sense amplifier GSA. The driver circuit RDb is adjacent to the driver circuit RDa, the sense amplifier array SAAa, and the global sense amplifier GSA. The sense amplifier array SAAa is adjacent to the driver circuit RDb, the sense amplifier array SAAb, and two global sense amplifiers GSA. The sense amplifier array SAAb is adjacent to the driver circuit RDa, the sense amplifier array SAAa, and two global sense amplifiers GSA. The global sense amplifier GSA is adjacent to the driver circuit RDa or the driver circuit RDb, the sense amplifier array SAAa, the sense amplifier array SAAb, and another global sense amplifier GSA.

As illustrated in FIG. 4, the driver circuits RDa and RDb, the sense amplifier arrays SAAa and SAAb, and two global sense amplifiers GSA are arranged so as to each include a region overlapping with the cell array CA. Specifically, when the cell array CA is divided into four sub arrays CAa to CAd, the driver circuit RDa and the global sense amplifier GSA, the driver circuit RDb and the global sense amplifier GSA, the sense amplifier array SAAa, and the sense amplifier array SAAb each include a region overlapping with any of the sub arrays CAa to CAd. For example, when the cell array CA_1 and the peripheral circuit PC_1 are focused on, the sub array CAa includes a region overlapping with the driver circuit RDa and the global sense amplifier GSA, the sub array CAb includes a region overlapping with the sense amplifier array SAAa, the sub array CAc includes a region overlapping with the sense amplifier array SAAb, and the sub array CAd includes a region overlapping with the driver circuit RDb and the global sense amplifier GSA.

When the peripheral circuit PC is provided in the above manner, the driver circuits RD and the global sense amplifiers GSA as well as the sense amplifier arrays SAA can be provided so as to overlap with the cell array CA. Consequently, the circuit area of the semiconductor device 10 can be reduced.

Figure 5:
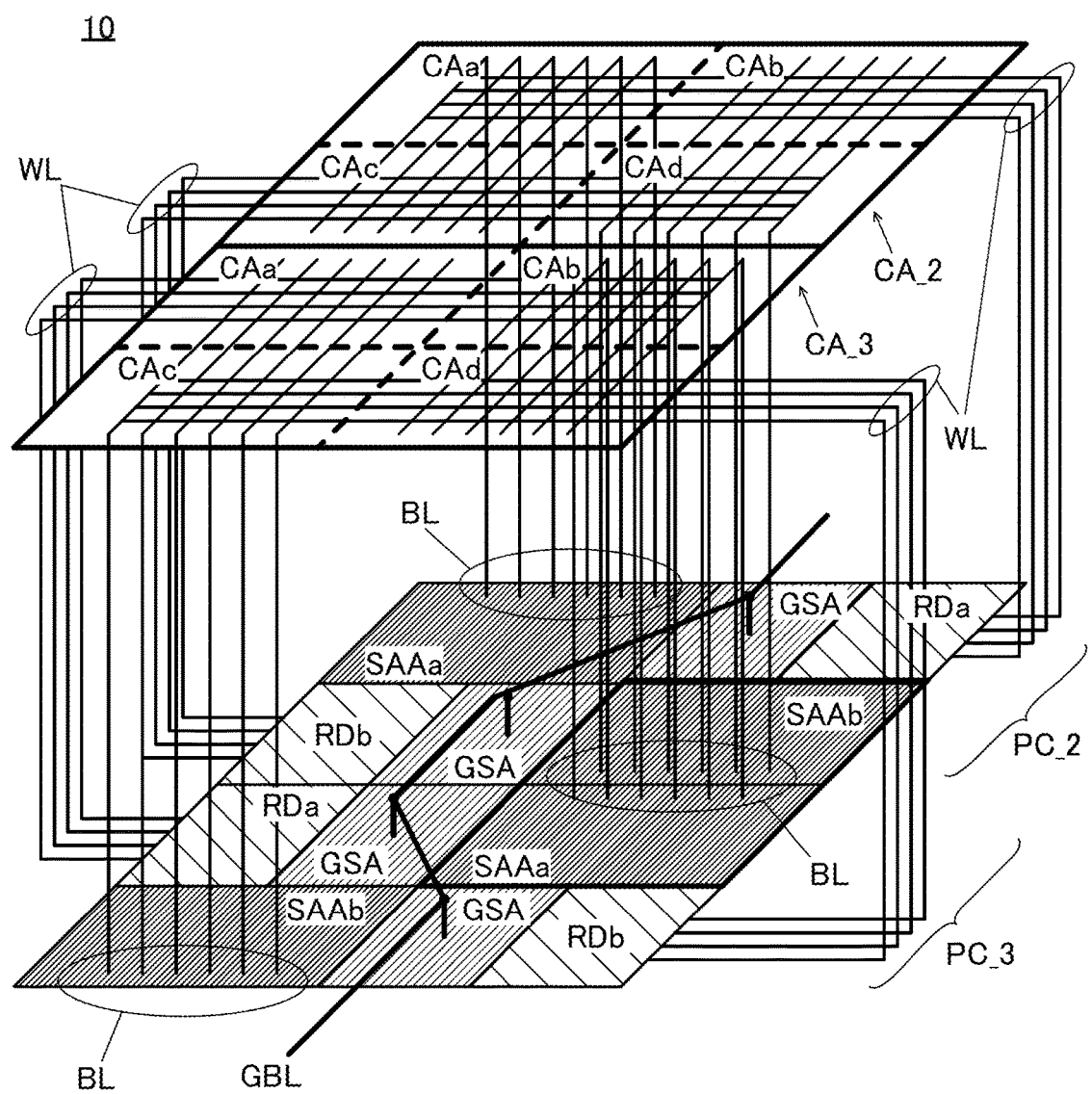
FIG. 5 is a diagram illustrating a configuration example of a semiconductor device.

FIG. 5 illustrates an example of a connection configuration of the cell arrays CA and the peripheral circuits PC. Here, as a typical example, the cell arrays CA_2 and CA_3 and the peripheral circuits PC_2 and PC_3 in FIG. 4 are illustrated. The driver circuits RDa and RDb are connected to the cell arrays CA through the wirings WL. The sense amplifier array SAAa and SAAb are connected to the cell arrays CA through the wirings BL. The global sense amplifiers GSA are connected to the wiring GBL provided in a layer between the peripheral circuits PC and the cell arrays CA. Although not illustrated in FIG. 5, the memory cells MC are provided at intersection portions of the wirings WL and the wirings BL (see FIG. 2).

The driver circuit RDa is connected to the memory cells MC included in the sub arrays CAa and CAb through the wirings WL. The driver circuit RDb is connected to the memory cells MC included in the sub arrays CAc and CAd through the wirings WL. The driver circuit RDa has a function of supplying a selection signal to the sub arrays CAa and CAb, and the driver circuit RDb has a function of supplying a selection signal to the sub arrays CAc and CAd. In this manner, the driver circuit RDa and the driver circuit RDb are used to select the memory cell MC in one cell array CA.

The sense amplifier arrays SAAa and SAAb are connected to two respective cell arrays CA adjacent to each other, through the wirings BL. For example, the sense amplifier arrays SAAa and SAAb (the sense amplifier array SAAb of the peripheral circuit PC_2 and the sense amplifier array SAAa of the peripheral circuit PC_3) are connected to two respective cell arrays CA (CA_2 and CA_3) in FIG. 5. The sense amplifier array SAAa and the sense amplifier array SAAb have a function of amplifying the potential difference between the wiring BL connected to the cell array CA_2 and the wiring BL connected to the cell array CA_3.

Figure 6:
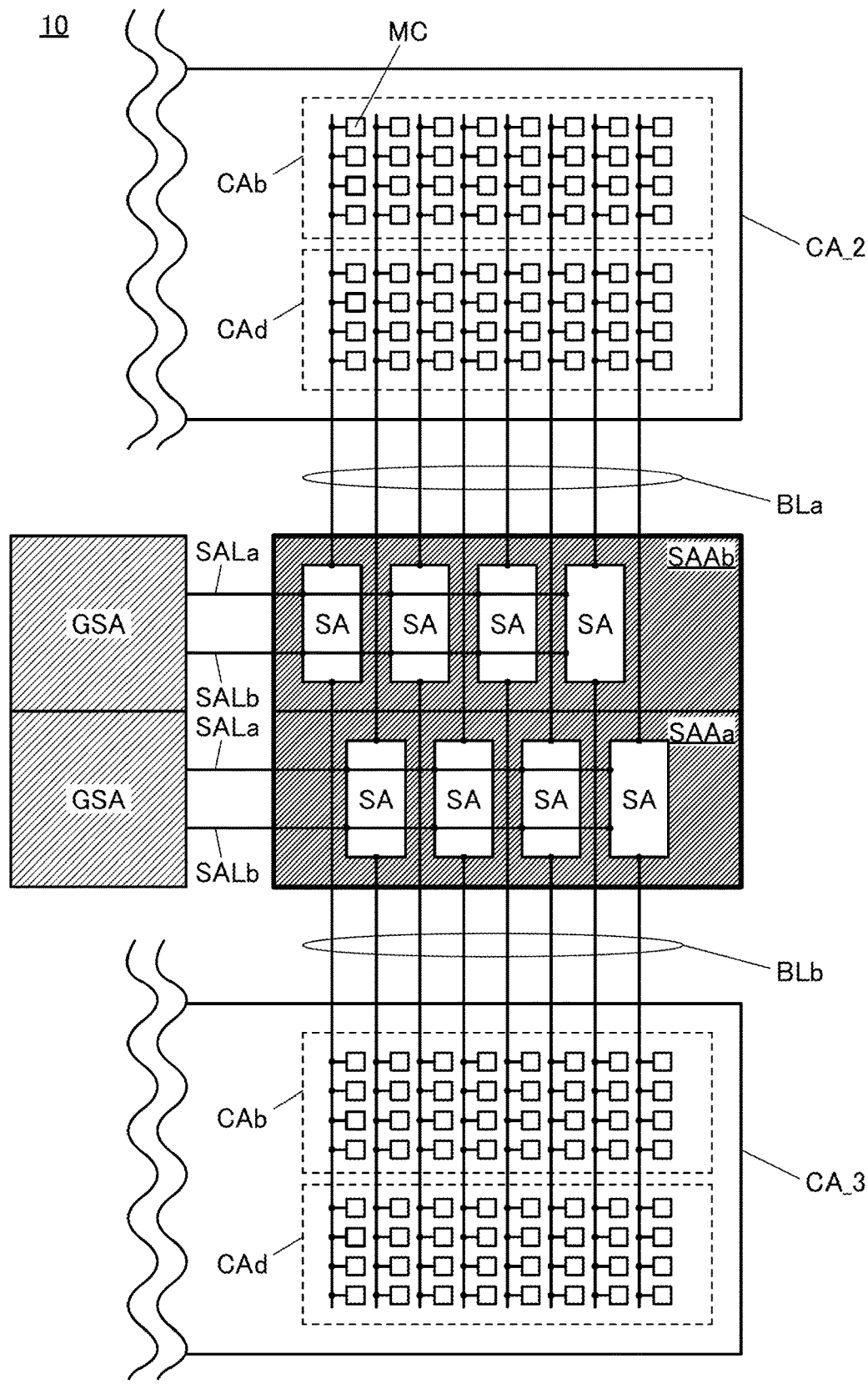
FIG. 6 is a diagram illustrating a configuration example of a semiconductor device.

FIG. 6 illustrates an example of the connection relation between the sense amplifier arrays SAAa and SAAb provided adjacent to each other and the cell arrays CA_2 and CA_3. In FIG. 6, the wirings BL connected to the cell array CA_2 are referred to as the wirings BLa, and the wirings BL connected to the cell array CA_3 are referred to as the wirings BLb.

The sense amplifier arrays SAAa and SAAb each include a plurality of sense amplifiers SA. The sense amplifiers SA are each connected to the global sense amplifier GSA through the wirings SALa and SALb.

The sense amplifiers SA included in the sense amplifier array SAAb are connected to the wirings BLa in odd-numbered columns and the wirings BLb in odd-numbered columns. The sense amplifiers SA included in the sense amplifier array SAAa are connected to the wirings BLa in even-numbered columns and the wirings BLb in even-numbered columns. The sense amplifiers SA each have a function of amplifying the potential difference between the wiring BLa and the wiring BLb and outputting the amplified potential difference to the wiring SALa and the wiring SALb. In this manner, the sense amplifier arrays SAAa and SAAb can amplify data read out from the sub arrays CAb and CAd of the cell array CA_2 and data read out from the sub arrays CAb and CAd of the cell array CA_3.

Note that the connection relation between the sense amplifiers SA and the wirings BL is not limited to the above. That is, any connection relation can be employed as long as the sense amplifier arrays SAAa and SAAb can amplify data read out from the sub arrays CAb and CAd of the cell array CA_2 and data read out from the sub arrays CAb and CAd of the cell array CA_3. For example, the sense amplifier array SAAb may amplify data read out from the sub arrays CAb and CAd of the cell array CA_2, and the sense amplifier array SAAa may amplify data read out from the sub arrays CAb and CAd of the cell array CA_3.

The data amplified by the sense amplifier arrays SAAa and SAAb are selectively input to adjacent global sense amplifiers GSA. Note that in FIG. 4 and FIG. 5, each of the sense amplifier arrays SAAa and SAAb is adjacent to two global sense amplifiers GSA, and the outputs of the sense amplifier arrays SAAa and SAAb are input to either of the global sense amplifiers GSA. The data amplified by the global sense amplifier GSA is output to the wiring GBL.

The wiring GBL is provided so as to overlap with the cell arrays CA and the peripheral circuits PC, whereby the circuit area can be reduced. However, as illustrated in FIG. 5, a large number of wirings (e.g., the wirings WL and the wirings BL) are provided between the cell arrays CA and the peripheral circuits PC. Therefore, the wiring GBL needs to be positioned so as not to contact with these wirings. Here, employing the arrangement of the peripheral circuits PC of one embodiment of the present invention allows formation of a path of the wiring GBL that enables it to cross the plurality of peripheral circuits PC while avoiding being in contact with a wiring group of the wirings WL and a wiring group of the wirings BL.

Figure 7:
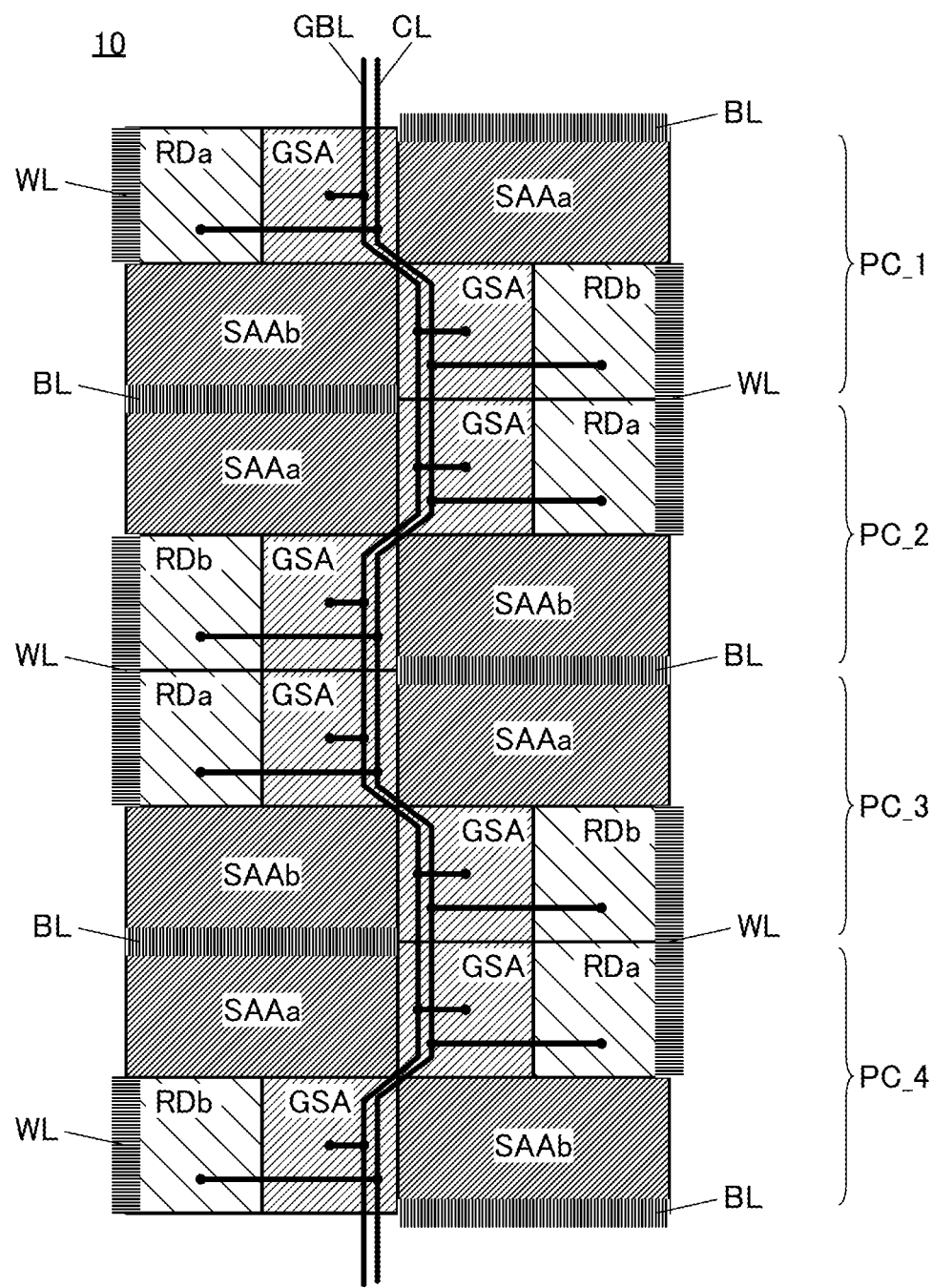
FIG. 7 is a diagram illustrating a configuration example of a semiconductor device.

FIG. 7 shows a top view of the peripheral circuits PC_1 to PC_4. In the case where circuits included in the peripheral circuit PC_1 to PC_4 are arranged in the above-described manner, the wiring GBL connected to the plurality of global sense amplifiers GSA can be formed so as to cross the plurality of peripheral circuits PC while avoiding being in contact with the wirings WL and the wirings BL, as illustrated in FIG. 7.

In addition, a wiring other than the wiring GBL, for example, the wiring CL (see FIG. 1) for connecting the control circuit CTRL and the driver circuits RD can be positioned in the same path as the wiring GBL. FIG. 7 illustrates a configuration in which the wiring CL is also provided so as to cross the peripheral circuits PC. This allows the wiring CL to be positioned in a region overlapping with the peripheral circuits PC and the cell arrays CA, further reducing the circuit area.

Employing the arrangement of the peripheral circuits PC of one embodiment of the present invention in the above manner allows the cell arrays CA to be positioned so as to overlap with the driver circuits RD, the sense amplifier arrays SAA, and the global sense amplifiers GSA. Furthermore, the wiring GBL and the wiring CL can be positioned so as to overlap with the cell arrays CA and the peripheral circuits PC. Consequently, the circuit area of the semiconductor device 10 can be reduced.

<Sense Amplifier>

Next, a configuration example and an operation example of the sense amplifier SA will be described. Here, as an example, the sense amplifier SA connected to the memory cells MC, i.e., the sense amplifier SA used in the sense amplifier array SAA will be described. The sense amplifier SA described below can also be used as the global sense amplifier GSA.

Configuration Example

Figure 8:
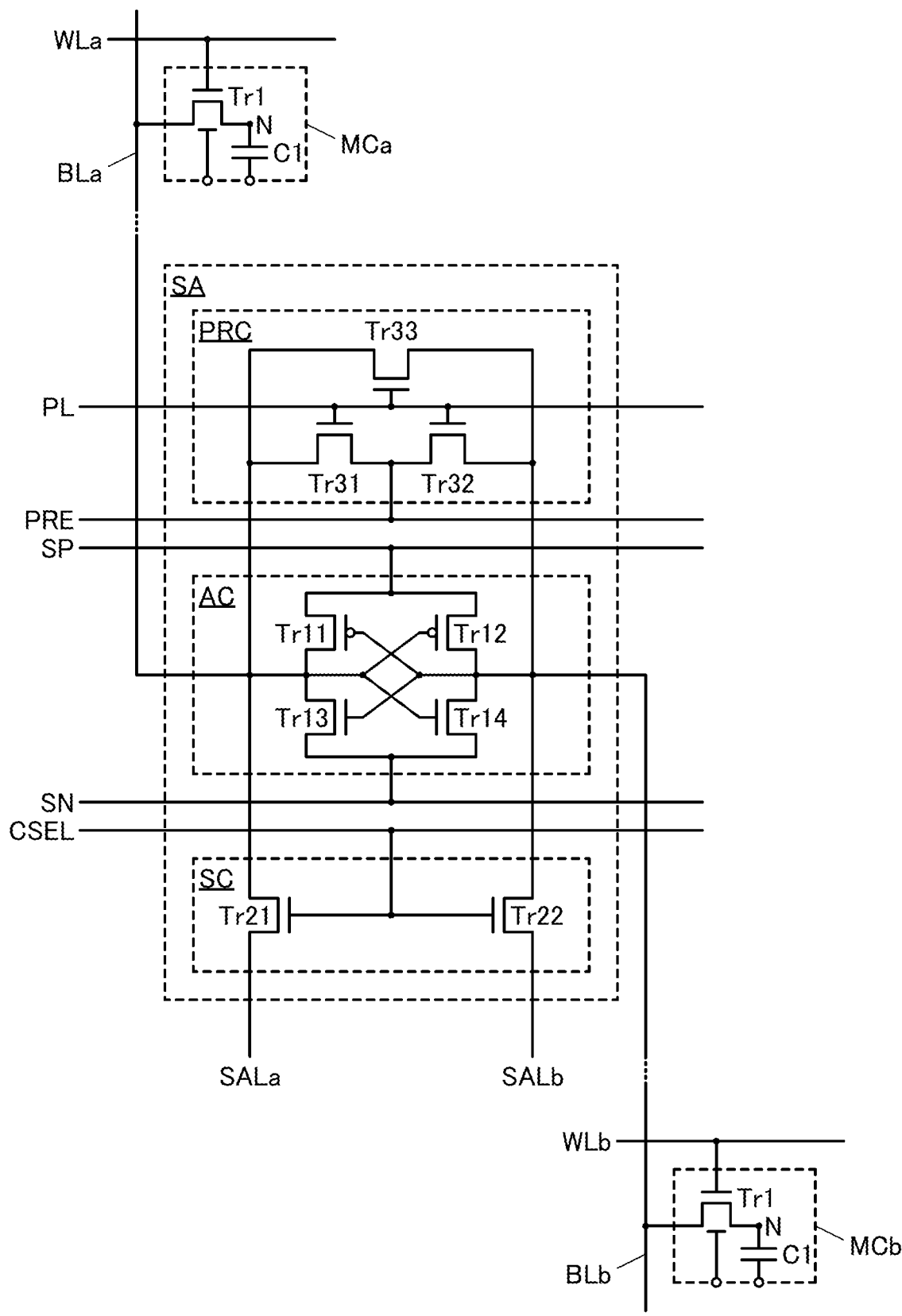
FIG. 8 is a diagram illustrating a configuration example of a sense amplifier.

FIG. 8 illustrates a circuit configuration example of the sense amplifier SA. Here, a memory cell MCa connected to the wiring WLa and the wiring BLa, a memory cell MCb connected to the wiring WLb and the wiring BLb, and the sense amplifier SA connected to the memory cells MCa and MCb are illustrated as an example. For the memory cells MCa and MCb, the configuration illustrated in FIG. 2(B-1)

is used. The sense amplifier SA includes an amplifier circuit AC, a switch circuit SC, and a precharge circuit PRC.

The amplifier circuit AC includes a p-channel transistor Tr11, a p-channel transistor Tr12, an n-channel transistor Tr13, and an n-channel transistor Tr14. One of a source and a drain of the transistor Tr11 is connected to a wiring SP, and the other of the source and the drain thereof is connected to a gate of the transistor Tr12, a gate of the transistor Tr14, and the wiring BLa. One of a source and a drain of the transistor Tr13 is connected to the gate of the transistor Tr12, the gate of the transistor Tr14, and the wiring BLa, and the other of the source and the drain thereof is connected to a wiring SN. One of a source and a drain of the transistor Tr12 is connected to the wiring SP, and the other of the source and the drain thereof is connected to a gate of the transistor Tr11, a gate of the transistor Tr13, and the wiring BLb. One of a source and a drain of the transistor Tr14 is connected to the gate of the transistor Tr11, the gate of the transistor Tr13, and the wiring BLb, and the other of the source and the drain thereof is connected to the wiring SN. The amplifier circuit AC has a function of amplifying the potentials of the wiring BLa and the wiring BLb. The sense amplifier SA including the amplifier circuit AC functions as a latch sense amplifier.

The switch circuit SC includes an n-channel transistor Tr21 and an n-channel transistor Tr22. Note that the transistor Tr21 and the transistor Tr22 may be p-channel transistors. One of a source and a drain of the transistor Tr21 is connected to the wiring BLa, and the other of the source and the drain thereof is connected to the wiring SALa. One of a source and a drain of the transistor Tr22 is connected to the wiring BLb, and the other of the source and the drain thereof is connected to the wiring SALb. A gate of the transistor Tr21 and a gate of the transistor Tr22 are connected to a wiring CSEL.

The switch circuit SC has a function of controlling electrical continuity between the wiring BLa and the wiring SALa and electrical continuity between the wiring BLb and the wiring SALb on the basis of a potential supplied to the wiring CSEL. That is, whether a potential is output to the wiring SALa and the wiring SALb can be selected by the switch circuit SC.

The precharge circuit PRC includes n-channel transistors Tr31 to Tr33. Note that the transistors Tr31 to Tr33 may be p-channel transistors. One of a source and a drain of the transistor Tr31 is connected to the wiring BLa, and the other of the source and the drain thereof is connected to a wiring PRE. One of a source and a drain of the transistor Tr32 is connected to the wiring BLb, and the other of the source and the drain thereof is connected to the wiring PRE. One of a source and a drain of the transistor Tr33 is connected to the wiring BLa, and the other of the source and the drain thereof is connected to the wiring BLb. A gate of the transistor Tr31, a gate of the transistor Tr32, and a gate of the transistor Tr33 are connected to a wiring PL. The precharge circuit PRC has a function of initializing the potentials of the wiring BLa and the wiring BLb.

The wiring SP, the wiring SN, the wiring CSEL, the wiring PRE, and the wiring PL have a function of transmitting a signal for controlling the operation of the sense amplifier SA. These wirings are connected to the driver circuit RD illustrated in FIG. 1, and the sense amplifier SA operates in response to a control signal input from the driver circuit RD.

Operation Example

Next, an operation example of the sense amplifier SA when data is read out from the memory cell MCa will be described with reference to a timing chart shown in FIG. 9.

First, in a period T1, the precharge circuit PRC is operated, and the potentials of the wiring BLa and the wiring BLb are initialized. Specifically, the potential of the wiring PL is set to a high level (VH_PL) to turn on the transistors Tr31 to Tr33. Thus, a potential Vpre of the wiring PRE is supplied to the wiring BLa and the wiring BLb. The potential Vpre can be set to (VH_SP+VL_SN)/2, for example. After that, the potential of the wiring PL is set to a low level (VL_PL) to turn off the transistors Tr31 to Tr33.

Note that the potential of the wiring CSEL is at a low level (VL_CSEL) in the period T1, and the transistors Tr21 and Tr22 in the switch circuit SC are off. In addition, the potential of the wiring WLa is at a low level (VL_WL), and the transistor Tr1 included in the memory cell MCa is off. Similarly, although not illustrated in FIG. 9, the potential of the wiring WLb is at a low level (VL_WL), and the transistor Tr1 included in the memory cell MCb is off. In addition, the potentials of the wiring SP and the wiring SN are the potential Vpre, and the sense amplifier SA is in a halting state.

Next, the wiring WLa is selected in a period T2. Specifically, the potential of the wiring WLa is set to a high level (VH_WL) to turn on the transistor Tr1 included in the memory cell MCa. This establishes electrical continuity between the wiring BLa and the capacitor C1 through the transistor Tr1 in the memory cell MCa, and the potential of the wiring BLa is changed in accordance with the amount of charge that is retained in the capacitor C1.

Figure 9:
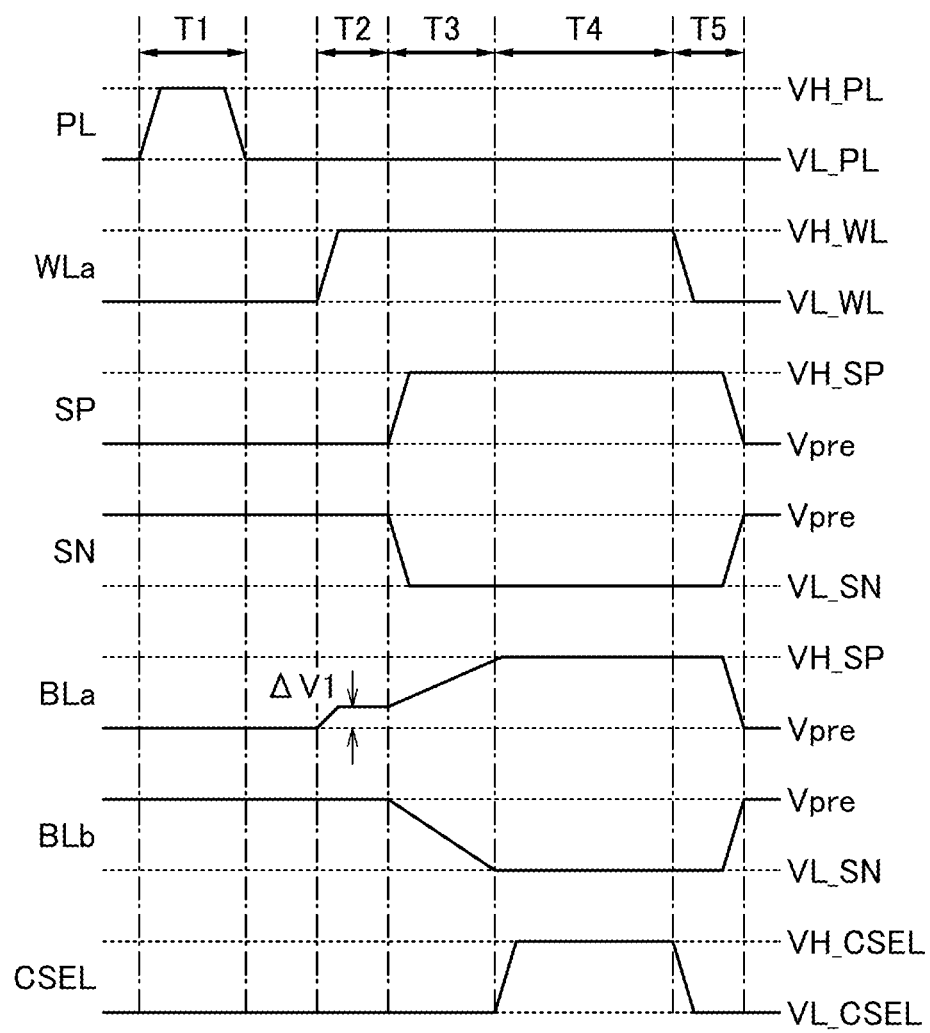
FIG. 9 is a timing chart.

FIG. 9 illustrates the case where data "1" is stored in the memory cell MCa and the amount of charge accumulated in the capacitor C1 is large, as an example. Specifically, in the case where the amount of charge accumulated in the capacitor C1 is large, the release of charge from the capacitor C1 to the wiring BLa increases the potential of the wiring BLa from the potential Vpre by ΔV'. On the other hand, in the case where data "0" is stored in the memory cell MCa and the amount of charge accumulated in the capacitor C1 is small, charge flows from the wiring BLa to the capacitor C1, decreasing the potential of the wiring BLa by ΔV2.

The potential of the wiring CSEL is at a low level (VL_CSEL) in the period T2, and the transistors Tr21 and Tr22 in the switch circuit SC are off. In addition, the potentials of the wiring SP and the wiring SN are the potential Vpre, and the sense amplifier SA remains in a halting state.

Then, in a period T3, the potential of the wiring SP is set to a high level (VH_SP) and the potential of the wiring SN is set to a low level (VL_SN) to bring the amplifier circuit AC into an operating state. The amplifier circuit AC has a function of amplifying the potential difference between the wiring BLa and the wiring BLb (ΔV' in FIG. 9). Bringing the amplifier circuit AC into an operating state makes the potential of the wiring BLa closer to the potential of the wiring SP (VH_SP) from Vpre+ΔV1. In addition, the potential of the wiring BLb gets closer to the potential of the wiring SN (VL_SN) from Vpre.

Note that in the case where the potential of the wiring BLa is Vpre−ΔV2 in the initial stage of the period T3, bringing the amplifier circuit AC into an operating state makes the potential of the wiring BLa closer to the potential of the wiring SN (VL_SN) from Vpre−ΔV2. In addition, the potential of the wiring BLb gets closer to the potential of the wiring SP (VH_SP) from the potential Vpre.

The potential of the wiring PL is at a low level (VL_PL) in the period T3, and the transistors Tr31 to Tr33 in the precharge circuit PRC are off. The potential of the wiring CSEL is at a low level (VL_CSEL), and the transistors Tr21 and Tr22 in the switch circuit SC are off. The potential of the wiring WLa is at a high level (VH_WL), and the transistor Tr1 included in the memory cell MCa is on. Consequently, charge corresponding to the potential of the wiring BLa (VH_SP) is accumulated in the capacitor C1 in the memory cell MCa.

Next, in a period T4, the potential of the wiring CSEL is controlled to turn on the switch circuit SC. Specifically, setting the potential of the wiring CSEL to a high level (VH_CSEL) turns on the transistors Tr21 and Tr22. Accordingly, the potential of the wiring BLa is supplied to the wiring SALa, and the potential of the wiring BLb is supplied to the wiring SALb.

Note that the potential of the wiring PL is at a low level (VL_PL) in the period T4, and the transistors Tr31 to Tr33 in the precharge circuit PRC are off. The potential of the wiring WLa is at a high level (VH_WL), and the transistor Tr1 included in the memory cell MCa is on. The potential of the wiring SP is at a high level (VH_SP), the potential of the wiring SN is at a low level (VL_SN), and the amplifier circuit AC is in an operating state. Consequently, charge corresponding to the potential of the wiring BLa (VH_SP) is accumulated in the capacitor C1 in the memory cell MCa.

Next, in a period T5, the potential of the wiring CSEL is controlled to turn off the switch circuit SC. Specifically, the potential of the wiring CSEL is set to a low level (VL_CSEL) to turn off the transistors Tr21 and Tr22.

In addition, the wiring WLa is unselected in the period T5. Specifically, the potential of the wiring WLa is set to a low level (VL_WL) to turn off the transistor Tr1 included in the memory cell MCa. Thus, charge corresponding to the potential of the wiring BLa (VH_SP) is retained in the capacitor C1 included in the memory cell MCa. Accordingly, data is retained in the memory cell MCa even after the data is read out.

Note that in the period T5, even when the switch circuit SC is turned off, the potential difference between the wiring BLa and the wiring BLb is held by the amplifier circuit AC as long as the sense amplifier SA is in an operating state. Therefore, the sense amplifier SA has a function of temporarily retaining data that has been read out from the memory cell MCa.

Through the operations described above, data is read out from the memory cell MCa. Data in the memory cell MCb can be read out similarly.

Data can be written to the memory cell MCa on the principle similar to that described above. Specifically, first, the transistors Tr31 to Tr33 included in the precharge circuit PRC are temporarily turned on to initialize the potentials of the wiring BLa and the wiring BLb, in a manner similar to that in the case where data is read out.

Then, the wiring WLa that is connected to the memory cell MCa to which data is to be written is selected, and the transistor Tr1 included in the memory cell MCa is turned on. This establishes electrical continuity between the wiring BLa and the capacitor C1 through the transistor Tr1, in the memory cell MCa.

Then, the potential of the wiring SP is set to a high level (VH_SP) and the potential of the wiring SN is set to a low level (VL_SN), to bring the amplifier circuit AC into an operating state.

Then, the potential of the wiring CSEL is controlled to turn on the switch circuit SC. This establishes electrical continuity between the wiring BLa and the wiring SALa and electrical continuity between the wiring BLb and the wiring SALb. Then, a write potential is supplied to the wiring SALa, whereby the write potential is supplied to the wiring BLa through the switch circuit SC. Through these operations, charge is accumulated in the capacitor C1 included in the memory cell MCa according to the potential of the wiring BLa, and data is written to the memory cell MCa.

Note that after the potential of the wiring SALa is supplied to the wiring BLa, the potential difference between the wiring BLa and the wiring BLb is retained by the amplifier circuit AC as long as the sense amplifier SA is in an operating state, even when the transistors Tr21 and Tr22 are turned off in the switch circuit SC. Thus, the timing of switching the transistors Tr21 and Tr22 from an on state to an off state can be either before or after the wiring WLa is selected.

The use of a plurality of sense amplifiers SA described above enables formation of the sense amplifier array SAA or the global sense amplifier GSA.

As described in this embodiment, in one embodiment of the present invention, the driver circuit RD, the sense amplifier array SAA, and the global sense amplifier GSA can be provided so as to overlap with the cell arrays CA, resulting in a reduction in the circuit area of the semiconductor device 10. Employing the arrangement of the peripheral circuits PC of one embodiment of the present invention allows wirings crossing the plurality of peripheral circuits PC, such as the wiring GBL and the wiring CL, to be provided so as to overlap with a layer between the cell arrays CA and the peripheral circuits PC, and the circuit area of the semiconductor device 10 can be further reduced.

This embodiment can be combined with the descriptions of the other embodiments as appropriate.

Embodiment 2

In this embodiment, a configuration example of a computer using the semiconductor device described in the above embodiment will be described.

Figure 10:
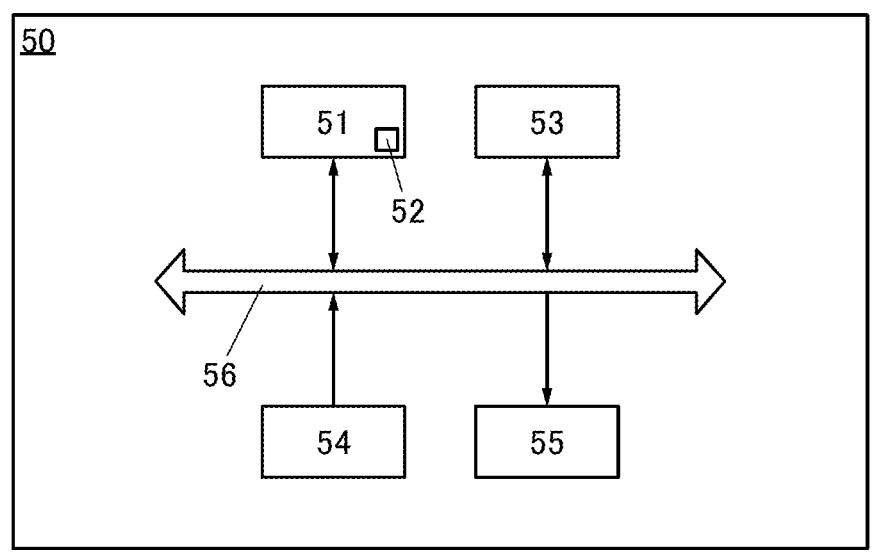
FIG. 10 is a diagram illustrating a configuration example of a computer.

The semiconductor device 10 described above can be used for a computer. FIG. 10 illustrates a configuration example of a computer 50. The computer 50 includes a processing unit 51, a memory unit 53, an input unit 54, and an output unit 55. The processing unit 51, the memory unit 53, the input unit 54, and the output unit 55 are connected to a transmission path 56, and data transmission and reception between them can be performed through the transmission path 56.

The processing unit 51 has a function of performing an arithmetic operation using data supplied from the memory unit 53, the input unit 54, and the like. The results of the arithmetic operation by the processing unit 51 are supplied to the memory unit 53, the output unit 55, or the like. The processing unit 51 can perform a variety of kinds of data processing and program control by executing a program stored in the memory unit 53.

The processing unit 51 can be composed of, for example, a central processing unit (CPU). The processing unit 51 can also be formed using a microprocessor such as a DSP (Digital Signal Processor) or a GPU (Graphics Processing Unit). The microprocessor may be composed of a PLD (Programmable Logic Device) such as an FPGA (Field Programmable Gate Array) or an FPAA (Field Programmable Analog Array).

The processing unit 51 may include the memory unit 52. The memory unit 52 has a function of a cache memory. Data stored in the memory unit 53 is stored in the memory unit 52.

The memory unit 53 has a function of storing data used for an arithmetic operation by the processing unit 51, a program executed by the processing unit 51, or the like. That is, the memory unit 53 has a function of a main memory device of the computer 50.

The input unit 54 has a function of supplying data input from the outside of the computer 50 to the processing unit 51, the memory unit 53, or the like. The output unit 55 has a function of outputting data stored in the memory unit 53, or the like, as a result of processing by the processing unit 51, to the outside of the computer 50.

The semiconductor device 10 described in the above embodiment can be used for the memory unit 52 or the memory unit 53. In other words, the semiconductor device 10 can be used as a cache memory or a main memory device of the computer 50. Accordingly, the computer 50 having low power consumption and the small circuit area can be constructed.

Although the example in which the semiconductor device 10 is incorporated in a computer is described here, an application example of the semiconductor device 10 is not limited thereto. For example, when the semiconductor device 10 is used for an image processing circuit of a display device, a frame memory or the like can be constructed.

This embodiment can be combined with the descriptions of the other embodiments as appropriate.

Embodiment 3

Next, a structure of a transistor and a capacitor included in a memory cell of the semiconductor device of one embodiment of the present invention will be described.

FIG. 11(A) shows a top view of a transistor 400a, a transistor 400b, a capacitor 500a, and a capacitor 500b when two memory cells share one bit line (wiring BL). The transistor 400a and the capacitor 500a are included in a first memory cell, and the transistor 400b and the capacitor 500b are included in a second memory cell.

FIG. 11(B) corresponds to a cross-sectional view along dashed-dotted line A1-A2 in FIG. 11(A), and FIG. 11(C) corresponds to a cross-sectional view along dashed-dotted line A3-A4 in FIG. 11(A). For simplification of the drawing, some components are not illustrated in the top view shown in FIG. 11(A).

As illustrated in FIG. 11, the transistor 400a includes a conductor 405_1 (a conductor 405_1a and a conductor 405_1b) positioned so as to be embedded in an insulator 414 and an insulator 416; an insulator 420 positioned over the conductor 405_1 and the insulator 416; an insulator 422 positioned over the insulator 420; an insulator 424 positioned over the insulator 422; an oxide 430 (an oxide 430a and an oxide 430b) positioned over the insulator 424; an oxide 430_1c positioned over the oxide 430; an insulator 450a positioned over the oxide 430_1c; a conductor 460a positioned over the insulator 450a; an insulator 470a positioned over the conductor 460a; an insulator 471a positioned over the insulator 470a; and an insulator 475a positioned in contact with at least a side surface of the conductor 460a.

As illustrated in FIG. 11, the transistor 400b includes a conductor 405_2 (a conductor 405_2a and a conductor 405_2b) positioned so as to be embedded in the insulator 414 and the insulator 416; the insulator 420 positioned over the conductor 405_2 and the insulator 416; the insulator 422 positioned over the insulator 420; the insulator 424 positioned over the insulator 422; the oxide 430 (the oxide 430a and the oxide 430b) positioned over the oxide 424; an oxide 430_2c positioned over the oxide 430; an insulator 450b positioned over the oxide 430_2c; a conductor 460b positioned over the insulator 450b; an insulator 470b positioned over the conductor 460b; an insulator 471b positioned over the insulator 470b; and an insulator 475b positioned in contact with at least a side surface of the conductor 460b.

Although FIG. 11 illustrates the structure where the transistor 400a and the transistor 400b include the oxide 430a and the oxide 430b that are stacked, the transistor 400a and the transistor 400b may have a structure with a single layer of only the oxide 430b. Alternatively, the transistor 400a and the transistor 400b may have a structure including three or more oxide layers that are stacked.

Although FIG. 11 illustrates the structure where the conductor 460a is a single layer and the conductor 460b is a single layer, for example, the conductor 460a may have a stacked-layer structure of two or more conductors, and the conductor 460b may have a stacked-layer structure of two or more conductors.

Note that the transistor 400b includes components corresponding to those included in the transistor 400a. Thus, in drawings, the corresponding components in the transistor 400a and the transistor 400b are basically denoted by the same three-digit reference numerals. In addition, unless otherwise specified, the description of the transistor 400a can be referred to for the transistor 400b below.

As in the description of the transistors 400a and 400b, the capacitor 500b includes components corresponding to those included in the capacitor 500a. Thus, in drawings, the corresponding components in the capacitor 500a and the capacitor 500b are basically denoted by the same three-digit reference numerals. Thus, unless otherwise specified, the description of the capacitor 500a can be referred to for the capacitor 500b below.

For example, the conductor 405_1, the oxide 430_1c, the insulator 450a, the conductor 460a, the insulator 470a, the insulator 471a, and the insulator 475a of the transistor 400a correspond to the conductor 405_2, the oxide 430_2c, the insulator 450b, the conductor 460b, the insulator 470b, the insulator 471b, and the insulator 475b of the transistor 400b, respectively.

As illustrated in FIG. 11, the oxide 430 is shared by the transistor 400a and the transistor 400b, whereby the distance between the conductor 460a functioning as a first gate electrode of the transistor 400a and the conductor 460b functioning as a first gate electrode of the transistor 400b can be substantially equal to the minimum feature size, resulting in a reduction in the area occupied by the transistors in each memory cell.

A conductor 440 has a function of a plug, a function of one of a source electrode and a drain electrode of the transistor 400a, and also one of a source electrode and a drain electrode of the transistor 400b. With the above structure, in one embodiment of the present invention, the distance between the transistor 400a and the transistor 400b adjacent to each other can be small. Thus, the semiconductor device including the transistor 400a, the transistor 400b, the capacitor 500a, and the capacitor 500b can be highly integrated. A conductor 446 is electrically connected to the conductor 440 and has a function of a wiring.

Furthermore, an insulator 480 is preferably provided so as to cover the transistor 400a and the transistor 400b in FIG. 11. The concentration of impurities such as water or hydrogen in the film of the insulator 480 is preferably lowered.

Openings in the insulator 480 are formed such that part of the insulator 475a of the transistor 400a and part of the insulator 475b of the transistor 400b overlap with part of the openings in the insulator 480. Therefore, when the openings in the insulator 480 are formed, a side surface of the insulator 475a of the transistor 400a and a side surface of the insulator 475b of the transistor 400b are partly exposed in regions to be the openings in the insulator 480. With the above structure, the positions and the shapes of the openings are determined in a self-aligned manner by the shape of the insulator 480, the shape of the insulator 475a, or the shape of the insulator 475b. Consequently, the distance between the opening and the gate electrode can be designed to be small, so that the semiconductor device can be highly integrated.

Furthermore, the conductor 440 is formed in the opening including a region overlapping with the insulator 475a and a region overlapping with the insulator 475b among the openings in the insulator 480. The oxide 430 is positioned on at least part of a bottom portion of the opening, and the conductor 440 is electrically connected to the oxide 430 in the opening.

Note that the conductor 440 may be formed so as to overlap with aluminum oxide after the aluminum oxide is formed so as to overlap with an inner wall of the opening in the insulator 480. The formation of aluminum oxide can inhibit the passage of oxygen from the outside and oxidation of the conductor 440. Furthermore, impurities such as water or hydrogen can be prevented from being diffused from the conductor 440 to the outside. The aluminum oxide can be formed by depositing aluminum oxide by an ALD method or the like such that the aluminum oxide overlaps with the inner wall of the opening in the insulator 480 and then performing anisotropic etching.

In one embodiment of the present invention, the other of the source region and the drain region of the transistor 400a and the capacitor 500a are provided so as to overlap with each other. Similarly, the other of the source region and the drain region of the transistor 400b and the capacitor 500b are provided so as to overlap with each other. It is particularly preferable that the capacitor 500a and the capacitor 500b have a structure where the side surface area is larger than the bottom surface area (hereinafter, such a structure is also referred to as a cylinder capacitor). Thus, the capacitance per projected area of the capacitor 500a and the capacitor 500b can be large.

In one embodiment of the present invention, one electrode of the capacitor 500a is provided in contact with the other of the source region and the drain region of the transistor 400a. Similarly, one electrode of the capacitor 500b is provided in contact with the other of the source region and the drain region of the transistor 400b. With the structure, steps for making a contact between the capacitor 500a and the transistor 400a and steps for making a contact between the capacitor 500b and the transistor 400b can be reduced in number. Accordingly, the number of steps and the manufacturing cost can be reduced.

Note that the insulator 475a and the insulator 475b are formed in a self-aligned manner by anisotropic etching treatment. The transistor 400a is provided with the insulator 475a, whereby parasitic capacitance formed between the conductor 460a and the capacitor 500a or the conductor 440 can be reduced. Similarly, the transistor 400b is provided with the insulator 475b, whereby parasitic capacitance formed between the conductor 460b and the capacitor 500b or the conductor 440 can be reduced. For example, silicon oxide, silicon oxynitride, silicon nitride oxide, and silicon nitride can be used as the insulator 475a and the insulator 475b. When the parasitic capacitance is reduced, high-speed operation of the transistor 400a and the transistor 400b can be achieved.

As the oxide 430, an oxide semiconductor typified by a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used, for example. As the oxide 430, an In—Ga oxide or an In—Zn oxide may be used.

The transistor 400a and the transistor 400b using an oxide semiconductor in their channel formation regions have an extremely low leakage current in an off state; thus, a semiconductor device with low power consumption can be provided. An oxide semiconductor can be deposited by a sputtering method or the like, and thus can be used for the transistor 400a and the transistor 400b included in a highly integrated semiconductor device.

A region of the oxide 430 overlapping with neither the conductor 460a nor the conductor 460b may have lower resistivity than a region overlapping therewith. With the above structure, contact resistance between the region having a low resistivity and the conductor 440 can be reduced, and the on-state current of the transistor 400a and the transistor 400b can be increased. In addition, the contact resistance between the region having a low resistivity and the one electrode of the capacitor 500a or the one electrode of the capacitor 500b can be reduced, so that the on-state current of the transistor 400a and the transistor 400b can be increased.

In the oxide 430, the boundaries between the regions are difficult to clearly determine in some cases. The concentration of a metal element and an impurity element such as hydrogen and nitrogen, which are detected in each region, may be not only gradually changed between the regions, but also continuously changed (also referred to as gradation) in each region. That is, the region closer to the channel formation region preferably has a lower concentration of a metal element and an impurity element such as hydrogen and nitrogen.

The channel lengths of the transistor 400a the transistor 400b are determined by the width of the conductor 460a and the insulator 475a and the width of the conductor 460b and the insulator 475b. When the widths of the conductor 460a and the conductor 460b are each a minimum feature size, the transistor 400a and the transistor 400b can be miniaturized.

Note that a potential that is applied to the conductor 405_1 having a function of a second gate electrode may be equal to a potential that is applied to the conductor 460a having a function of a first gate electrode. When the potential that is applied to the conductor 405_1 is equal to the potential that is applied to the conductor 460a, the conductor 405_1 may be provided such that, in the channel width direction, the length of the conductor 405_1 is larger than that of a region of the oxide 430 overlapping with the conductor 460a. Specifically, the conductor 405_1 preferably extends beyond an end portion of the oxide 430 overlapping with the conductor 460a that intersects with the channel width direction. In other words, the conductor 405_1 and the conductor 460a preferably overlap with each other with an insulator therebetween outside the side surface of the oxide 430 in the channel width direction.

With the above structure, when a potential is applied to the conductor 460a and the conductor 405_1, the region of the oxide 430 overlapping the conductor 460a can be electrically surrounded by an electric field generated from the conductor 460a and an electric field generated from the conductor 405_1. In this specification, a transistor structure in which a channel formation region is electrically surrounded by electric fields of a first gate electrode and a second gate electrode is referred to as a surrounded channel (S-channel) structure.

In the conductor 405_1, the conductor 405_1a is formed in contact with an inner wall of an opening in the insulator 414 and the insulator 416, and the conductor 405_1b is formed more inward than the conductor 405_1a. Here, the top surface of the conductor 405_1a can be substantially level with the top surface of the insulator 416. In addition, the top surface of the conductor 405_2a can be substantially level with the top surface of the insulator 416. Although the structure is illustrated in which the conductor 405_1a and the conductor 405_1b are stacked in the transistor 400a, the present invention is not limited thereto. For example, a structure in which only one of the conductor 405_1a and the conductor 405_1b is provided may be employed.

Here, it is preferable to use a conductive material that has a function of inhibiting the passage of impurities such as water or hydrogen (that is less likely to allow the passage of such impurities) for the conductor 405_1a. For example, tantalum, tantalum nitride, ruthenium, ruthenium oxide, or the like is preferably used, and a single layer or stacked layers are used. Accordingly, diffusion of impurities such as hydrogen and water from a layer below the insulator 414 into an upper layer through the conductor 405_1 and conductor 405_2 can be inhibited. Note that it is preferable that the conductor 405_1a have a function of inhibiting the passage of either of impurities such as a hydrogen atom, a hydrogen molecule, a water molecule, a nitrogen atom, a nitrogen molecule, a nitrogen oxide molecule (e.g., $N_2O$, NO, and $NO_2$), or a copper atom, or oxygen (e.g., at least one of an oxygen atom, an oxygen molecule, and the like). Furthermore, hereinafter, the same applies to the case of describing a conductive material that has a function of inhibiting the passage of impurities or oxygen. When the conductor 405_1a has a function of inhibiting the passage of oxygen, the conductivity of the conductor 405_1b can be prevented from being lowered because of oxidation.

For the conductor 405_1b, a conductive material whose main component is tungsten, copper, or aluminum is preferably used. Although not illustrated, the conductor 405_1b may have a stacked-layer structure and may be, for example, stacked layers of titanium, titanium nitride, and the above-described conductive material.

The insulator 414 and the insulator 422 can function as barrier insulating films that prevent impurities such as water or hydrogen from entering the transistor 400a and the transistor 400b from a lower layer. For the insulator 414 and the insulator 422, an insulating material having a function of inhibiting the passage of impurities such as water or hydrogen is preferably used. For example, it is preferable that silicon nitride or the like be used for the insulator 414 and aluminum oxide, hafnium oxide, an oxide containing silicon and hafnium (hafnium silicate), an oxide containing aluminum and hafnium (hafnium aluminate), or the like be used for the insulator 422. This can inhibit diffusion of impurities such as hydrogen and water to a layer above the insulator 414 and the insulator 422. Note that it is preferable that the insulator 414 and the insulator 422 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, hereinafter, the same applies to the case of describing an insulating material that has a function of inhibiting the passage of impurities.

Furthermore, for the insulator 414 and the insulator 422, an insulating material having a function of inhibiting the passage of oxygen (e.g., oxygen atoms or oxygen molecules) is preferably used. This can inhibit downward diffusion of oxygen contained in the insulator 424 or the like.

Moreover, the concentration of impurities such as water, hydrogen, or nitrogen oxide in the insulator 422 is preferably lowered. The amount of hydrogen released from the insulator 422, which is converted into hydrogen molecules per unit area of the insulator 422, is less than or equal to $2 \times 10^{15}$ molecules/cm$^2$, preferably less than or equal to $1 \times 10^{15}$ molecules/cm$^2$, more preferably less than or equal to $5 \times 10^{14}$ molecules/cm$^2$ in thermal desorption spectroscopy (TDS) within the surface temperature range of the insulator 422 of 50° C. to 500° C., for example. The insulator 422 is preferably formed using an insulator from which oxygen is released by heating.

The insulator 450a can function as a first gate insulating film of the transistor 400a, and the insulator 420, the insulator 422, and the insulator 424 can function as second gate insulating films of the transistor 400a. Although a structure in which the insulator 420, the insulator 422, and the insulator 424 are stacked in the transistor 400a is illustrated, the present invention is not limited thereto. For example, a structure in which any two of the insulator 420, the insulator 422, and the insulator 424 are stacked may be employed, or a structure in which any one of them is used may be employed.

It is preferred to use a metal oxide functioning as an oxide semiconductor (hereinafter, also referred to as an oxide semiconductor) for the oxide 430. A metal oxide whose energy gap is greater than or equal to 2 eV, preferably greater than or equal to 2.5 eV, is preferably used as the metal oxide. With the use of a metal oxide having such a wide energy gap, the off-state current of the transistor can be reduced.

The oxide semiconductor preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, the element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that a plurality of the above-described elements may be used in combination as the element M.

Here, when a metal element such as aluminum, ruthenium, titanium, tantalum, chromium, or tungsten is added to the oxide semiconductor in addition to the constituent element of the oxide semiconductor, the oxide semiconductor becomes a metal compound to have reduced resistance in some cases. Note that aluminum, titanium, tantalum, tungsten, or the like is preferably used. To add the metal element to the oxide semiconductor, for example, a metal film containing the metal element, a nitride film containing the metal element, or an oxide film containing the metal element is preferably provided over the oxide semiconductor. By providing such a film, some oxygen in the interface between the film and the oxide semiconductor or in the oxide semiconductor positioned in the vicinity of the interface is absorbed by the film or the like and an oxygen vacancy is formed, so that the resistance of the oxide semiconductor in the vicinity of the interface is reduced in some cases.

The periphery of an oxygen vacancy formed in the vicinity of the interface has a distortion. When the above film is formed by a sputtering method with a sputtering gas containing a rare gas, the rare gas might enter the oxide semiconductor during the formation of the film. When the rare gas enters the oxide semiconductor, a distortion or a structural disorder is caused in the vicinity of the interface and around the rare gas. The rare gas is, for example, He or Ar. Owing to its larger atomic radius, Ar is preferable to He. When Ar enters the oxide semiconductor, a distortion or a structural disorder is appropriately caused. In a region where such a distortion or a structural disorder is caused, the number of metal atoms bonded to a small number of oxygen probably increases. When the number of metal atoms bonded to a small number of oxygen increases, the resistance in the vicinity of the interface and around the rare gas is reduced in some cases.

In the case where a crystalline oxide semiconductor is used as the oxide semiconductor, a region where the distortion or the structural disorder is caused has a broken crystallinity and seems like an amorphous oxide semiconductor in some cases.

After the metal film, the nitride film containing the metal element, or the oxide film containing the metal element is provided over the oxide semiconductor, heat treatment is preferably performed in an atmosphere containing nitrogen. By the heat treatment in the atmosphere containing nitrogen, the metal element is diffused from the metal film into the oxide semiconductor; thus, the metal element can be added to the oxide semiconductor.

In the case where hydrogen in the oxide semiconductor diffuses to a low-resistance region of the oxide semiconductor and enters an oxygen vacancy in the low-resistance region, the hydrogen is brought into a relatively stable state. It is known that hydrogen in the oxygen vacancy in the oxide semiconductor is released from the oxygen vacancy by heat treatment at 250° C. or higher, is diffused into a low-resistance region of the oxide semiconductor, enters an oxygen vacancy in the low-resistance region, and is brought into a relatively stable state. Thus, by the heat treatment, the resistance of the low-resistance region of the oxide semiconductor tends to be further reduced, and the oxide semiconductor whose resistance is not reduced tends to be highly purified (a reduction in the amount of impurities such as water or hydrogen) and tends to be increased in resistance.

The carrier density of the oxide semiconductor is increased when an impurity element such as hydrogen or nitrogen exists. Hydrogen in the oxide semiconductor reacts with oxygen, which is bonded to a metal atom, to be water, and thus forms an oxygen vacancy in some cases. Entry of hydrogen into the oxygen vacancy increases carrier density. Furthermore, in some cases, bonding of part of hydrogen to oxygen bonded to a metal atom causes generation of an electron serving as a carrier. That is, the resistance of an oxide semiconductor containing nitrogen or hydrogen is reduced.

Thus, selective addition of a metal element and an impurity element such as hydrogen and nitrogen to the oxide semiconductor allows a high-resistance region and a low-resistance region to be formed in the oxide semiconductor. In other words, when the resistance of the oxide 430 is selectively reduced, a region functioning as a semiconductor having a low carrier density and a low-resistance region functioning as a source region or a drain region can be provided in the oxide 430 processed into an island shape.

The atomic ratio of the element M to constituent elements in a metal oxide used as the oxide 430a is preferably greater than the atomic ratio of the element M to constituent elements in a metal oxide used as the oxide 430b. Moreover, the atomic ratio of the element M to In in the metal oxide used as the oxide 430a is preferably greater than the atomic ratio of the element M to In in the metal oxide used as the oxide 430b. Furthermore, the atomic ratio of In to the element M in the metal oxide used as the oxide 430b is preferably greater than the atomic ratio of In to the element M in the metal oxide used as the oxide 430a.

When using the above metal oxide as the oxide 430a, it is preferable that the energy of the conduction band minimum of the oxide 430a be higher than the energy of the conduction band minimum of the region of the oxide 430b where the energy of conduction band minimum is low. In other words, the electron affinity of the oxide 430a is preferably smaller than the electron affinity of the region of the oxide 430b where the energy of the conduction band minimum is low.

Here, the energy level of the conduction band minimum gently changes in the oxide 430a and the oxide 430b. In other words, a continuous change or continuous connection occurs. This can be obtained by decreasing the density of defect states in a mixed layer formed at the interface between the oxide 430a and the oxide 430b.

Specifically, when the oxide 430a and the oxide 430b contain a common element (as a main component) in addition to oxygen, a mixed layer with a low density of defect states can be formed. For example, in the case where the oxide 430b is an In—Ga—Zn oxide, an In—Ga—Zn oxide, a Ga—Zn oxide, gallium oxide, or the like is used as the oxide 430a.

At this time, a narrow-gap portion formed in the oxide 430b functions as a main carrier path. Since the density of defect states at the interface between the oxide 430a and the oxide 430b can be decreased, the influence of interface scattering on carrier conduction can be small and a high on-state current can be obtained.

Furthermore, as shown in FIG. 11(B), a side surface of a structure body composed of the conductor 460a, the insulator 470a, and the insulator 471a is preferably substantially perpendicular to the insulator 422. However, the semiconductor device described in this embodiment is not limited thereto. For example, a structure may be employed in which an angle formed between the side surface and the top surface of the structure body composed of the conductor 460a, the insulator 470a, and the insulator 471a is an acute angle. In that case, the angle formed by the side surface of the structure body and the top surface of the insulator 422 is preferably larger.

The insulator 475a is provided in contact with at least the side surfaces of the conductor 460a and the insulator 470a. The insulator 475a is formed by depositing the insulator to be the insulator 475a and then performing anisotropic etching. By the etching, the insulator 475a is formed in contact with the side surfaces of the conductor 460a and the insulator 470a.

The capacitor 500a includes a conductor 510a, an insulator 530, and a conductor 520a over the insulator 530. The capacitor 500b includes a conductor 510b, the insulator 530, and a conductor 520b over the insulator 530. An insulator 484 is formed over the conductor 520a and the conductor 520b, and the conductor 440 is formed in the opening in the insulator 480, the insulator 530, and the insulator 484.

The capacitor 500a has a structure in which the conductor 510a functioning as a lower electrode and the conductor 520a functioning as an upper electrode face each other with the insulator 530 functioning as a dielectric interposed therebetween, along the bottom surface and the side surface of the opening in the insulator 480. The above structure allows the electrostatic capacitance per unit area of the capacitor 500a to be high, which enables further miniaturization and higher integration of a semiconductor device. The electrostatic capacitance value of the capacitor 500a can be set as appropriate with the thickness of the insulator 480. Therefore, a semiconductor device with high design flexibility can be provided.

In particular, with the deeper opening in the insulator 480, the capacitor 500a can have increased electrostatic capacitance without an increase in its projected area. Thus, the capacitor 500a preferably has a cylinder shape (the side surface area is larger than the bottom surface area).

An insulator having a high permittivity is preferably used as the insulator 530. For example, an insulator containing an oxide of one or both of aluminum and hafnium can be used. Aluminum oxide, hafnium oxide, an oxide containing aluminum and hafnium (hafnium aluminate), or the like is preferably used as the insulator containing an oxide of one or both of aluminum and hafnium.

The insulator 530 may have a stacked-layer structure; for example, two or more layers selected from silicon oxide, silicon oxynitride, silicon nitride oxide, silicon nitride, aluminum oxide, hafnium oxide, an oxide containing aluminum and hafnium (hafnium aluminate), and the like may be used for the stacked-layer structure. For example, it is preferable that hafnium oxide, aluminum oxide, and hafnium oxide be deposited in this order by an ALD method to form a stacked-layer structure. Hafnium oxide and aluminum oxide each have a thickness of greater than or equal to 0.5 nm and less than or equal to 5 nm. With such a stacked-layer structure, the capacitor 500a can have a large capacitance value and a low leakage current.

Note that the conductor 510a or the conductor 520a may have a stacked-layer structure. For example, the conductor 510a or the conductor 520a may have a stacked-layer structure of a conductive material containing titanium, titanium nitride, tantalum, or tantalum nitride as its main component and a conductive material containing tungsten, copper, or aluminum as its main component. The conductor 510a or the conductor 520a may have either a single-layer structure or a stacked-layer structure of three or more layers.

<Substrate>

As a substrate where the transistors are formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. In addition, a semiconductor substrate in which an insulator region is included in the above semiconductor substrate, e.g., an SOI (Silicon On Insulator) substrate and the like are given. Examples of the conductor substrate include a graphite substrate, a metal substrate, an alloy substrate, and a conductive resin substrate. Alternatively, a substrate including a metal nitride, a substrate including a metal oxide, and the like are given. Furthermore, a substrate in which an insulator substrate is provided with a conductor or a semiconductor, a substrate in which a semiconductor substrate is provided with a conductor or an insulator, a substrate in which a conductor substrate is provided with a semiconductor or an insulator, and the like are given. These substrates provided with elements may be used. Examples of the elements provided for the substrates include a capacitor, a resistor, a switching element, a light-emitting device, and a memory element.

A flexible substrate may be used as the substrate. Note that as a method of providing a transistor over a flexible substrate, there is a method in which the transistor is fabricated over a non-flexible substrate and then the transistor is separated and transferred to a flexible substrate. In that case, a separation layer is preferably provided between the non-flexible substrate and the transistor. Note that as the substrate, a film, a foil, or a sheet containing a fiber may be used. The substrate may have elasticity. The substrate may have a property of returning to its original shape when bending or pulling is stopped, or may have a property of not returning to its original shape. The substrate includes, for example, a region with a thickness greater than or equal to 5 μm and less than or equal to 700 μm, preferably greater than or equal to 10 μm and less than or equal to 500 μm, and more preferably greater than or equal to 15 μm and less than or equal to 300 μm. When the substrate is thin, the weight of the semiconductor device including the transistor can be reduced. Moreover, when the substrate is thin, the substrate may have elasticity or a property of returning to its original shape when bending or pulling is stopped, even in the case of using glass or the like. Thus, an impact applied to the semiconductor device over the substrate due to dropping or the like can be reduced. That is, a durable semiconductor device can be provided.

For the flexible substrate, metal, an alloy, a resin, glass, or fiber thereof can be used, for example. The flexible substrate preferably has a lower coefficient of linear expansion because deformation due to an environment is inhibited. For the flexible substrate, a material whose coefficient of linear expansion is lower than or equal to $1\times10^{-3}$/K, lower than or equal to $5\times10^{-5}$/K, or lower than or equal to $1\times10^{-5}$/K can be used, for example. Examples of the resin include polyester, polyolefin, polyamide (e.g., nylon or aramid), polyimide, polycarbonate, and acrylic. In particular, aramid is preferable for the flexible substrate because of its low coefficient of linear expansion.

<Insulator>

Examples of an insulator include an oxide, a nitride, an oxynitride, a nitride oxide, a metal oxide, a metal oxynitride, and a metal nitride oxide, each of which has an insulating property.

When a transistor is surrounded by an insulator having a function of inhibiting the passage of oxygen and impurities such as hydrogen, the transistor can have stable electrical characteristics. For example, an insulator having a function of inhibiting the passage of oxygen and impurities such as hydrogen can be used as the insulator 414, the insulator 422, the insulator 470a, and the insulator 470b.

As the insulator having a function of inhibiting the passage of oxygen and impurities such as hydrogen, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used.

For the insulator 414, the insulator 422, the insulator 470a, and the insulator 470b, for example, a metal oxide such as aluminum oxide, magnesium oxide, gallium oxide, germanium oxide, yttrium oxide, zirconium oxide, lanthanum oxide, neodymium oxide, hafnium oxide, an oxide containing silicon and hafnium, an oxide containing aluminum and hafnium, or tantalum oxide; silicon nitride oxide; or silicon nitride may be used. Note that the insulator 414, the insulator 422, the insulator 470a, and the insulator 470b preferably contain aluminum oxide, hafnium oxide, and the like.

As the insulator 471a, the insulator 471b, the insulator 475a, and the insulator 475b, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used. For example, the insulator 471a, the insulator 471b, the insulator 475a, and the insulator 475b preferably contain silicon oxide, silicon oxynitride, or silicon nitride.

The insulator 422, the insulator 424, the insulator 450a, the insulator 450b, and the insulator 530 preferably include an insulator with a high dielectric constant. For example, the insulator 422, the insulator 424, the insulator 450a, the insulator 450b, and the insulator 530 preferably contain gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like.

Alternatively, the insulator 422, the insulator 424, the insulator 450a, the insulator 450b, and the insulator 530 preferably have a stacked-layer structure of silicon oxide or silicon oxynitride and an insulator with a high dielectric constant. When silicon oxide and silicon oxynitride, which are thermally stable, are combined with an insulator with a high dielectric constant, the stacked-layer structure can have thermal stability and a high dielectric constant. For example, when a structure is employed in which aluminum oxide, gallium oxide, or hafnium oxide in the insulator 450a and the insulator 450b is in contact with the oxide 430, silicon contained in silicon oxide or silicon oxynitride can be inhibited from entering the oxide 430. Furthermore, for example, when a structure is employed in which silicon oxide or silicon oxynitride in the insulator 450a and the insulator 450b is in contact with the oxide 430, trap centers are formed at the interface between aluminum oxide, gallium oxide, or hafnium oxide and silicon oxide or silicon oxynitride, in some cases. The trap centers can shift the threshold voltage of the transistor in the positive direction by trapping electrons in some cases.

The insulator 416, the insulator 480, the insulator 484, the insulator 475a, and the insulator 475b preferably include an insulator with a low dielectric constant. For example, the insulator 416, the insulator 480, the insulator 484, the insulator 475a, and the insulator 475b preferably contain silicon oxide, silicon oxynitride, silicon nitride oxide, silicon nitride, silicon oxide to which fluorine is added, silicon oxide to which carbon is added, silicon oxide to which carbon and nitrogen are added, silicon oxide having pores, a resin, or the like. Alternatively, the insulator 416, the insulator 480, the insulator 484, the insulator 475a, and the insulator 475b preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or silicon oxide having pores. When silicon oxide and silicon oxynitride, which are thermally stable, are combined with a resin, the stacked-layer structure can have thermal stability and a low dielectric constant. Examples of the resin include polyester, polyolefin, polyamide (e.g., nylon or aramid), polyimide, polycarbonate, and acrylic.

<Conductor>

For the conductor 405_1, the conductor 4052, the conductor 460a, the conductor 460b, the conductor 440, the conductor 510a, the conductor 510b, the conductor 520a, and the conductor 520b, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor with high electrical conductivity, typified by polycrystalline silicon containing an impurity element such as phosphorus, or silicide such as nickel silicide may be used.

In particular, a conductive material containing oxygen and a metal element contained in a metal oxide that can be used for the oxide 430 may be used for the conductor 460a and the conductor 460b. A conductive material containing the above metal element and nitrogen may be used. For example, a conductive material containing nitrogen, such as titanium nitride or tantalum nitride, may be used. An indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon is added may be used. An indium gallium zinc oxide containing nitrogen may be used. With the use of such a material, hydrogen contained in the oxide 430 can be captured in some cases. Alternatively, hydrogen entering from an external insulator or the like can be captured in some cases.

Furthermore, a stack of a plurality of conductive layers formed with the above materials may be used. For example, a stacked-layer structure combining a material containing the above-described metal element and a conductive material containing oxygen may be employed. A stacked-layer structure combining a material containing the above-described metal element and a conductive material containing nitrogen may be employed. A stacked-layer structure combining a material containing the above-described metal element, a conductive material containing oxygen, and a conductive material containing nitrogen may be employed.

Note that in the case where an oxide is used for the channel formation region of the transistor, a stacked-layer structure combining a material containing the above-described metal element and a conductive material containing oxygen is preferably used for the gate electrode. In that case, the conductive material containing oxygen is preferably provided on the channel formation region side. When the conductive material containing oxygen is provided on the channel formation region side, oxygen left from the conductive material is easily supplied to the channel formation region.

[Composition of Metal Oxide]

The composition of a CAC (Cloud-Aligned Composite)-OS that can be used for the transistor disclosed in one embodiment of the present invention will be described below.

Note that in this specification and the like, CAAC (C-Axis Aligned Crystal) or CAC (Cloud-Aligned Composite) might be stated. Note that CAAC refers to an example of a crystal structure, and CAC refers to an example of a function or a material composition.

A CAC-OS or a CAC-metal oxide has a conducting function in a part of the material and an insulating function in another part of the material and has a function of a semiconductor as a whole. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide is composed of components having different bandgaps. For example, the CAC-OS or the CAC-metal oxide is composed of a component having a wide gap due to the insulating regions and a component having a narrow gap due to the conductive regions. In the case of the structure, when carriers flow, carriers mainly flow in the component having a narrow gap. Furthermore, the component having a narrow gap complements the component having a wide gap, and carriers flow also in the component having a wide gap in conjunction with the component having a narrow gap. Therefore, in the case where the above-described CAC-OS or CAC-metal oxide is used in the channel formation region of the transistor, high current driving capability in an on state of the transistor, that is, a high on-state current, and high field-effect mobility can be obtained.

In other words, the CAC-OS or the CAC-metal oxide can also be referred to as a matrix composite or a metal matrix composite.

[Structure of Metal Oxide]

Oxide semiconductors can be classified into single crystal oxide semiconductors and the others, non-single-crystal oxide semiconductors. Examples of the non-single-crystal oxide semiconductors include a CAAC-OS (C-Axis Aligned Crystalline Oxide Semiconductor), a polycrystalline oxide semiconductor, an nc-OS (nanocrystalline Oxide Semiconductor), an amorphous-like oxide semiconductor (a-like OS), and an amorphous oxide semiconductor.

The CAAC-OS has c-axis alignment and a crystal structure with distortion in which a plurality of nanocrystals are connected in the a-b plane direction. Note that the distortion refers to a portion where the direction of a lattice arrangement changes between a region with a regular lattice arrangement and another region with a regular lattice arrangement in a region where the plurality of nanocrystals are connected.

A nanocrystal is basically a hexagon but is not always a regular hexagon and is a non-regular hexagon in some cases.

Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, it is found that formation of a crystal grain boundary is inhibited by the lattice arrangement distortion. This is probably because the CAAC-OS can tolerate distortion owing to non-dense arrangement of oxygen atoms in the a-b plane direction, an interatomic bond length changed by metal element substitution, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other; when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. On the other hand, a clear crystal grain boundary cannot be observed in the CAAC-OS; thus, it can be said that a reduction in electron mobility due to the crystal grain boundary is less likely to occur. Furthermore, entry of impurities, formation of defects, or the like might decrease the crystallinity of an oxide semiconductor, which means that the CAAC-OS is an oxide semiconductor having small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the above oxide semiconductor is used for a transistor will be described.

Note that when the above oxide semiconductor is used for a transistor, a transistor with high field-effect mobility can be achieved. In addition, a transistor with high reliability can be achieved.

An oxide semiconductor with a low carrier density is preferably used for a transistor. In the case where the carrier density of an oxide semiconductor film is lowered, the impurity concentration in the oxide semiconductor film is lowered to lower the density of defect states. In this specification and the like, a state with a low impurity concentration and a low density of defect states is referred to as a highly purified intrinsic or substantially highly purified intrinsic state. For example, the carrier density of the oxide semiconductor is lower than $8\times10^{11}/cm^3$, preferably lower than $1\times10^{11}/cm^3$, more preferably lower than $1\times10^{10}/cm^3$, and greater than or equal to $1\times10^{-9}/cm^3$.

In addition, a highly purified intrinsic or substantially highly purified intrinsic oxide semiconductor film has a low density of defect states and accordingly has a low density of trap states in some cases.

Furthermore, charges trapped by the trap states in the oxide semiconductor take a long time to disappear and may behave like fixed charges. Thus, a transistor whose channel formation region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferred that the impurity concentration in an adjacent film be also reduced. Examples of impurities include hydrogen, nitrogen, an alkali metal, an alkaline earth metal, iron, nickel, and silicon.

[Impurity]

Here, the influence of each impurity in the oxide semiconductor will be described.

When silicon or carbon, which is one of the Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm³, preferably lower than or equal to $2\times10^{17}$ atoms/cm³.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferred to reduce the concentration of an alkali metal or an alkaline earth metal in the oxide semiconductor. Specifically, the concentration of an alkali metal or an alkaline earth metal in the oxide semiconductor obtained by SIMS is set lower than or equal to $1\times10^{18}$ atoms/cm³, preferably lower than or equal to $2\times10^{16}$ atoms/cm³.

Furthermore, when containing nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible; the nitrogen concentration in the oxide semiconductor obtained by SIMS is set, for example, lower than $5\times10^{19}$ atoms/cm³, preferably lower than or equal to $5\times10^{18}$ atoms/cm³, more preferably lower than or equal to $1\times10^{18}$ atoms/cm³, and still more preferably lower than or equal to $5\times10^{17}$ atoms/cm³.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm³, preferably lower than $1\times10^{19}$ atoms/cm³, more preferably lower than $5\times10^{18}$ atoms/cm³, and still more preferably lower than $1\times10^{18}$ atoms/cm³.

When an oxide semiconductor with sufficiently reduced impurities is used for a channel formation region of a transistor, stable electrical characteristics can be given.

This embodiment can be implemented in combination with the other embodiments as appropriate.

Embodiment 4

Figure 13:
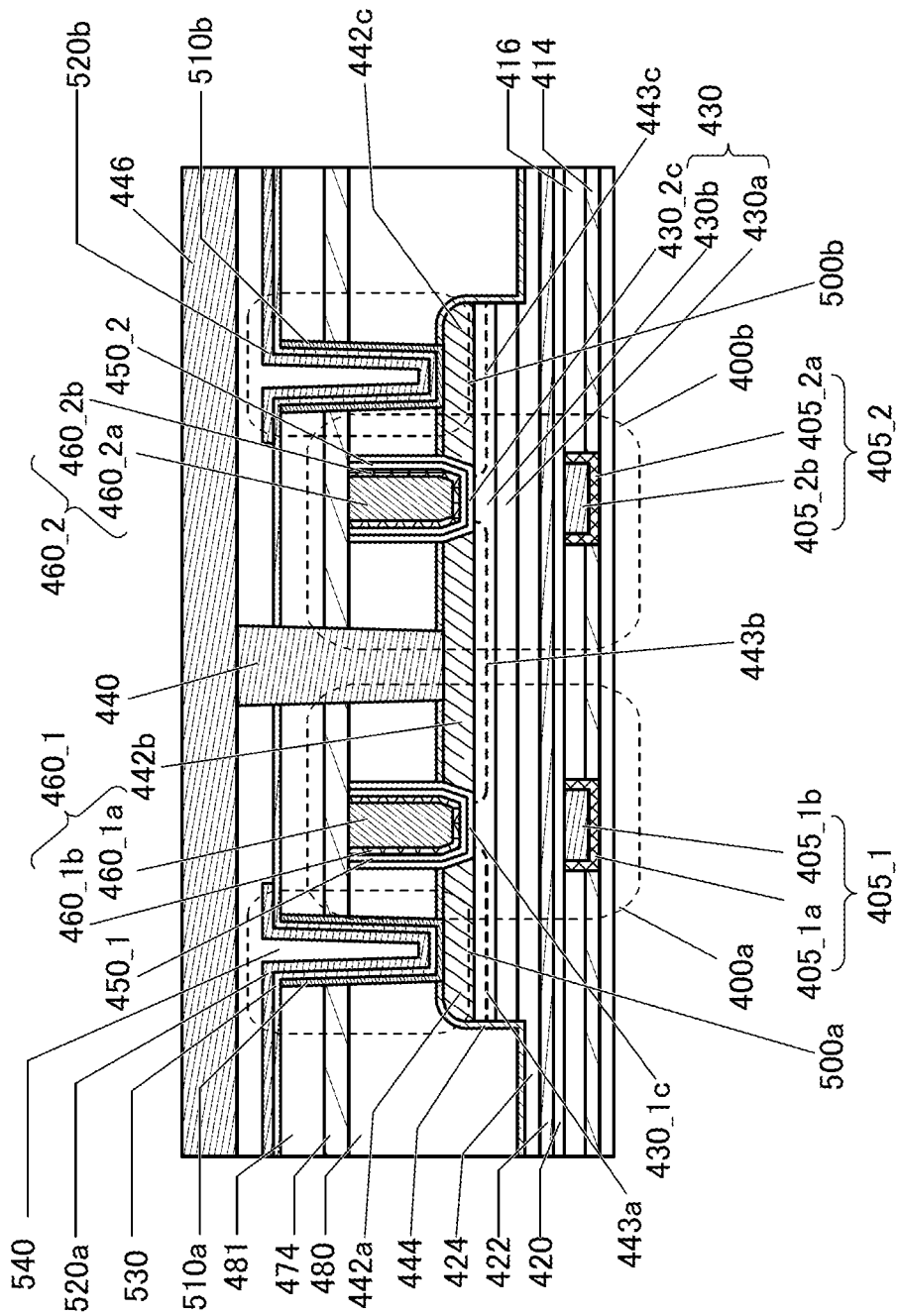
FIG. 13 is a diagram illustrating a structure example of a semiconductor device.

FIG. 13 illustrates another structure example of the transistor 400a, the transistor 400b, the capacitor 500a, and the capacitor 500b when two memory cells share one bit line. In the cross-sectional view shown in FIG. 13, the transistor 400a and the capacitor 500a are included in a first memory cell, and the transistor 400b and the capacitor 500b are included in a second memory cell.

As illustrated in FIG. 13, the transistor 400a includes the conductor 405_1 (the conductor 405_1a and the conductor 405_1b) positioned over an insulating surface so as to be embedded in the insulator 414 and the insulator 416; the insulator 420 positioned over the conductor 405_1 and the insulator 416; the insulator 422 positioned over the insulator 420; the insulator 424 positioned over the insulator 422; the oxide 430 (the oxide 430a and the oxide 430b) positioned over the insulator 424; a conductor 442a and a conductor 442b positioned over the oxide 430; the oxide 430_1c positioned between the conductor 442a and the conductor 442b and over the oxide 430; an insulator 450_1 positioned over the oxide 430_1c; and a conductor 460_1 (a conductor 460_1a and a conductor 460_1b) positioned over the insulator 450_1.

As illustrated in FIG. 13, the transistor 400b includes the conductor 405_2 (the conductor 405_2a and the conductor 405_2b) positioned over an insulating surface so as to be embedded in the insulator 414 and the insulator 416; the insulator 420 positioned over the conductor 405_2 and the insulator 416; the insulator 422 positioned over the insulator 420; the insulator 424 positioned over the insulator 422; the oxide 430 (the oxide 430a and the oxide 430b) positioned over the insulator 424; a conductor 442c and the conductor 442b positioned over the oxide 430; the oxide 430_2c positioned between the conductor 442c and the conductor 442b and over the oxide 430; an insulator 450_2 positioned over the oxide 430_2c; and a conductor 460_2 (a conductor 460_2a and a conductor 460_2b) positioned over the insulator 450_2.

Although FIG. 13 illustrates the structure in which the transistor 400a and the transistor 400b include the oxide 430a and the oxide 430b that are stacked, the transistor 400a and the transistor 400b may have a structure including a single layer of only the oxide 430b. Alternatively, the transistor 400a and the transistor 400b may have a structure including three or more oxide layers stacked.

Although FIG. 13 illustrates a structure in which the conductor 460_1a and the conductor 460_1b are each a single layer and the conductor 460_2a and the conductor 460_2b are each a single layer, these conductors may each have a structure in which two or more conductor layers are stacked, for example.

The transistor 400b includes components corresponding to those included in the transistor 400a. Thus, in drawings, the corresponding components in the transistor 400a and the transistor 400b are basically denoted by the same three-digit reference numerals. In addition, unless otherwise specified, the description of the transistor 400a can be referred to for the transistor 400b below.

As in the description of the transistors 400a and 400b, the capacitor 500b includes components corresponding to those included in the capacitor 500a. Thus, in drawings, the corresponding components in the capacitor 500a and the capacitor 500b are basically denoted by the same three-digit reference numerals. Thus, unless otherwise specified, the description of the capacitor 500a can be referred to for the capacitor 500b below.

As illustrated in FIG. 13, the oxide 430 is shared by the transistor 400a and the transistor 400b, whereby the distance between the conductor 460_1 functioning as a first gate electrode of the transistor 400a and the conductor 460_2 functioning as a first gate electrode of the transistor 400b can be substantially equal to the minimum feature size, resulting in a reduction in the area occupied by the transistors in each memory cell.

The conductor 442b has a function of one of a source electrode and a drain electrode of the transistor 400a and a function of one of a source electrode and a drain electrode of the transistor 400b. The conductor 440 has a function of a plug and is electrically connected to the conductor 442b. With the above structure, in one embodiment of the present invention, the distance between the transistor 400a and the transistor 400b adjacent to each other can be small. Thus, the semiconductor device including the transistor 400a, the transistor 400b, the capacitor 500a, and the capacitor 500b can be highly integrated. The conductor 446 is electrically connected to the conductor 440 and has a function of a wiring.

Although an insulator 444 is provided so as to cover the oxide 430, the conductor 442a, the conductor 442b, and the conductor 442c of the transistor 400a and the transistor 400b in FIG. 13, a structure without the insulator 444 may be employed in one embodiment of the present invention. When the insulator 444 is provided so as to cover the conductor 442a, the conductor 442b, and the conductor 442c, surfaces of the conductor 442a, the conductor 442b, and the conductor 442c can be prevented from being oxidized.

The insulator 480 is positioned over the insulator 444. The concentration of impurities such as water or hydrogen in the film of the insulator 480 is preferably lowered. In a depressed portion formed by the insulator 480, the conductor 442a, the conductor 442b, and the oxide 430, the oxide 430_1c is positioned along the inner wall of the depressed portion, the insulator 450_1 is positioned so as to overlap with the oxide 430_1c, the conductor 460_1b is positioned so as to overlap with the insulator 450_1, and the conductor 460_1a is positioned so as to overlap with the conductor 460_1b. Similarly, in a depressed portion formed by the insulator 480, the conductor 442b, the conductor 442c, and the oxide 430, the oxide 430_2c is positioned along the inner wall of the depressed portion, the insulator 450_2 is positioned so as to overlap with the oxide 430_2c, the conductor 460_2b is positioned so as to overlap with the insulator 450_2, and the conductor 460_2a is positioned so as to overlap with the conductor 460_2b.

In one embodiment of the present invention, an insulator 474 is positioned over the insulator 480, the oxide 430_1c, the oxide 430_2c, the insulator 4501, the insulator 450_2, the conductor 460_1, and the conductor 460_2, and an insulator 481 is positioned over the insulator 474.

The insulator 474 and the insulator 481 can function as barrier insulating films that prevent impurities such as water or hydrogen from entering the transistors from an upper layer. For the insulator 474 and the insulator 481, an insulating material having a function of inhibiting the passage of impurities such as water or hydrogen is preferably used. For example, it is preferable that aluminum oxide, hafnium oxide, an oxide containing silicon and hafnium (hafnium silicate), an oxide containing aluminum and hafnium (hafnium aluminate), or the like be used for the insulator 474, and silicon nitride or the like be used for the insulator 481. This can inhibit diffusion of impurities such as hydrogen or water to a layer below the insulator 474 and the insulator 481. Note that the insulator 474 and the insulator 481 preferably have a function of inhibiting the passage of at least one of impurities such as hydrogen atoms, hydrogen molecules, water molecules, nitrogen atoms, nitrogen molecules, nitrogen oxide molecules (e.g., $N_2O$, $NO$, and $NO_2$), and copper atoms. Furthermore, hereinafter, the same applies to the case where an insulating material that has a function of inhibiting the passage of impurities is described.

For the insulator 474 and the insulator 481, an insulating material having a function of inhibiting the passage of oxygen (e.g., oxygen atoms or oxygen molecules) is preferably used. This can inhibit upward diffusion of oxygen contained in the insulator 481 or the like.

In one embodiment of the present invention, the other of the source region and the drain region of the transistor 400a and the capacitor 500a are provided so as to overlap with each other. Similarly, the other of the source region and the drain region of the transistor 400b and the capacitor 500b are provided so as to overlap with each other. It is particularly preferable that the capacitor 500a and the capacitor 500b have a structure where their side surface area is larger than their bottom surface area (hereinafter, such a structure is also referred to as a cylinder capacitor). Thus, the capacitance value per projected area of the capacitor 500a or the capacitor 500b can be large.

The transistor 400a and the transistor 400b using an oxide semiconductor in their channel formation regions have an extremely low leakage current in an off state; thus, a semiconductor device with low power consumption can be provided. An oxide semiconductor can be deposited by a sputtering method or the like, and thus can be used for the transistor 400a and the transistor 400b included in a highly integrated semiconductor device.

In some cases, a low-resistance region having lower resistance than the channel formation region is formed in a region of the oxide 430 that overlaps with the conductor 442a, more specifically, a region 443a in the vicinity of the surface of the oxide 430 that is in contact with the conductor 442a. Similarly, in some cases, a low-resistance region having lower resistance than the channel formation region is formed in a region of the oxide 430 that overlaps with the conductor 442b, more specifically, a region 443b in the vicinity of the surface of the oxide 430 that is in contact with the conductor 442b. Similarly, in some cases, a low-resistance region having lower resistance than the channel formation region is formed in a region of the oxide 430 that overlaps with the conductor 442c, more specifically, a region 443c in the vicinity of the surface of the oxide 430 that is in contact with the conductor 442c. With the above regions, the contact resistance between the oxide 430 and each of the conductor 442a, the conductor 442b, and the conductor 442c can be reduced, and the on-state current of the transistor 400a and the transistor 400b can be increased.

The capacitor 500a includes the conductor 510a, the insulator 530, the conductor 520a over the insulator 530. The capacitor 500b includes the conductor 510b, the insulator 530, and the conductor 520b over the insulator 530. The capacitor 500a has a structure where the conductor 510a functioning as a lower electrode and the conductor 520a functioning as an upper electrode face each other with the insulator 530 functioning as a dielectric therebetween, along the bottom surface and the side surface of the opening in the insulator 444, the insulator 480, the insulator 474, and the insulator 481. The above structure allows the electrostatic capacitance per unit area of the capacitor 500a to be high, which enables further miniaturization and higher integration of a semiconductor device. The electrostatic capacitance value of the capacitor 500a can be set as appropriate with the thickness of the insulator 480. Therefore, a semiconductor device with high design flexibility can be provided.

In particular, with the deeper opening in the insulator 480, the capacitor 500a can have increased electrostatic capacitance without an increase in its projected area. Thus, the capacitor 500a preferably has a cylinder shape (the side surface area is larger than the bottom surface area).

FIG. 13 illustrates an example where the conductor 520a and the conductor 520b have depressed portions, and the insulator 540 over the capacitor 500a and the capacitor 500b is positioned above and inside the depressed portions.

An insulator having a high permittivity is preferably used as the insulator 530. For example, an insulator containing an oxide of one or both of aluminum and hafnium can be used. Aluminum oxide, hafnium oxide, an oxide containing aluminum and hafnium (hafnium aluminate), or the like is preferably used as the insulator containing an oxide of one or both of aluminum and hafnium.

The insulator 530 may have a stacked-layer structure; for example, two or more layers selected from silicon oxide, silicon oxynitride, silicon nitride oxide, silicon nitride, aluminum oxide, hafnium oxide, an oxide containing aluminum and hafnium (hafnium aluminate), and the like may be used for the stacked-layer structure. For example, it is preferable that hafnium oxide, aluminum oxide, and hafnium oxide be deposited in this order by an ALD method to form a stacked-layer structure. Hafnium oxide and aluminum oxide each have a thickness of greater than or equal to 0.5 nm and less than or equal to 5 nm. With such a stacked-layer structure, the capacitor 500a can have a large capacitance value and a low leakage current.

Note that the conductor 510a or the conductor 520a may have a stacked-layer structure. For example, the conductor 510a or the conductor 520a may have a stacked-layer structure of a conductive material containing titanium, titanium nitride, tantalum, or tantalum nitride as its main component and a conductive material containing tungsten, copper, or aluminum as its main component. The conductor 510a or the conductor 520a may have either a single-layer structure or a stacked-layer structure of three or more layers.

The conductor 440 is formed in the opening in the insulator 444, the insulator 480, the insulator 474, the insulator 481, and the insulator 540. The conductor 442_b is positioned on at least part of a bottom portion of the opening, and the conductor 440 is electrically connected to the conductor 442_b in the opening.

This embodiment can be implemented in combination with the other embodiments as appropriate.

Embodiment 5

Next, a manufacturing method of the semiconductor device that includes the transistor 400a, the transistor 400b, the capacitor 500a, and the capacitor 500b illustrated in FIG. 11 will be described with reference to FIG. 14 to FIG. 27. In FIG. 14 to FIG. 27, (A) of each drawing is a top view. (B) of each drawing is a cross-sectional view along dashed-dotted line A1-A2 in (A) of each drawing. (C) of each drawing is a cross-sectional view along dashed-dotted line A3-A4 in (A) of each drawing.

First, an insulator 490 is formed over a substrate or another insulating surface. The insulator 490 can be formed by a sputtering method, a chemical vapor deposition (CVD) method, a molecular beam epitaxy (MBE) method, a pulsed laser deposition (PLD) method, an ALD method, or the like.

In this embodiment, aluminum oxide is deposited as the insulator 490 by a sputtering method. The insulator 490 may have a multilayer structure. For example, a structure may be employed in which aluminum oxide is deposited by a sputtering method and another aluminum oxide is deposited on the aluminum oxide by an ALD method. Alternatively, a structure may be employed in which aluminum oxide is deposited by an ALD method and another aluminum oxide is deposited on the aluminum oxide by a sputtering method.

Next, a conductive film to be a conductor 492a and a conductor 492b is formed over the insulator 490. The conductive film to be the conductor 492a and the conductor 492b can be formed by a sputtering method, a CVD method, an MBE method, a PLD method, an ALD method, or the like. The conductive film to be the conductor 492a and the conductor 492b can be a multilayer film. For example, tungsten is preferably deposited as the conductive film to be the conductor 492a and the conductor 492b.

Next, the conductive film to be the conductor 492a and the conductor 492b is processed by a lithography method to form the conductor 492a and the conductor 492b.

Next, an insulating film to be the insulator 491 is formed over the insulator 490, the conductor 492a, and the conductor 492b. The insulator to be the insulator 491 can be formed by a sputtering method, a CVD method, an MBE method, a PLD method, an ALD method, or the like. For example, silicon oxide is deposited as the insulating film to be the insulator 491 by a CVD method.

Here, the thickness of the insulating film to be the insulator 491 is preferably larger than or equal to the thickness of the conductor 492a and the thickness of the conductor 492b. For example, when the thickness of the conductor 492a and the thickness of the conductor 492b are 1, the thickness of the insulating film to be the insulator 491 is greater than or equal to 1 and less than or equal to 3.

Next, CMP (chemical Mechanical Polishing) treatment is performed on the insulating film to be the insulator 491, so that part of the insulating film to be the insulator 491 is removed and a surface of the conductor 492a and a surface of the conductor 492b are exposed. Accordingly, the conductor 492a, the conductor 492b, and the insulator 491 whose top surfaces are flat can be formed.

Then, the insulator 414 is formed over the insulator 491, the conductor 492a, and the conductor 492b. The insulator 414 can be formed by a sputtering method, a CVD method, an MBE method, a PLD method, an ALD method, or the like. For example, silicon nitride is deposited as the insulator 414 by a CVD method. As described here, an insulator through which copper is less likely to pass, such as silicon nitride, is used as the insulator 414; accordingly, even when a metal that is easy to diffuse, such as copper, is used for the conductor 492a and the conductor 492b, the metal can be prevented from diffusing into a layer above the insulator 414.

Next, the insulator 416 is formed over the insulator 414. The insulator 416 can be formed by a sputtering method, a CVD method, an MBE method, a PLD method, an ALD method, or the like. For example, silicon oxide is deposited as the insulator 416 by a CVD method.

Next, depression portions are formed in the insulator 414 and the insulator 416. Examples of the depression portions include holes, grooves (slits), and openings. The depression portions may be formed by wet etching; however, dry etching is preferably used for microfabrication.

After the formation of the depression portions, a conductive film to be the conductor 405_1a and a conductor 405_2a is formed. The conductor 405_1a and the conductor 405_2a desirably includes a conductor having a function of inhibiting the passage of oxygen. For example, tantalum nitride, tungsten nitride, or titanium nitride can be used. Alternatively, a stacked-layer film of the above conductor and tantalum, tungsten, titanium, molybdenum, aluminum, copper, or a molybdenum-tungsten alloy can be used. The conductive film to be the conductor 405_1a and the conductor 405_2a can be formed by a sputtering method, a CVD method, an MBE method, a PLD method, an ALD method, or the like.

Next, a conductive film to be the conductor 405_1b and the conductor 405_2b is formed over the conductive film to be the conductor 405_1a and the conductor 4052a. The conductive film to be the conductor 405_1b and the conductor 405_2b can be formed by a sputtering method, a CVD method, an MBE method, a PLD method, an ALD method, or the like.

Next, CMP treatment is performed so that the conductive film to be the conductor 405_1a and the conductor 405_1b and the conductive film to be the conductor 405_2a and the conductor 405_2b which are over the insulator 416 are removed. As a result, the conductive film to be the conductor 405_1a and the conductor 405_1b and the conductive film to be the conductor to be the conductor 405_2a and the conductor 405_2b remain only in the depression portions; thus, the conductor 405_1 and the conductor 405_2 whose top surfaces are flat can be formed (see FIG. 14).

Next, the insulator 420 is formed over the insulator 416, the conductor 405_1, and the conductor 405_2. The insulator 420 can be formed by a sputtering method, a CVD method, an MBE method, a PLD method, an ALD method, or the like.

Next, the insulator 422 is formed over the insulator 420. The insulator 422 can be formed by a sputtering method, a CVD method, an MBE method, a PLD method, an ALD method, or the like.

Next, the insulator 424 is formed over the insulator 422. The insulator 424 can be formed by a sputtering method, a CVD method, an MBE method, a PLD method, an ALD method, or the like.

Next, first heat treatment is preferably performed. The first heat treatment is performed at higher than or equal to 250° C. and lower than or equal to 650° C., preferably higher than or equal to 300° C. and lower than or equal to 500° C., more preferably higher than or equal to 320° C. and lower than or equal to 450° C. The first heat treatment is performed in a nitrogen atmosphere, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen. Through the first heat treatment, impurities such as hydrogen and water contained in the insulator 424 can be removed, for example. Alternatively, in the first heat treatment, plasma treatment containing oxygen may be performed under a reduced pressure. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be generated, and application of the RF to the substrate side allows the oxygen radicals generated by the high-density plasma to be efficiently introduced into the insulator 424. Alternatively, after plasma treatment containing an inert gas is performed with this apparatus, plasma treatment containing oxygen may be performed to compensate for released oxygen. Note that the first heat treatment does not need to be performed in some cases.

The heat treatment can be performed after the formation of the insulator 420, after the formation of the insulator 422, and after the formation of the insulator 424. Although the conditions for the first heat treatment can be used for the heat treatment, the heat treatment after the formation of the insulator 420 is preferably performed in an atmosphere containing nitrogen.

For example, as the first heat treatment, treatment is performed at a temperature of 400° C. in a nitrogen atmosphere for one hour after the formation of the insulator 424.

Figure 14A:
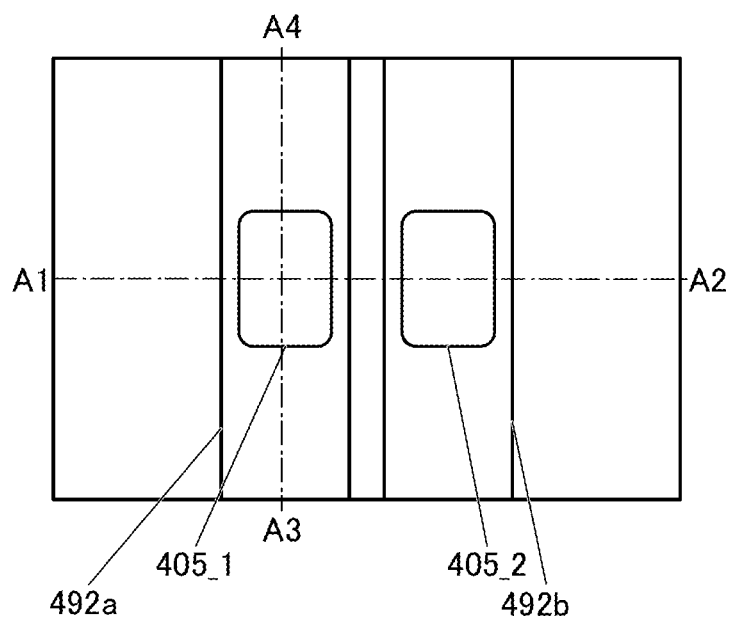
FIGS. 14A-14C are diagrams illustrating a method for manufacturing a semiconductor device.
Figure 14C:
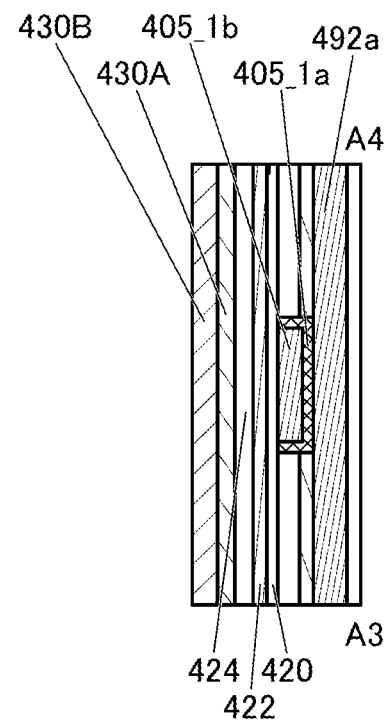
Figure 14B:
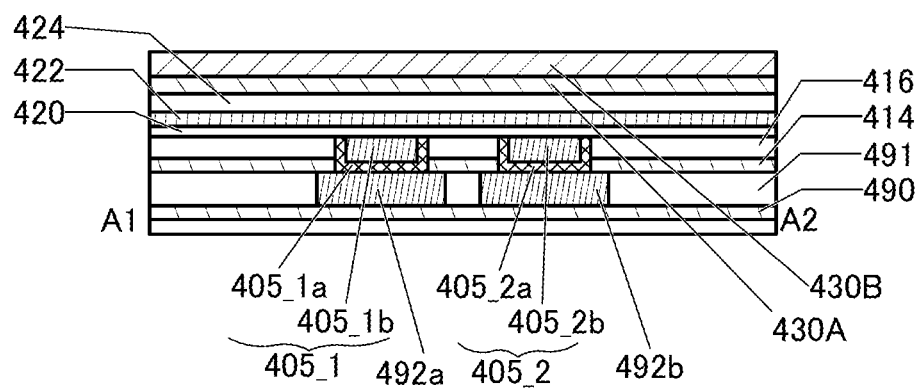
Figure 15A:
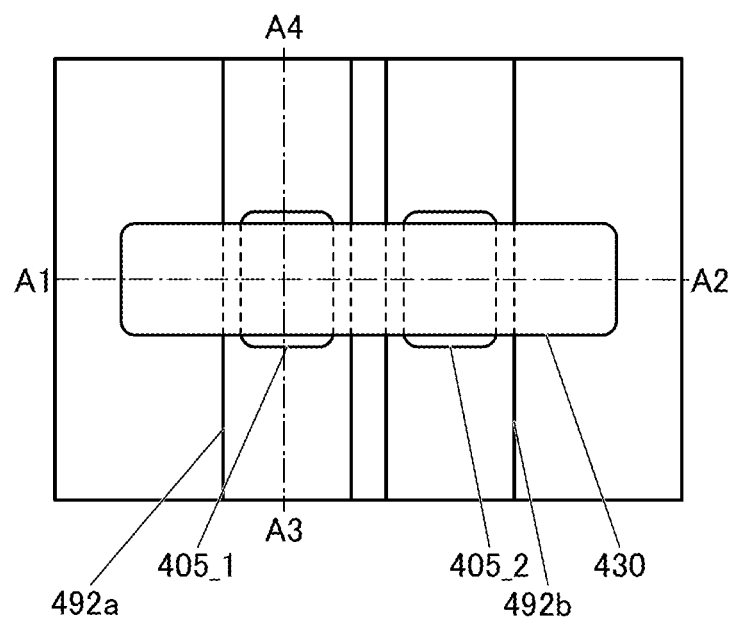
FIGS. 15A-15C are diagrams illustrating a method for manufacturing a semiconductor device.
Figure 15C:
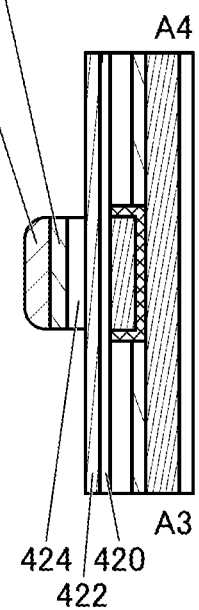
Figure 15B:
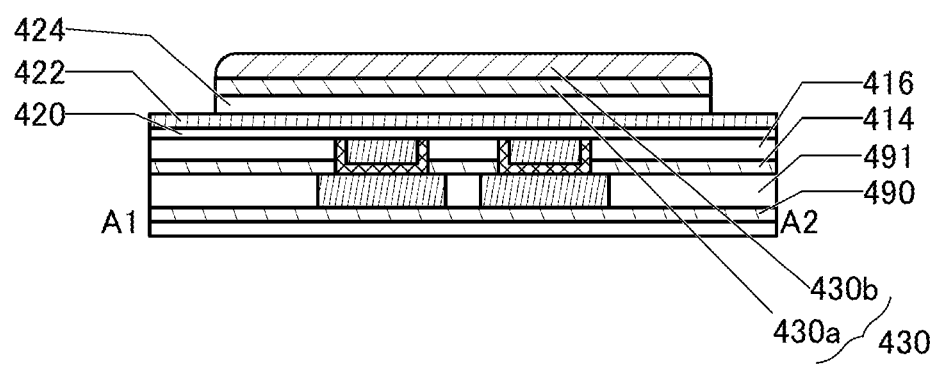

Next, an oxide film 430A and an oxide film 430B are formed in this order over the insulator 424 (see FIG. 14). Note that it is preferable to form the oxide film 430A and the oxide film 430B successively without exposure to the air. When the oxide films are formed without exposure to the air, impurities or moisture from the air environment can be prevented from being attached to the oxide film 430A, so that the vicinity of an interface between the oxide film 430A and the oxide film 430B can be kept clean.

The oxide film 430A and the oxide film 430B can be formed by a sputtering method, a CVD method, an MBE method, a PLD method, an ALD method, or the like.

For example, in the case where the oxide film 430A and the oxide film 430B are formed by a sputtering method, oxygen or a mixed gas of oxygen and a rare gas is used as a sputtering gas. Increasing the proportion of oxygen contained in the sputtering gas can increase the amount of excess oxygen in the oxide film to be formed. In addition, in the case where the oxide film 430A and the oxide film 430B are formed by a sputtering method, the above-described In-M-Zn oxide target can be used.

In particular, at the time of the formation of the oxide film 430A, part of oxygen contained in the sputtering gas is supplied to the insulator 424 in some cases.

Note that the proportion of oxygen contained in the sputtering gas for the oxide film 430A is higher than or equal to 70%, preferably higher than or equal to 80%, more preferably 100%.

The oxide film 430A is formed by a sputtering method. When the proportion of oxygen contained in the sputtering gas at the time of the formation of the oxide film 430A is higher than or equal to 1% and lower than or equal to 30%, preferably higher than or equal to 5% and lower than or equal to 40%, an oxygen-deficient oxide semiconductor is formed. In a transistor using an oxygen-deficient oxide semiconductor, relatively high field-effect mobility can be obtained.

In the case where an oxygen-deficient oxide semiconductor is used for the oxide film 430A, an oxide film containing excess oxygen is preferably used as the oxide film 430A. Oxygen doping treatment may be performed after the formation of the oxide film 430A.

The oxide film 430A is formed by a sputtering method using a target with In:Ga:Zn=1:3:4 [atomic ratio], and the oxide film 430B is formed by a sputtering method using a target with In:Ga:Zn=4:2:4.1 [atomic ratio], for example.

Then, second heat treatment may be performed. For the second heat treatment, the conditions for the first heat treatment can be used. Through the second heat treatment, impurities such as hydrogen and water contained in the oxide film 430A and the oxide film 430B can be removed, for example. For example, treatment is performed at a temperature of 400° C. in a nitrogen atmosphere for one hour, and then another treatment is successively performed at a temperature of 400° C. in an oxygen atmosphere for one hour.

Next, the oxide film 430A and the oxide film 430B are processed into island shapes to form the oxide 430 (the oxide 430a and the oxide 430b). At this time, the insulator 424 in a region that overlaps with neither the oxide 430a nor the oxide 430b is etched and the surface of the insulator 422 is exposed in some cases (see FIG. 15).

Here, the oxide 430 is formed so as to at least partly overlap with the conductor 405_1 and the conductor 405_2. A side surface of the oxide 430 is preferably substantially perpendicular to the insulator 422. When the side surface of the oxide 430 is substantially perpendicular to the insulator 422, a plurality of transistors 400a and 400b can be provided in a small area with high density. Note that a structure in which an angle formed between the side surface of the oxide 430 and the top surface of the insulator 422 is an acute angle may be employed. In that case, it is preferred that the angle formed between the side surface of the oxide 430 and the top surface of the insulator 422 be as large as possible.

There may be a curved surface between the side surface of the oxide 430 and the top surface of the oxide 430. That is, an end portion of the side surface and an end portion of the top surface are preferably curved (such a shape is hereinafter also referred to as a rounded shape). It is preferred that the radius of curvature of the curved surface at an end portion of the oxide 430b be greater than or equal to 3 nm and less than or equal to 10 nm, preferably greater than or equal to 5 nm and less than or equal to 6 nm. When the end portions are not angular, the coverage with films deposited in a later step can be improved.

Note that the oxide films may be processed by a lithography method. The processing can be performed by a dry etching method or a wet etching method. Processing by a dry etching method is suitable for microfabrication.

In some cases, treatment such as dry etching performed in the above process causes the attachment or diffusion of impurities due to an etching gas or the like to a surface or an inside of the oxide 430a, the oxide 430b, and the like. Examples of the impurities include fluorine and chlorine. In order to remove the above impurities and the like, cleaning is performed. Examples of cleaning methods include wet cleaning using a cleaning solution or the like, plasma treatment using plasma, cleaning by heat treatment, and the like, and any of them described above can be performed in appropriate combination. As wet cleaning, cleaning treatment may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Next, third heat treatment may be performed. For the heat treatment, the above conditions for the first heat treatment can be used.

Then, an oxide film to be the oxide film 430c is formed over the insulator 422 and the oxide 430. The oxide film to be the oxide film 430c can be formed by a sputtering method, a CVD method, an MBE method, a PLD method, an ALD method, or the like.

Figure 16A:
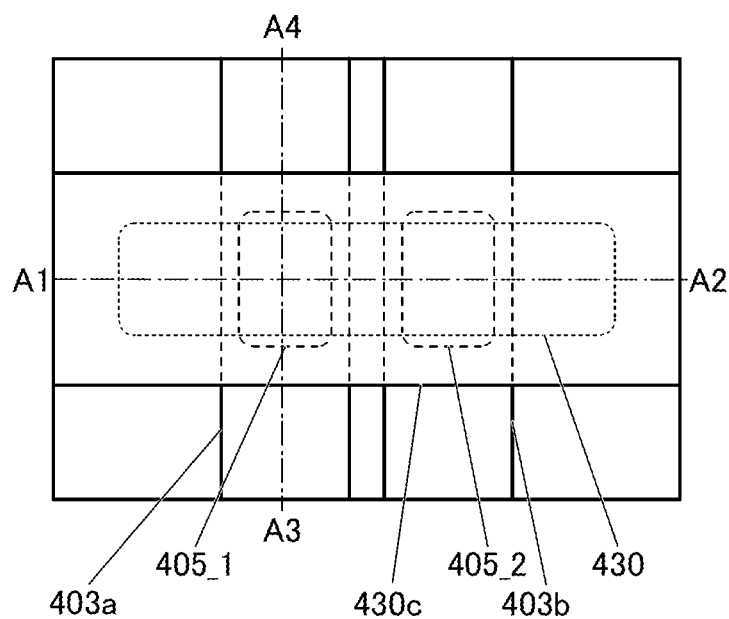
FIGS. 16A-16C are diagrams illustrating a method for manufacturing a semiconductor device.
Figure 16C:
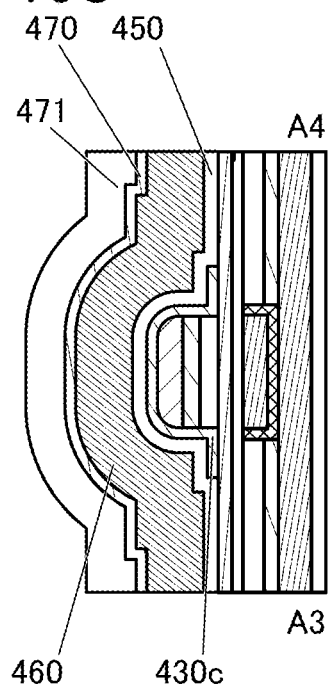
Figure 16B:
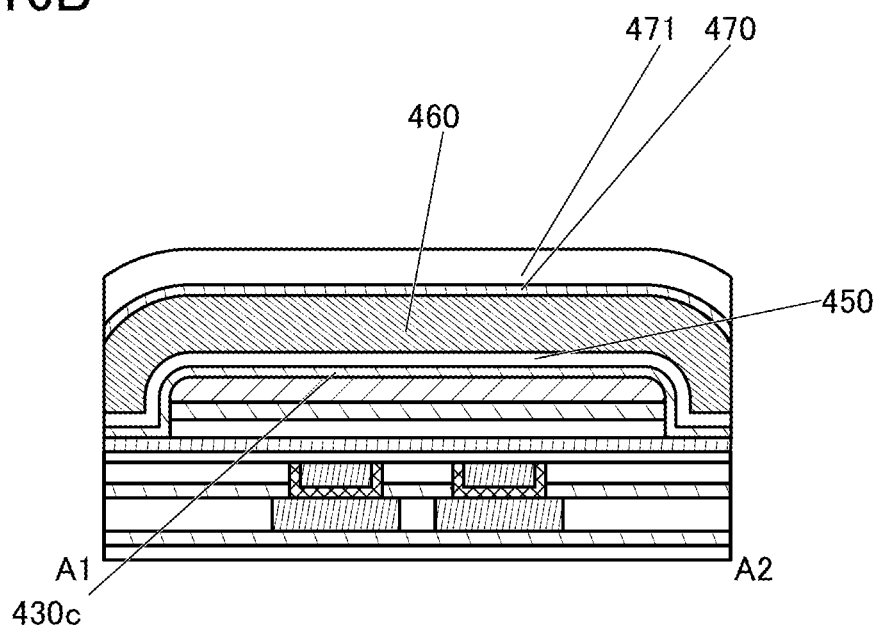

Note that the oxide film to be the oxide film 430c is processed into an island shape to form the oxide film 430c as illustrated in FIG. 16. When the oxide film 430c is formed before the formation of the insulator 450a, the insulator 450b, the conductor 460a, and the conductor 460b, part of the oxide film to be the oxide film 430c positioned below the insulator 450a, the insulator 450b, the conductor 460a, and the conductor 460b, which are formed in a later process, can be removed. Thus, the oxide film to be the oxide film 430c is divided between adjacent memory cells, and leakage through the oxide film to be the oxide film 430c between the memory cells can be prevented, which is preferable. The oxide film 430c can be formed by dry etching and wet etching.

Next, an insulating film 450, a conductive film 460, an insulating film 470, and an insulating film 471 are formed in this order over the insulator 422 and the oxide film 430c (see FIG. 16).

The insulating film 450 can be formed by a sputtering method, a CVD method, an MBE method, a PLD method, an ALD method, or the like. The insulating film 450 may have a stacked-layer structure. For example, in the case where the insulating film 450 has a two-layer structure, a second layer of the insulating film 450 is formed by a sputtering method in an atmosphere containing oxygen, whereby oxygen can be added to a first layer of the insulating film 450.

After the insulating film 450 is formed, fourth heat treatment may be performed before the conductive film 460 is formed. For the fourth heat treatment, the conditions for the first heat treatment can be used. Through the heat treatment, the moisture concentration and the hydrogen concentration in the insulating film 450 can be reduced.

The conductive film 460 can be formed by a sputtering method, a CVD method, an MBE method, a PLD method, an ALD method, or the like.

The insulating film 470 and the insulating film 471 can be formed by a sputtering method, a CVD method, an MBE method, a PLD method, an ALD method, or the like; in particular, the insulating film 470 is preferably formed by an ALD method. When the insulating film 470 is formed by an ALD method, the thickness can be approximately 0.5 nm to 10 nm inclusive, preferably approximately 0.5 nm to 3 nm inclusive. Note that the formation of the insulating film 470 can be omitted.

The insulating film 471 can be used as a hard mask in processing the conductive film 460. The insulating film 471 can have a stacked-layer structure. For example, silicon oxynitride and silicon nitride over the silicon oxynitride may be positioned.

After the insulating film 471 is formed, fifth heat treatment may be performed before the insulating film 471 is etched. For the heat treatment, the conditions for the first heat treatment can be used.

Then, the insulating film 471 is etched by a lithography method to form the insulator 471a and the insulator 471b.

Figure 17A:
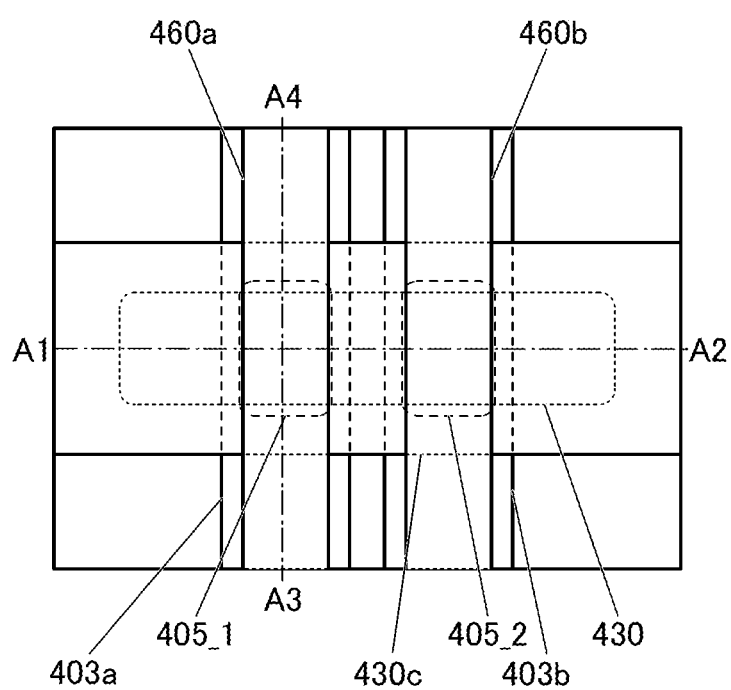
FIGS. 17A-17C are diagrams illustrating a method for manufacturing a semiconductor device.
Figure 17C:
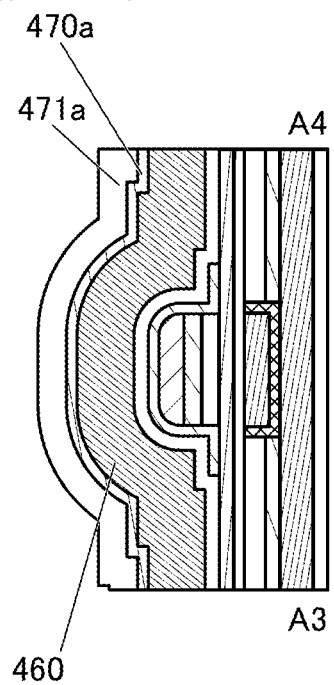
Figure 17B:
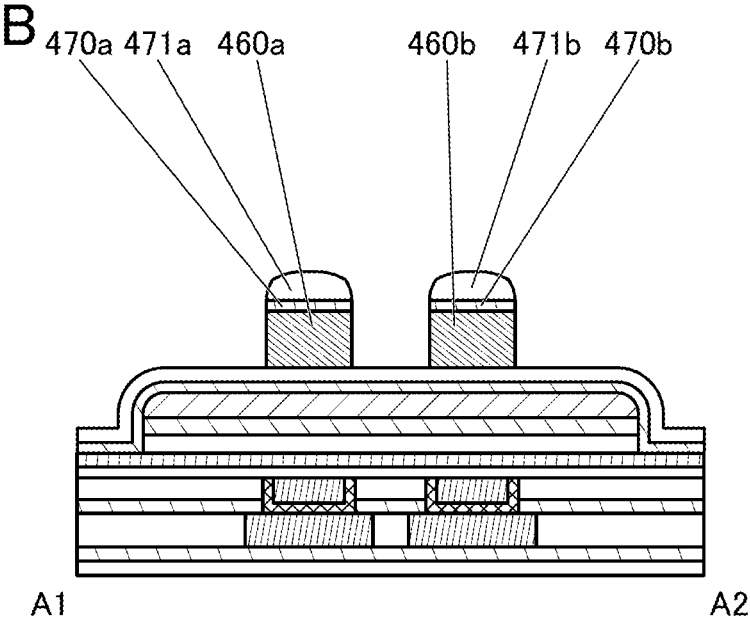
Figure 18A:
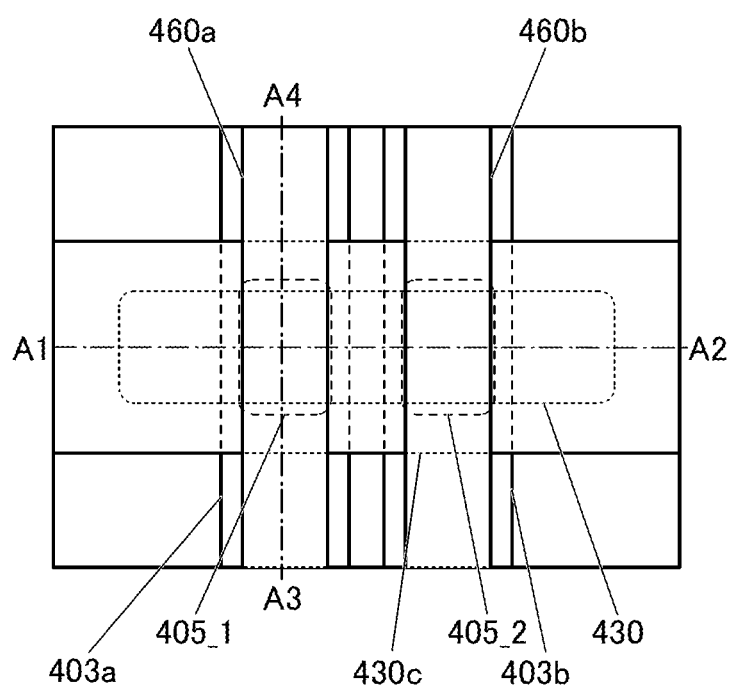
FIGS. 18A-18C are diagrams illustrating a method for manufacturing a semiconductor device.
Figure 18C:
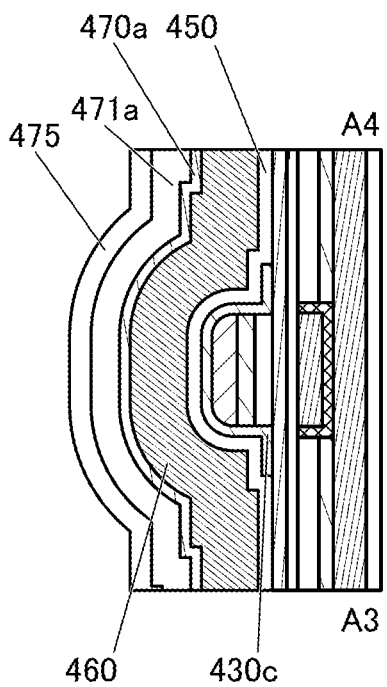
Figure 18B:
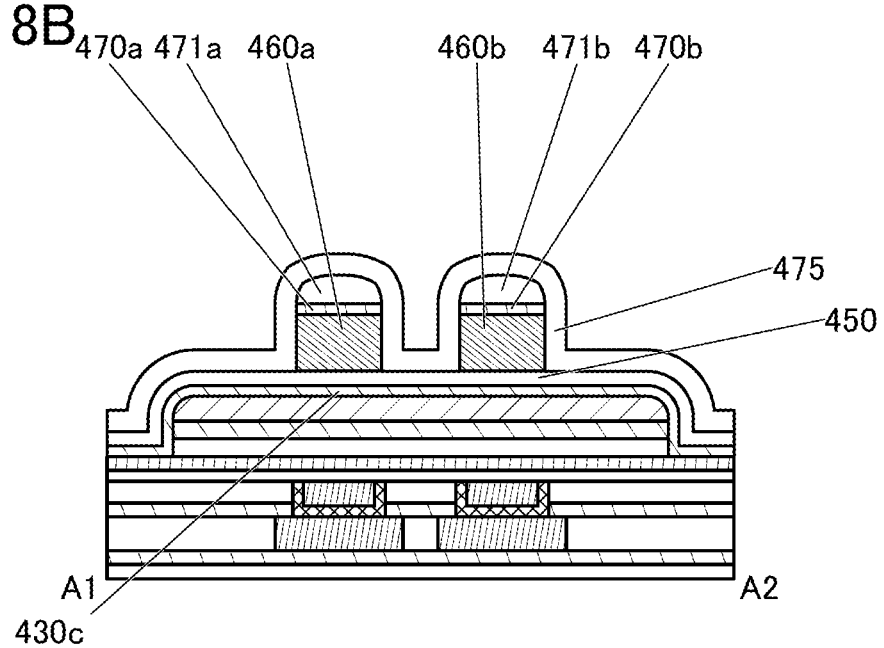
Figure 19A:
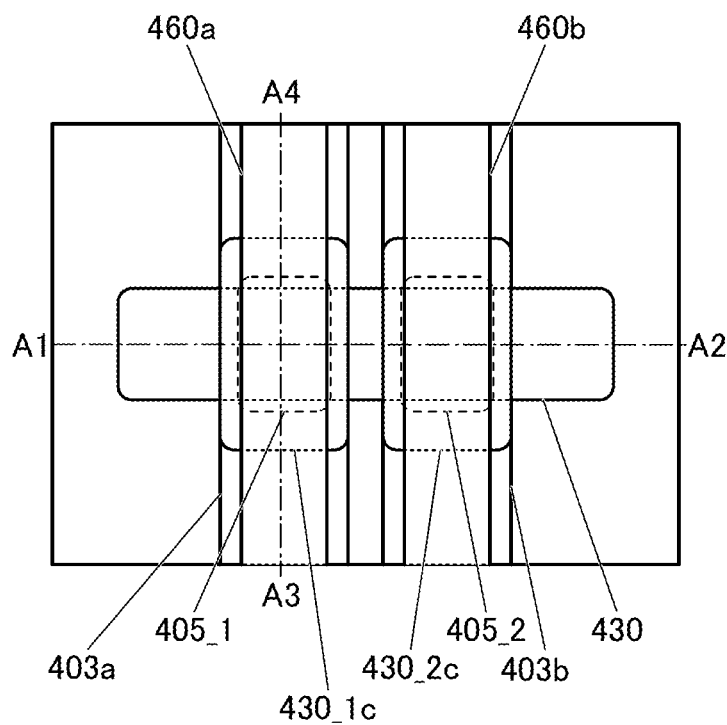
FIGS. 19A-19C are diagrams illustrating a method for manufacturing a semiconductor device.
Figure 19C:
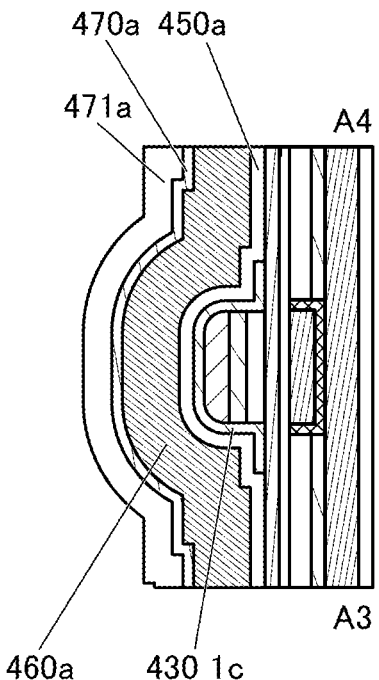
Figure 19B:
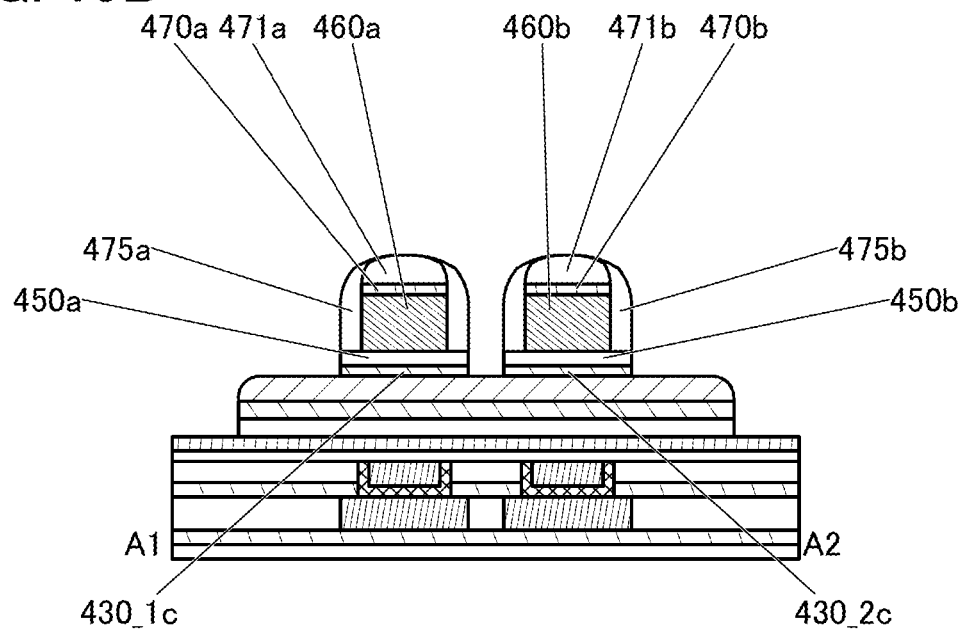

Next, the conductive film 460 and the insulating film 470 are etched using the insulator 471a and the insulator 471b as hard masks, so that the conductor 460a, the insulator 470a, the conductor 460b, and the insulator 470b are formed (see FIG. 17).

Note that it is preferable that the cross-sectional shapes of the conductor 460a and the insulator 470a should not be tapered wherever possible. Similarly, it is preferable that the conductor 460b and the insulator 470b should not have a tapered shape wherever possible. The angle formed between the bottom surface of the oxide 430 and each of the side surfaces of the conductor 460a and the insulator 470a is preferably greater than or equal to 80° and less than or equal to 100°. Similarly, the angle formed between the bottom surface of the oxide 430 and each of the side surfaces of the conductor 460b and the insulator 470b is preferably greater than or equal to 80° and less than or equal to 100°. In that case, the insulator 475a and the insulator 475b are likely to be left when the insulator 475a and the insulator 475b are formed in a later step.

Note that an upper portion of the insulating film 450 or the oxide film 430c in a region overlapping with neither the conductor 460a nor the conductor 460b is etched by the above etching, in some cases. In that case, the thicknesses of regions of the insulating film 450 or the oxide film 430c overlapping with the conductor 460a or the conductor 460b are larger than the thickness of the region overlapping with neither the conductor 460a nor the conductor 460b.

Next, the insulating film 475 is formed so as to cover the insulating film 450, the conductor 460a, the insulator 470a, the insulator 471a, the conductor 460b, the insulator 470b, and the insulator 471b. The insulating film 475 can be formed by a sputtering method, a CVD method, an MBE method, a PLD method, an ALD method, or the like. As the insulating film 475, silicon oxide is deposited by a CVD method, for example (see FIG. 18).

Next, the insulating film 475 is subjected to anisotropic etching treatment, whereby the oxide film 430c, the insulating film 450, and the insulating film 475 are processed to form the oxide 430_1c, the insulator 450a and the insulator 475a, the oxide 4302c, and the insulator 450b and the insulator 475b. The insulator 475a is formed in contact with at least the conductor 460a and the insulator 471a, and the insulator 475b is formed in contact with at least the conductor 460b and the insulator 471b. Dry etching treatment is preferably performed as anisotropic etching treatment. Consequently, the oxide film 430c, the insulating film 450, and the insulating film 475 formed on a plane substantially parallel to a substrate surface are removed and the oxide 430_1c, the oxide 4302c, the insulator 450a, the insulator 450b, the insulator 475a, and the insulator 475b can be formed in a self-aligned manner (see FIG. 19).

Figure 20A:
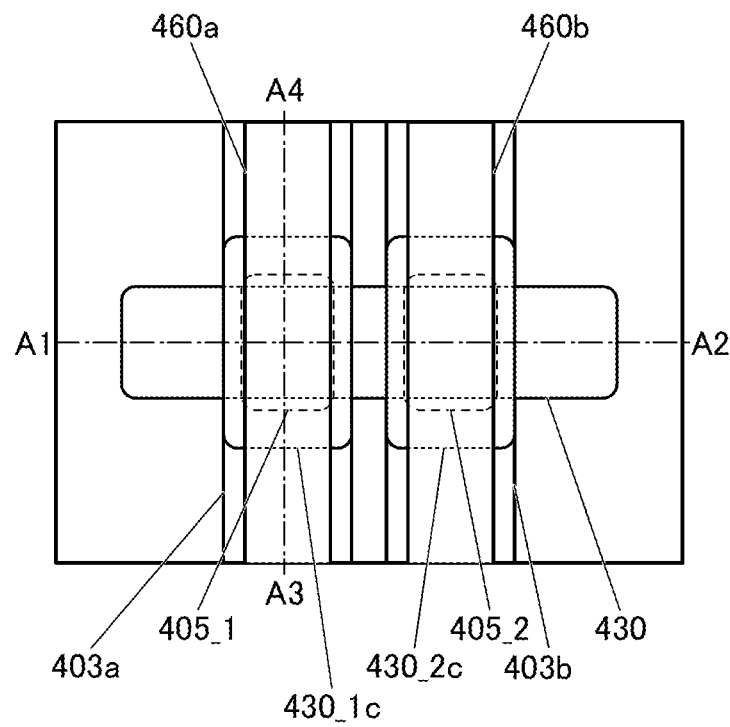
FIGS. 20A-20C are diagrams illustrating a method for manufacturing a semiconductor device.
Figure 20C:
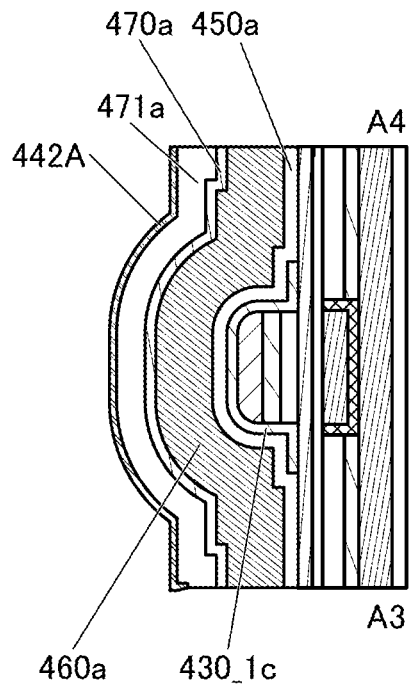
Figure 20B:
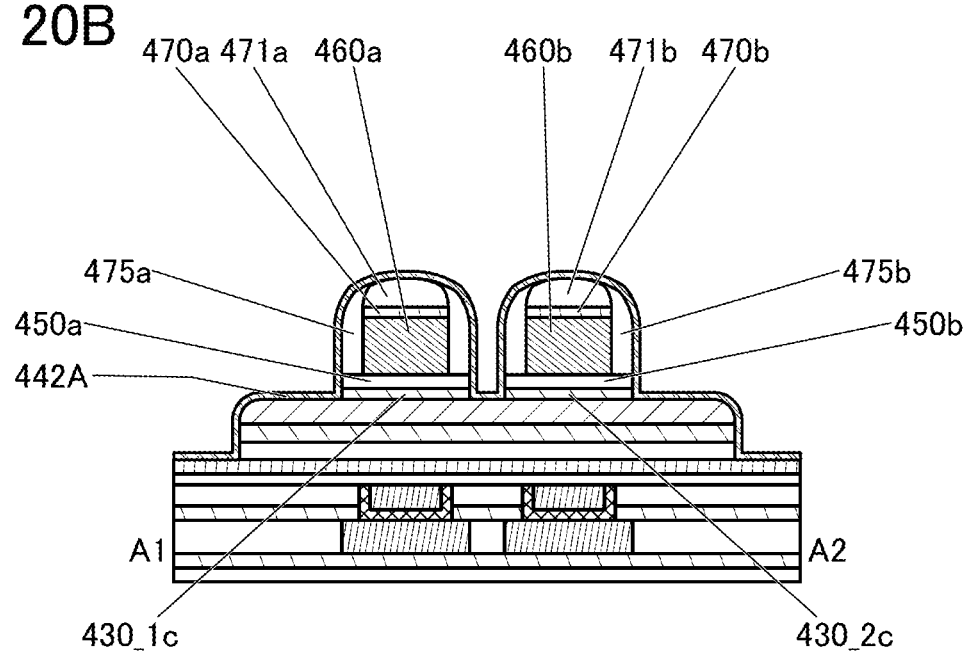
Figure 21A:
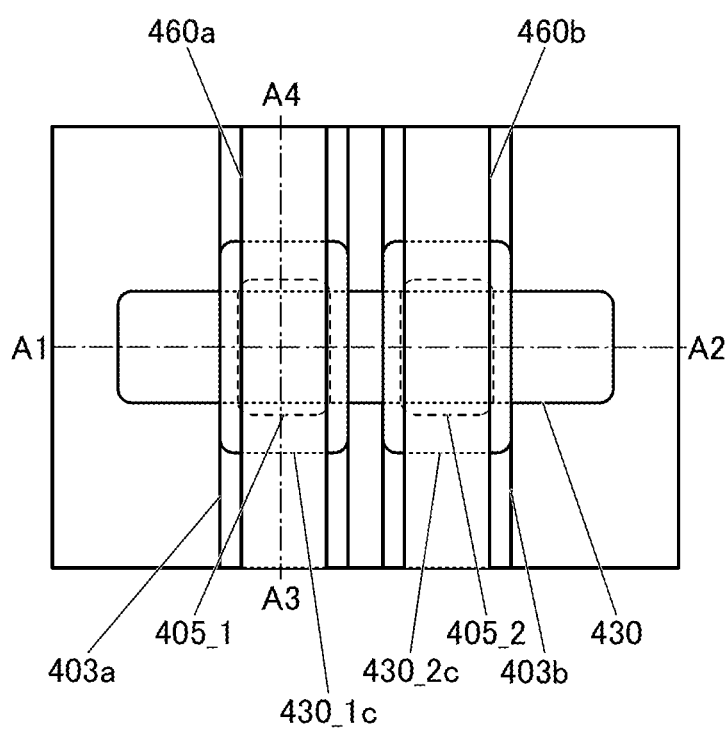
FIGS. 21A-21C are diagrams illustrating a method for manufacturing a semiconductor device.
Figure 21C:
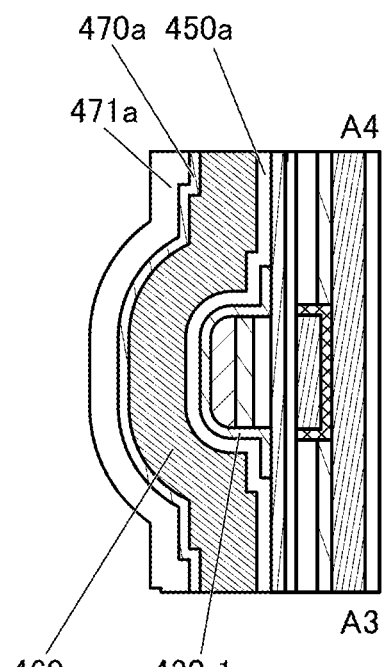
Figure 21B:
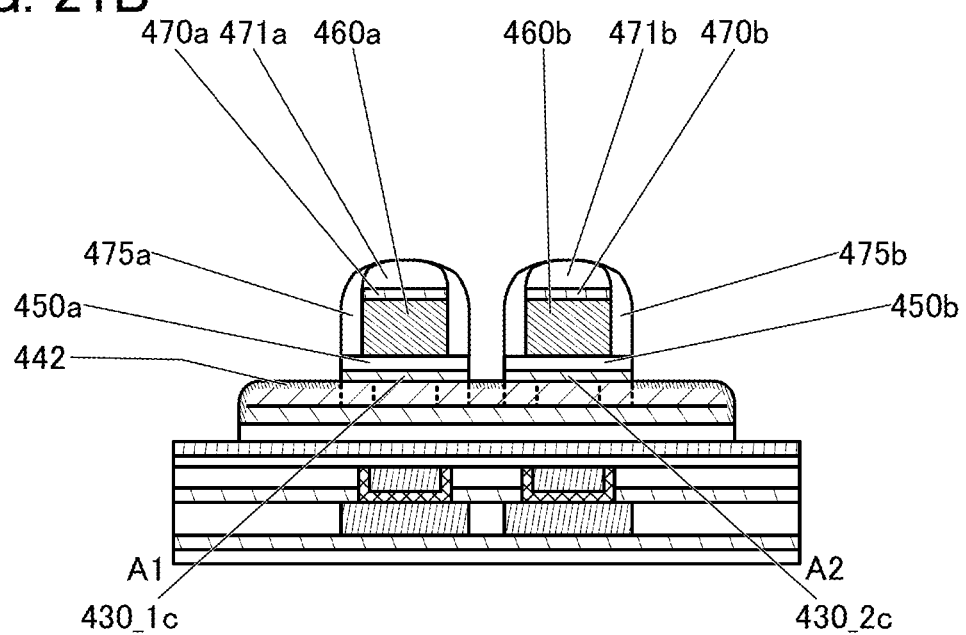

Then, a film 442A is formed over the insulator 424 and the oxide 430 such that the oxide 430_1c, the insulator 450a, the conductor 460a, the insulator 470a, the insulator 471a, and the insulator 475a, and the oxide 430_2c, the insulator 450b, the conductor 460b, the insulator 470b, the insulator 471b, and the insulator 475b are between the film 442A, and the insulator 424 and the oxide 430 (see FIG. 20).

As the film 442A, a metal film, a nitride film containing a metal element, or an oxide film containing a metal element is used. For example, the film 442A is a film containing a metal element such as aluminum, ruthenium, titanium, tantalum, tungsten, or chromium. Note that the film 442A can be formed by a sputtering method, a CVD method, an MBE method, a PLD method, an ALD method, or the like.

Sequentially, heat treatment is performed. By heat treatment in an atmosphere containing nitrogen, a metal element that is a component of the film 442A is diffused to the oxide 430, or a metal element that is a component of the oxide 430 is diffused to the film 442A; thus, the region 442 with reduced resistance can be formed on a surface layer of the oxide 430. After that, the film 442A may be removed (see FIG. 21).

The heat treatment may be performed at higher than or equal to 250° C. and lower than or equal to 650° C., preferably higher than or equal to 300° C. and lower than or equal to 500° C., more preferably higher than or equal to 320° C. and lower than or equal to 450° C. The heat treatment is performed in a nitrogen atmosphere or an inert gas atmosphere. The heat treatment may be performed under a reduced pressure.

Alternatively, heat treatment may be performed in a nitrogen atmosphere or an inert gas atmosphere, and then another heat treatment may be performed in an atmosphere containing an oxidizing gas at 10 ppm or more, 1% or more, or 10% or more. The heat treatment may be performed at higher than or equal to 250° C. and lower than or equal to 650° C., preferably higher than or equal to 300° C. and lower than or equal to 500° C., more preferably higher than or equal to 320° C. and lower than or equal to 450° C.

Here, when a metal compound is formed with a metal element of the film 442A and a metal element of the oxide 430, the region 442 with reduced resistance is formed. Note that the region 442 is a layer including a metal compound containing a component of the film 442A and a component of the oxide 430. For example, the region 442 may include a layer in which a metal element of the oxide 430 is alloyed with a metal element of the film 442A. Being alloyed, the metal element becomes relatively stable, so that a highly reliable semiconductor device can be provided.

Next, the insulator 480 is formed. The insulator 480 can be formed by a sputtering method, a CVD method, an MBE method, a PLD method, an ALD method, or the like. Alternatively, a spin coating method, a dipping method, a droplet discharging method (e.g., an ink-jet method), a printing method (e.g., screen printing or offset printing), a doctor knife method, a roll coater method, a curtain coater method, or the like can be used. In this embodiment, silicon oxynitride is used for the insulator 480.

The insulator 480 is preferably formed to have a flat top surface. For example, the top surface of the insulator 480 may have flatness immediately after the formation. Alternatively, for example, the insulator 480 may have flatness by removing an insulator and the like from the top surface after the formation such that the top surface becomes parallel to a reference surface such as a rear surface of the substrate. Such treatment is referred to as planarization treatment. Examples of the planarization treatment include CMP treatment and dry etching treatment. In this embodiment, CMP treatment is used as the planarization treatment.

By adjusting the thickness of the insulator 480, the electrostatic capacitance of the capacitor 500a and the capacitor 500b can be determined. Therefore, the thickness of the insulator 480 may be set as appropriate in accordance with the electrostatic capacitance required for the capacitor 500a and the capacitor 500b.

Figure 22A:
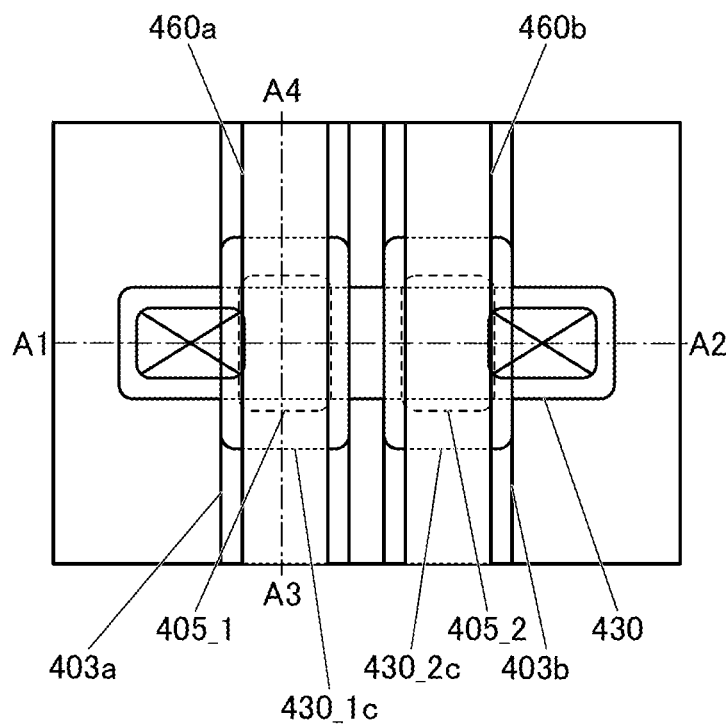
FIGS. 22A-22C are diagrams illustrating a method for manufacturing a semiconductor device.
Figure 22C:
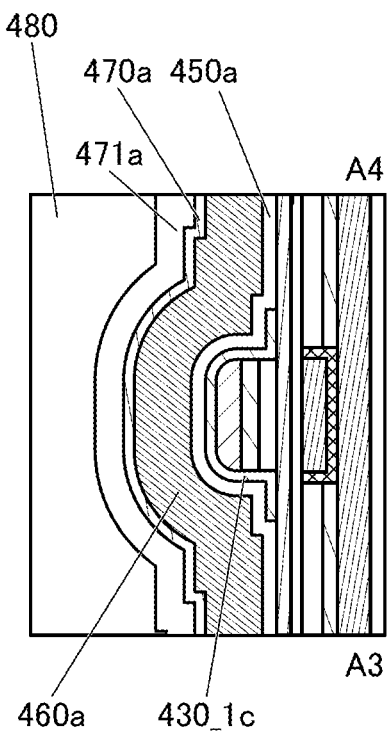
Figure 22B:
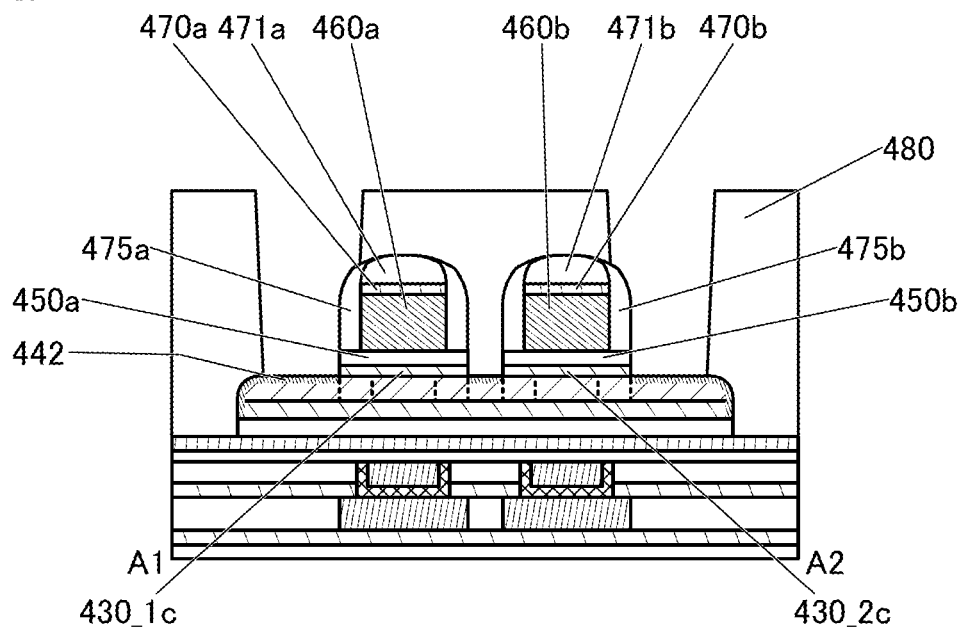

Next, openings are formed in the insulator 480 so as to reach a region serving as the other of the source region and the drain region of the transistor 400a and a region serving as the other of the source region and the drain region of the transistor 400b (see FIG. 22). Since the openings each have a high aspect ratio, for example, anisotropic etching with a hard mask is preferably performed in this step. Note that dry etching is preferably employed as anisotropic etching for a high aspect ratio.

Although the insulator 480 has a single-layer structure in FIG. 22, the insulator 480 may have a stacked structure of two or more layers. For example, to reduce the warpage of the substrate, a layer having compressive stress and a layer having tensile stress may be stacked to cancel the internal stress.

The openings provided in the insulator 480 are preferably provided so as to overlap with part of the insulator 475a or part of the insulator 475b. Thus, the conductor 510a and the conductor 510b are provided in contact with a side surface of the insulator 475a and a side surface of the insulator 475b, respectively.

Thus, the openings are preferably formed under the condition where the insulator 475a and the insulator 475b are hardly etched; in other words, the etching rate of the insulator 480 is preferably higher than that of the insulator 475a and the insulator 475b. When the etching rate of the insulator 475a and the insulator 475b is set to 1, the etching rate of the insulator 480 is preferably set to 5 or more, more preferably 10 or more. With such an opening condition, the positions and the shapes of the openings are determined in a self-aligned manner by the shape of the insulator 480, the shape of the insulator 475a, or the shape of the insulator 475b. Consequently, the distance between the opening and the gate electrode can be designed to be small, so that a semiconductor device can be highly integrated. The tolerance of misalignment of the conductor 460a, the conductor 460b, and the openings can be extended in a lithography process; thus, the yield should be improved.

Next, a conductive film to be the conductor 510a and the conductor 510b is formed so as to cover the openings provided in the insulator 480. The conductor 510a and the conductor 510b are formed along the inner walls and the bottom surfaces of the openings with a high aspect ratio. Thus, the conductive film to be the conductor 510a and the conductor 510b is preferably formed by a film formation method that provides favorable coverage, such as an ALD method or a CVD method. In this embodiment, titanium nitride deposited by an ALD method is used for the conductor 510a and the conductor 510b, for example.

Then, a filler is formed over the conductive film to be the conductor 510a and the conductor 510b so as to fill the openings provided in the insulator 480. The filler fills the openings provided in the insulator 480 to the degree allowing CMP treatment in a later step to be performed. For this reason, the filler does not need to completely fill the openings provided in the insulator 480. For the filler, either an insulator or a conductor can be used.

Then, the layer above the insulator 480 is removed by CMP treatment, so that the conductor 510a and the conductor 510b are formed. For example, the insulator 480 may be used as a stopper for the CMP treatment.

Figure 23A:
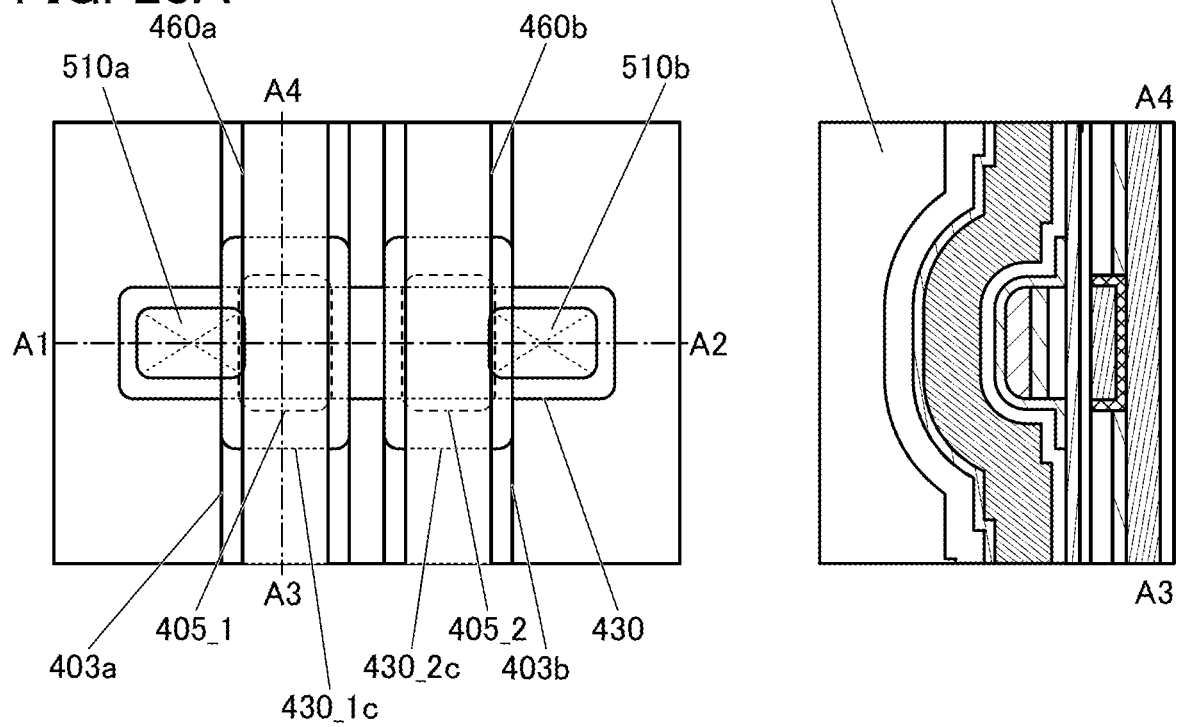
FIGS. 23A-23C are diagrams illustrating a method for manufacturing a semiconductor device.
Figure 23C:
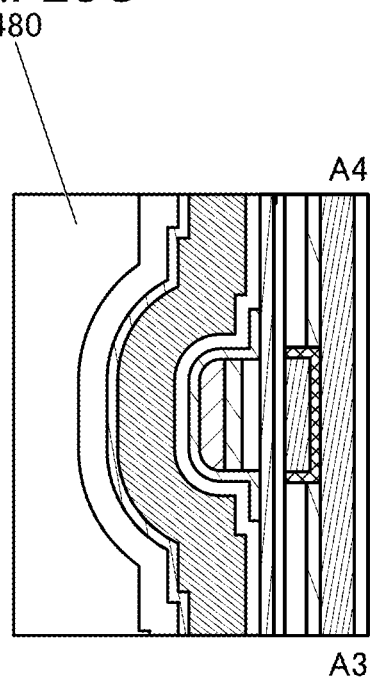
Figure 23B:
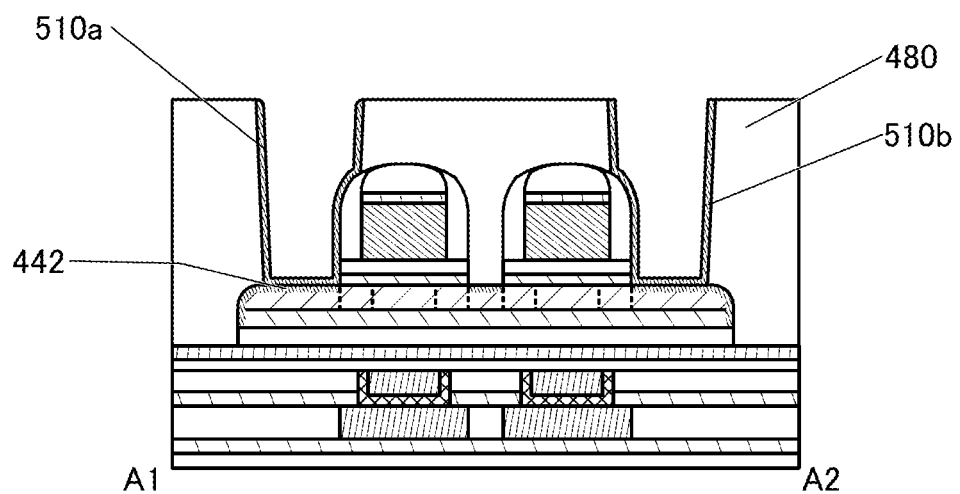

Then, the filler in the openings provided in the insulator 480 is removed by etching treatment (see FIG. 23). Either a wet etching method or a dry etching method can be used for the etching treatment. For example, the filler can be easily removed by a wet etching method with a hydrofluoric acid-based solution or the like as an etchant.

Next, the insulator 530 is formed over the conductor 510a, the conductor 510b, and the insulator 480 (see FIG. 24). The insulator 530 is formed over the conductor 510a and the conductor 510b, along the insides of the openings that are provided in the insulator 480 and have a high aspect ratio. Thus, the insulator 530 is preferably formed by a film formation method that provides favorable coverage, such as an ALD method or a CVD method.

When the insulator 530 is formed by a film formation method such as an ALD method to cover the conductors 510a and 510b favorably, a short circuit between the upper electrode and the lower electrode of the capacitor 500 can be prevented.

In the case where the above High-k material, in particular, an oxide containing hafnium is used for the insulator 530, heat treatment may be performed so that the insulator 530 can have a crystal structure and an increased dielectric constant.

The insulator 530 may have a stacked-layer structure; for example, two or more layers selected from silicon oxide, silicon oxynitride, silicon nitride oxide, silicon nitride, aluminum oxide, hafnium oxide, an oxide containing aluminum and hafnium (hafnium aluminate), and the like may be used for the stacked-layer structure. In this embodiment, hafnium oxide, aluminum oxide, and hafnium oxide are deposited in this order by an ALD method.

Next, a conductive film to be the conductor 520a and the conductor 520b is formed over the insulator 530. It is preferable that the conductive film to be the conductor 520a and the conductor 520b be at least formed inside the openings with a high aspect ratio that are provided in the insulator 480, with the conductor 510a or the conductor 510b and the insulator 530 between the conductive film and each of the openings. For this reason, the conductive film to be the conductor 520a and the conductor 520b is preferably formed by a film formation method that provides favorable coverage, such as an ALD method or a CVD method. Specifically, the conductive film to be the conductor 520a and the conductor 520b is preferably formed by a film formation method that provides good embeddability, such as a CVD method; for example, tungsten is preferably deposited by a metal CVD method.

Figure 25A:
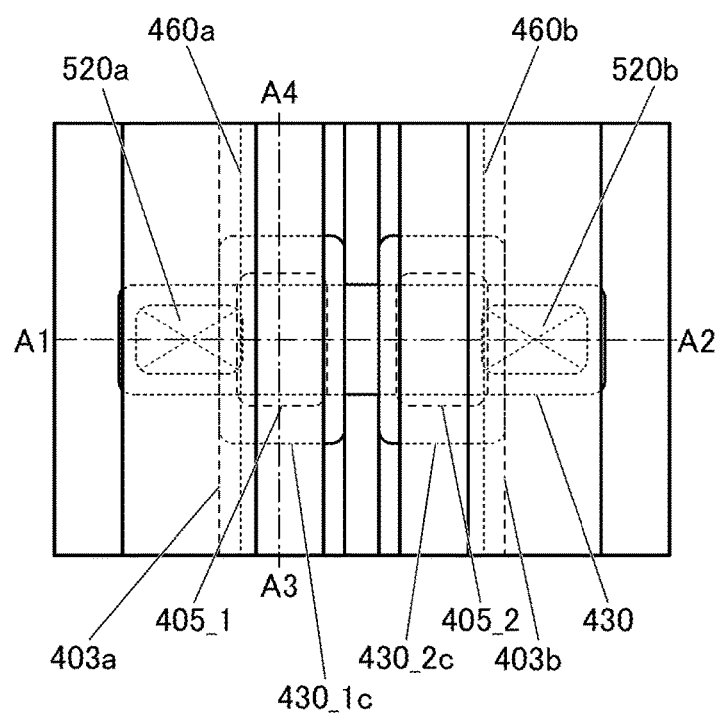
FIGS. 25A-25C are diagrams illustrating a method for manufacturing a semiconductor device.
Figure 25C:
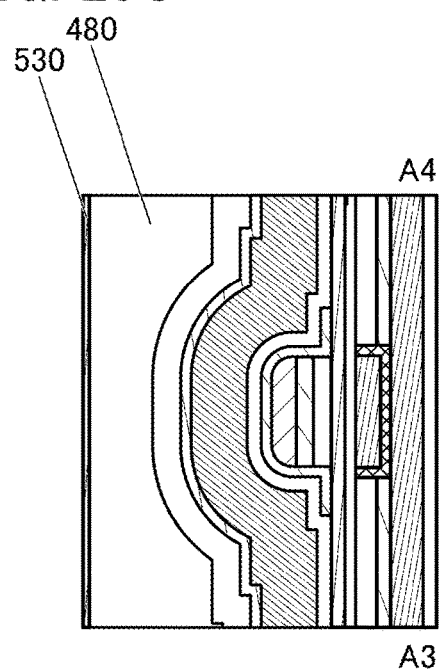
Figure 25B:
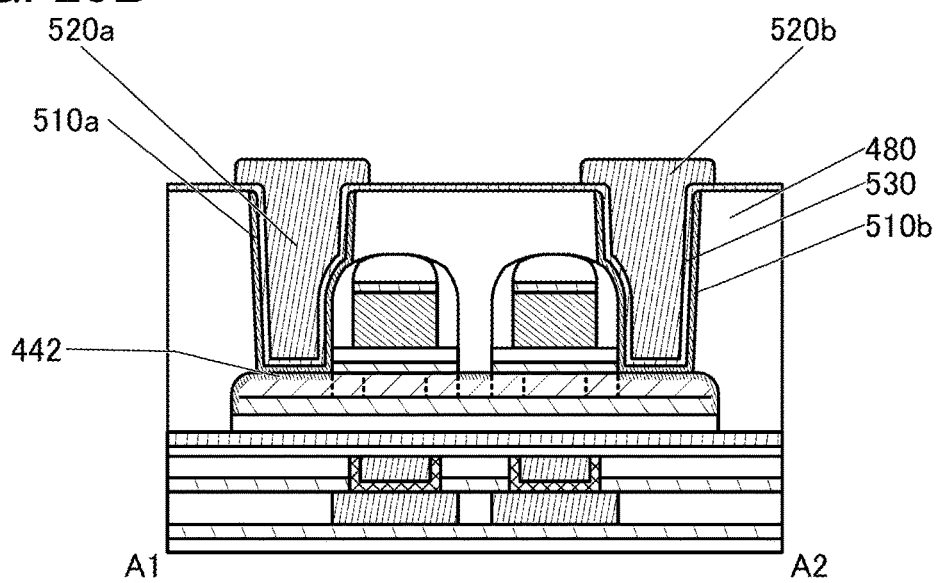
Figure 26A:
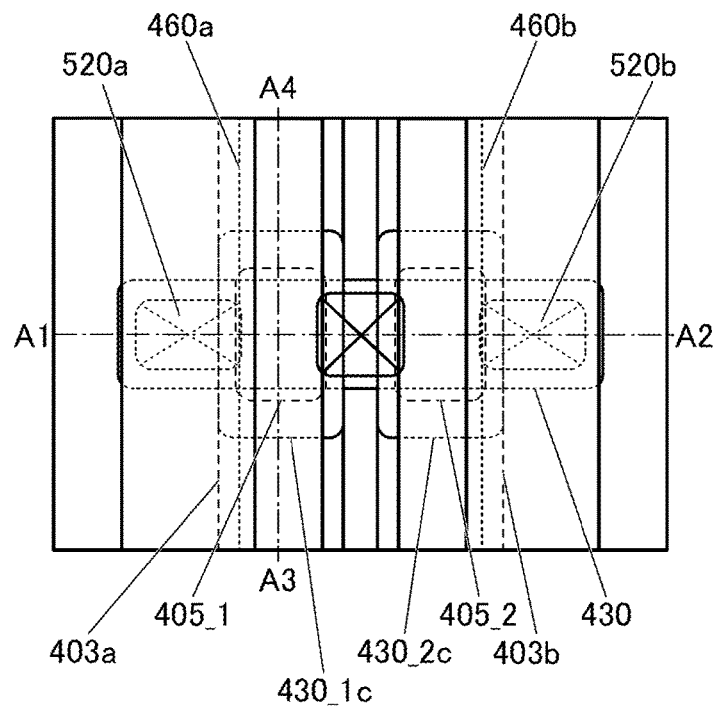
FIGS. 26A-26C are diagrams illustrating a method for manufacturing a semiconductor device.
Figure 26C:
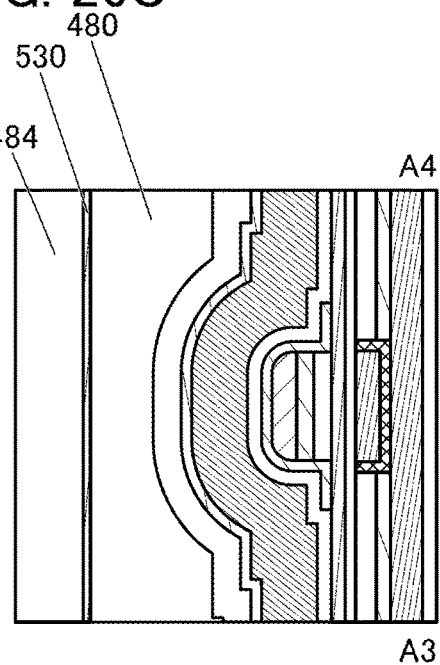
Figure 26B:
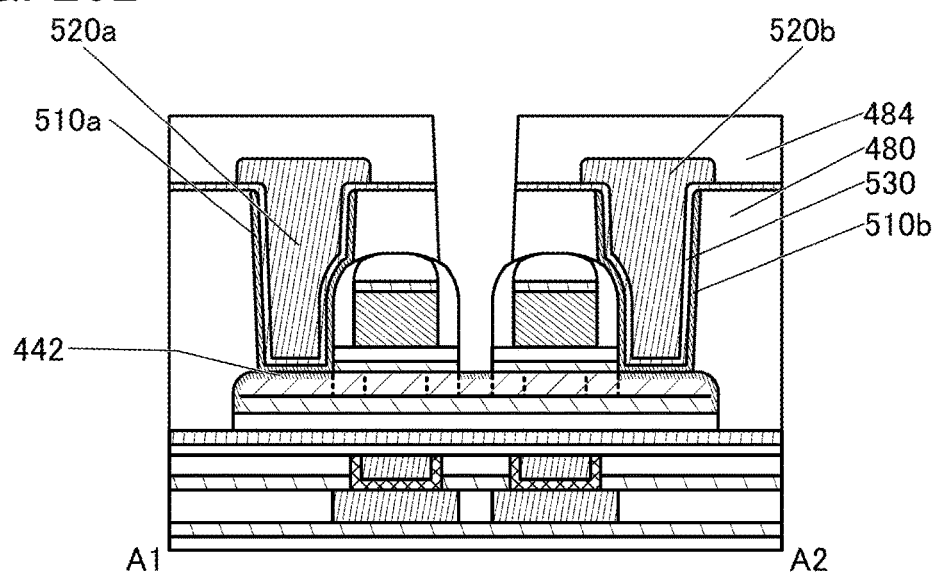
Figure 27A:
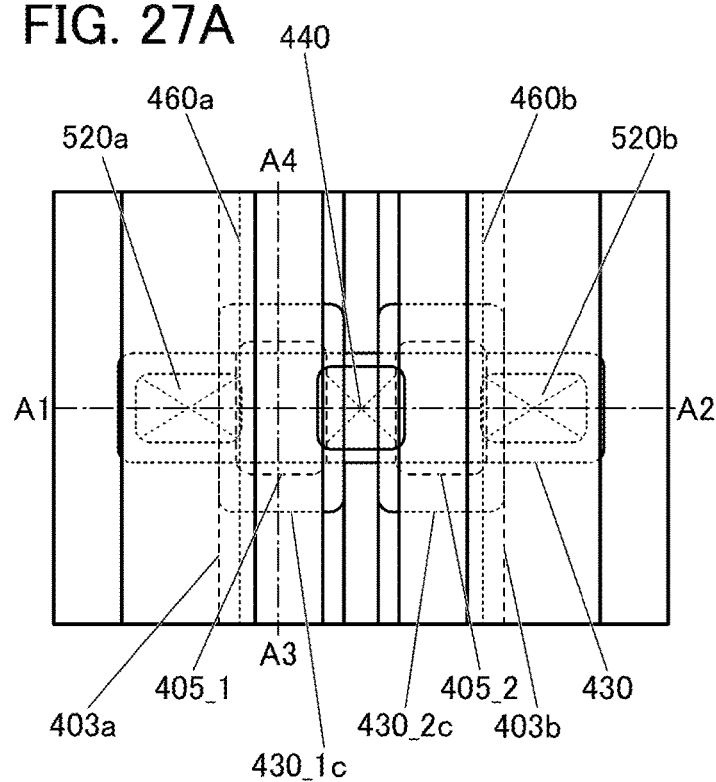
FIGS. 27A-27C are diagrams illustrating a method for manufacturing a semiconductor device.
Figure 27C:
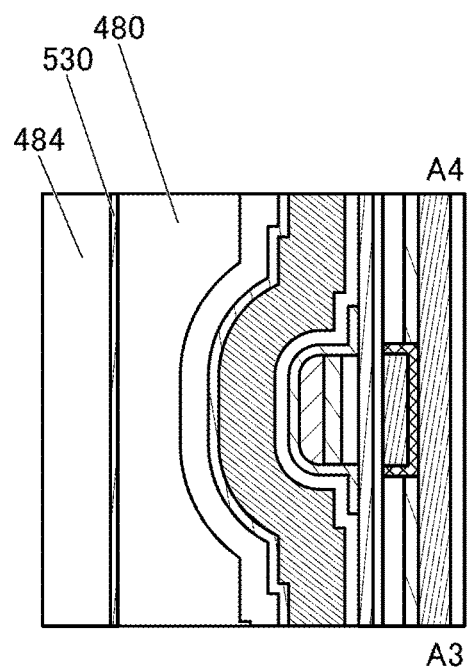
Figure 27B:
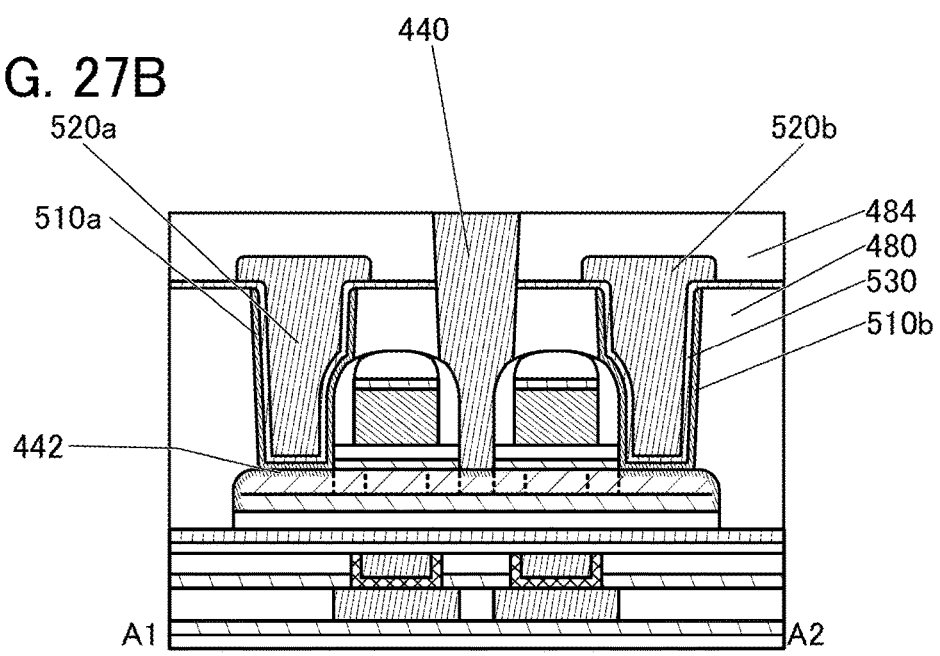

Subsequently, the conductive film to be the conductor 520a and the conductor 520b is processed to form the conductor 520a and the conductor 520b (see FIG. 25). Although the conductor 520a and the conductor 520b each having a single-layer structure are illustrated in FIG. 25, they may each have a stacked-layer structure of two or more layers.

Next, the insulator 484 is formed over the conductor 520a, the conductor 520b, and the insulator 530. Next, openings are formed so as to reach a region of the oxide 430 that serves as the other of the source region and the drain region of the transistor 400a or a region of the oxide 430 that serves as the other of the source region and the drain region of the transistor 400b (see FIG. 26). Since the openings have a high aspect ratio, anisotropic etching is preferably performed. Note that the opening provided in the insulator 480 and the insulator 484 is etched in a manner similar to that for providing the openings in the insulator 480.

Note that the opening provided in the insulator 480 and the insulator 484 is preferably provided such that one or both of the insulator 475a and the insulator 475b are exposed. Accordingly, the conductor 440 is provided in contact with one or both of the side surfaces of the insulator 475a and the insulator 475b.

Therefore, the opening is preferably formed under the condition where the insulator 475a or the insulator 475b is hardly etched, in other words, the etching rate of the insulator 480 is preferably higher than that of the insulator 475a or the insulator 475b. When the etching rate of the insulator 475a or the insulator 475b is set to 1, the etching rate of the insulator 480 is preferably set to 5 or more, more preferably 10 or more. With such an opening condition, the opening can be positioned in a self-aligned manner so as to reach a region serving as one of the source region and the drain region of the transistor 400a or a region serving as one of the source region and the drain region of the transistor 400b; thus, a miniaturized transistor can be manufactured. The tolerance of misalignment of the conductor 460a, the conductor 460b, and the opening can be extended in a lithography process; thus, the yield should be improved.

Next, a conductive film to be the conductor 440 is formed. The conductive film to be the conductor 440 desirably has a stacked-layer structure which includes a conductor having a function of inhibiting the passage of impurities such as water or hydrogen. For example, stacked layers of tantalum nitride, titanium nitride, or the like and tungsten, molybdenum, copper, or the like can be employed. The conductive film to be the conductor 440 can be formed by a sputtering method, a CVD method, an MBE method, a PLD method, an ALD method, or the like.

Next, CMP treatment is performed to remove the conductive film to be the conductor 440 over the insulator 484. As a result, the conductive film remains only in the above-described opening, whereby the conductor 440 having a flat top surface can be formed (see FIG. 27).

Through the above process, the semiconductor device including the transistor 400a, the transistor 400b, the capacitor 500a, and the capacitor 500b illustrated in FIG. 11 can be manufactured.

This embodiment can be implemented in combination with the other embodiments as appropriate.

Embodiment 6

Figure 12:
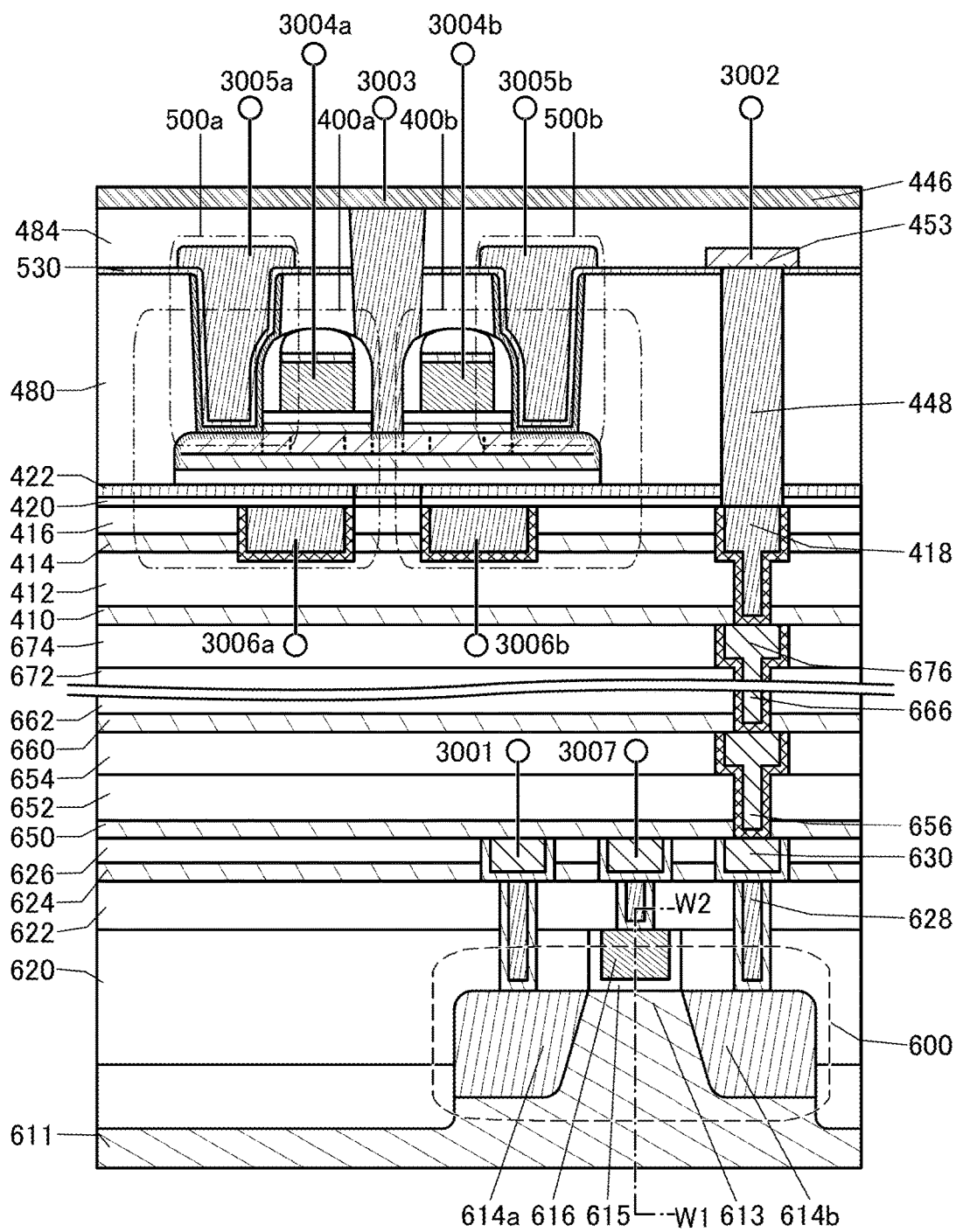
FIG. 12 is a diagram illustrating a structure example of a semiconductor device.

In this embodiment, one embodiment of a semiconductor device will be described with reference to FIG. 12. A semiconductor device illustrated in FIG. 12 includes the transistor 400a, the capacitor 500a, the transistor 400b, and the capacitor 500b illustrated in FIG. 11 above a transistor 600. FIG. 12 is a cross-sectional view of the transistor 400a, the transistor 400b, and the transistor 600 in the channel length direction. The description of the transistor 400a, the capacitor 500a, the transistor 400b, and the capacitor 500b in Embodiment 3 can be referred to for the structures of the transistor 400a, the capacitor 500a, the transistor 400b, and the capacitor 500b illustrated in FIG. 12.

A wiring 3001 is electrically connected to one of a source and a drain of the transistor 600, a wiring 3002 is electrically connected to the other of the source and the drain of the transistor 600, and a wiring 3007 is electrically connected to a gate of the transistor 600. A wiring 3003 is electrically connected to one of the source and the drain of the transistor 400a and one of the source and the drain of the transistor 400b, a wiring 3004a is electrically connected to the first gate electrode of the transistor 400a, a wiring 3004b is electrically connected to the first gate electrode of the transistor 400b, a wiring 3006a is electrically connected to the second gate electrode of the transistor 400a, and a wiring 3006b is electrically connected to the second gate electrode of the transistor 400b. A wiring 3005a is electrically connected to one electrode of the capacitor 500a, and a wiring 3005b is electrically connected to one electrode of the capacitor 500b.

The transistor 400a, the transistor 400b, the capacitor 500a, and the capacitor 500b are provided above the transistor 600. The transistor 600 is provided on a substrate 611 and includes a conductor 616, an insulator 615, a semiconductor region 613 that is a part of the substrate 611, and a low-resistance region 614a and a low-resistance region 614b functioning as a source region and a drain region. The transistor 600 is either a p-channel transistor or an n-channel transistor.

A channel formation region of the semiconductor region 613, a region in the vicinity thereof, the low-resistance region 614a and the low-resistance region 614b functioning as the source region and the drain region, and the like preferably contain a semiconductor such as a silicon-based semiconductor, more preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 600 may be an HEMT (High Electron Mobility Transistor) by using GaAs and GaAlAs, or the like.

Note that the transistor 600 illustrated in FIG. 12 is an example and the structure is not limited thereto; a transistor appropriate for a circuit configuration or a driving method is used.

An insulator 620, an insulator 622, an insulator 624, and an insulator 626 are provided to be stacked in this order to cover the transistor 600.

For the insulator 620, the insulator 622, the insulator 624, and the insulator 626, silicon oxide, silicon oxynitride, silicon nitride oxide, silicon nitride, aluminum oxide, aluminum oxynitride, aluminum nitride oxide, aluminum nitride, or the like is used, for example.

The insulator 622 may have a function of a planarization film for eliminating a level difference caused by the transistor 600 or the like provided below the insulator 622. For example, a top surface of the insulator 622 may be planarized by planarization treatment using a chemical mechanical polishing (CMP) method or the like to improve planarity.

For the insulator 624, it is preferred to use a film having a barrier property that prevents diffusion of hydrogen and impurities from the substrate 611, the transistor 600, or the like into a region where the transistor 400a and the transistor 400b are provided.

As an example of the film having a barrier property against hydrogen, silicon nitride formed by a CVD method can be used. Here, the diffusion of hydrogen into a semiconductor element including an oxide semiconductor, such as the transistor 400a or the transistor 400b, degrades the characteristics of the semiconductor element in some cases. Therefore, a film that inhibits diffusion of hydrogen is preferably used between the transistor 600 and the transistor 400a and the transistor 400b. The film that inhibits diffusion of hydrogen is specifically a film from which a small amount of hydrogen is released.

The amount of released hydrogen can be analyzed by thermal desorption spectroscopy (TDS), for example. The amount of hydrogen released from the insulator 624 that is converted into hydrogen atoms per area of the insulator 624 is less than or equal to $10 \times 10^{15}$ atoms/cm$^2$, preferably less than or equal to $5 \times 10^{15}$ atoms/cm$^2$ in the TDS analysis in a film-surface temperature ranging from 50° C. to 500° C., for example.

Note that the insulator 626 preferably has a lower permittivity than the insulator 624. For example, the dielectric constant of the insulator 626 is preferably lower than 4, more preferably lower than 3. For example, the dielectric constant of the insulator 626 is preferably 0.7 times or less, more preferably 0.6 times or less the dielectric constant of the insulator 624. When a material with a low permittivity is used for an interlayer film, the parasitic capacitance generated between wirings can be reduced.

The conductor 628, the conductor 630, and the like that are electrically connected to the transistor 600 are embedded in the insulator 620, the insulator 622, the insulator 624, and the insulator 626. Note that the conductor 628 and the conductor 630 have functions of plugs or wirings. In addition, a plurality of conductors having functions of plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material for each of the plugs and wirings (the conductor 628, the conductor 630, and the like), a single layer or a stacked layer of a conductive material such as a metal material, an alloy material, a metal nitride material, or a metal oxide material can be used. It is particularly preferred to use a high-melting-point material that has both heat resistance and conductivity, such as tungsten or molybdenum; it is particularly preferred to use tungsten. Alternatively, it is preferred to form each of the plugs and wirings using a low-resistance conductive material such as aluminum or copper. The use of a low-resistance conductive material can reduce wiring resistance.

A wiring layer may be provided over the insulator 626 and the conductor 630. For example, in FIG. 12, an insulator 650 and an insulator 652 are provided to be stacked in this order. Furthermore, a conductor 656 is formed in the insulator 650 and the insulator 652. The conductor 656 has a function of a plug or a wiring. Note that the conductor 656 can be provided using a material similar to those for the conductor 628 and the conductor 630.

Note that for example, an insulator having a barrier property against hydrogen is preferably used for the insulator 650, as in the case of the insulator 624. Furthermore, the conductor 656 preferably includes a conductor having a barrier property against hydrogen. Specifically, the conductor having a barrier property against hydrogen is formed in an opening portion included in the insulator 650 having a barrier property against hydrogen. In such a structure, the transistor 600 can be separated from the transistor 400a and the transistor 400b by a barrier layer, so that diffusion of hydrogen from the transistor 600 into the transistor 400a and the transistor 400b can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 600 can be inhibited while the conductivity of a wiring is kept. In that case, it is preferred to have a structure in which a tantalum nitride layer having a barrier property against hydrogen is in contact with the insulator 650 having a barrier property against hydrogen.

In the above, a wiring layer including the conductor 656 is described; however, the semiconductor device of this embodiment is not limited thereto. Three or less wiring layers that are similar to the wiring layer including the conductor 656 may be provided, or five or more wiring layers that are similar to the wiring layer including the conductor 656 may be provided.

Furthermore, a wiring layer may be provided over the insulator 654 and the conductor 656. For example, a wiring layer including an insulator 660, an insulator 662, and a conductor 666 and a wiring layer including an insulator 672, an insulator 674, and a conductor 676 are provided by being stacked in this order in FIG. 12. Furthermore, a plurality of wiring layers may be provided between the wiring layer including the insulator 660, the insulator 662, and the conductor 666 and the wiring layer including the insulator 672, the insulator 674, and the conductor 676. Note that the conductor 666 and the conductor 676 have a function of a plug or a wiring. The insulator 660 to the insulator 674 can be provided using a material similar to that for the insulator described above.

The insulator 410 and the insulator 412 are provided to be stacked in this order over the insulator 674. A material having a barrier property against oxygen and hydrogen is preferably used for either the insulator 410 or the insulator 412.

For the insulator 410, for example, it is preferred to use a film having a barrier property that prevents diffusion of hydrogen and impurities from the substrate 611, a region where the transistor 600 is provided, or the like into a region where the transistor 400a and the transistor 400b are provided. Therefore, a material similar to that for the insulator 624 can be used.

As an example of the film having a barrier property against hydrogen, silicon nitride formed by a CVD method can be used. Here, the diffusion of hydrogen into a semiconductor element including an oxide semiconductor, such as the transistor 400a or the transistor 400b, degrades the characteristics of the semiconductor element in some cases. Therefore, a film that inhibits diffusion of hydrogen is preferably used between the transistor 600 and the transistor 400a and the transistor 400b. The film that inhibits diffusion of hydrogen is specifically a film from which a small amount of hydrogen is released.

As the film having a barrier property against hydrogen used for the insulator 410, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent entry of impurities such as hydrogen and moisture into the transistor 400a and the transistor 400b in a manufacturing process of the transistor and after the manufacturing process. In addition, release of oxygen from the oxide included in the transistor 400a and the transistor 400b can be inhibited. Therefore, aluminum oxide is suitably used for a protective film for the transistor 400a and the transistor 400b.

For the insulator 412, for example, a material similar to that for the insulator 620 can be used. When a material with a relatively low permittivity is used for an interlayer film, the parasitic capacitance between wirings can be reduced. For example, a silicon oxide film, a silicon oxynitride film, or the like can be used for the insulator 412.

Moreover, a conductor 418, and conductors and the like included in the transistor 400a and the transistor 400b are embedded in the insulator 410, the insulator 412, the insulator 414, and the insulator 416. Note that the conductor 418 has a function of a plug or a wiring that is electrically connected to the transistor 600 or the transistor 400a and the transistor 400b. The conductor 418 can be provided using a material similar to those for the conductor 628 and the conductor 630.

In particular, the conductor 418 in a region in contact with the insulator 410 and the insulator 414 is preferably a conductor having a barrier property against oxygen, hydrogen, and water. In such a structure, the transistor 600 can be separated from the transistor 400*a* and the transistor 400*b* by a layer having a barrier property against oxygen, hydrogen, and water; thus, the diffusion of hydrogen from the transistor 600 into the transistor 400*a* and the transistor 400*b* can be inhibited.

The transistor 400*a*, the transistor 400*b*, the capacitor 500*a*, and the capacitor 500*b* are provided above the insulator 412. Note that the structures of the transistor 400*a*, the transistor 400*b*, the capacitor 500*a*, and the capacitor 500*b* described in the above embodiment can be used as those of the transistor 400*a*, the transistor 400*b*, the capacitor 500*a*, and the capacitor 500*b*. Note that the transistor 400*a*, the transistor 400*b*, the capacitor 500*a*, and the capacitor 500*b* illustrated in FIG. 12 are just examples and the structures are not limited thereto; an appropriate transistor and an appropriate capacitor are used in accordance with a circuit configuration or a driving method.

Furthermore, a conductor 448 is provided in contact with the conductor 418, so that the conductor 453 which is connected to the transistor 600 can be extracted above the transistor 400*a* and the transistor 400*b*. Although the wiring 3002 is extracted above the transistor 400*a* and the transistor 400*b* in FIG. 12, this is not necessarily employed; a structure may be employed in which the wiring 3001, the wiring 3007, and the like are extracted above the transistor 400*a* and the transistor 400*b*.

The above is the description of the structure example. With the use of the structure, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with a low off-state current can be provided. Alternatively, a semiconductor device with low power consumption can be provided.

Next, the number of masks needed for fabrication of a common DRAM with a memory cell including a transistor using silicon and a capacitor and the number of masks needed for fabrication of the semiconductor device of one embodiment of the present invention were compared. In the comparison, it is assumed that the same fabrication process for a peripheral circuit is employed for a common DRAM and the semiconductor device of one embodiment of the present invention. The number of masks for a memory cell portion of the common DRAM was counted on the basis of the manufacturing method of a semiconductor device that is described in Japanese Published Patent Application No. 2016-127193. The number of masks for a memory cell portion of one embodiment of the present invention was counted on the basis of the manufacturing method described in Embodiment 5.

Table 1 below shows the roughly estimated number of masks for each of the common DRAM and the semiconductor device of one embodiment of the present invention (denoted by DOSRAM).

TABLE 1

|  | DRAM | DOSRAM |
| --- | --- | --- |
| Peripheral circuit portion | 14 | 10 |
| Memory cell portion | 15 | 12 |
| Wiring portion | 10 | 14 |
| Total | 39 sheets | 36 sheets |

As shown in Table 1, the number of masks for a peripheral circuit portion is estimated to be smaller in the DOSRAM than in the DRAM by four. This is because extra masks are needed in the case of a DRAM in order to separately form a transistor in the peripheral circuit portion and a transistor in a memory cell portion. Specifically, in the case of a DRAM, two more masks for separately forming gate insulating films and another two more masks for separately forming LDD structures are necessary.

The number of masks for a memory cell portion is estimated to be smaller in the DOSRAM than in the DRAM by three. This is because in the case of a DOSRAM, the capacitor 500*a* and the capacitor 500*b* have a cylinder shape, and thus, a step for opening a contact hole for ensuring electrical connection between the transistor 400*a* and the capacitor 500*a* can be omitted. The contact hole needs minute processing where patterning is performed twice with different masks; thus, the number of masks can be reduced by two in the case of a DOSRAM. In addition, in the DOSRAM, the capacitance values of the capacitor 500*a* and the capacitor 500*b* that are necessary for operation can be reduced compared with those in a DRAM; therefore, the widths of the capacitor 500*a* and the capacitor 500*b* in the height direction can be reduced, resulting in elimination of one mask for forming a supporting film for supporting the capacitor 500*a* and the capacitor 500*b*.

The number of masks for a wiring portion is estimated to be larger in the DOSRAM than in the DRAM by four. This is because a DOSRAM additionally requires a back gate wiring electrically connected to a second gate electrode and a wiring for driving a sense amplifier below a cell array. Specifically, a DOSRAM, which is provided with two more wiring layers than a DRAM, requires extra four masks.

This embodiment can be implemented in combination with the other embodiments as appropriate.

Embodiment 7

In this embodiment, electronic devices or the like in which the semiconductor device or the computer described in the foregoing embodiment can be used will be described.

The semiconductor device or the computer of one embodiment of the present invention can be provided in a variety of electronic devices. In particular, the semiconductor device of one embodiment of the present invention can be used as a memory incorporated in an electronic device. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 28 illustrates examples of electronic devices.

Figure 28A:
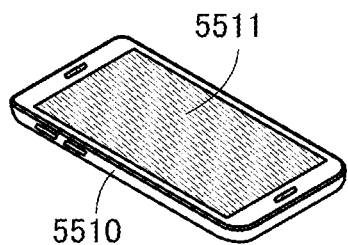

FIG. 28(A) illustrates a mobile phone (smartphone) which is a type of an information terminal. The information terminal 5500 includes a housing 5510 and a display portion 5511. As input interfaces, a touch panel and a button are provided in the display portion 5511 and the housing 5510, respectively.

Figure 28B:
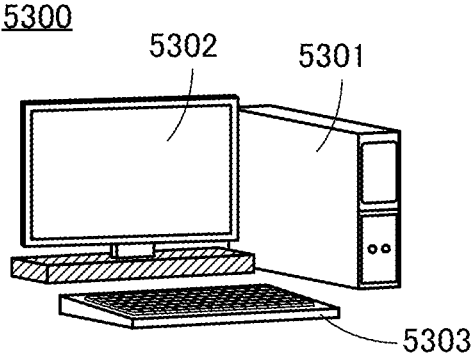

FIG. 28(B) illustrates a desktop information terminal 5300. The desktop information terminal 5300 includes a main body 5301 of the information terminal, a display 5302, and a keyboard 5303.

Note that although FIGS. 28(A) and 28(B) illustrate a smartphone and a desktop information terminal, respectively, as examples of the electronic device in the above description, an information terminal other than a smartphone and a desktop information terminal can be used. Examples of information terminals other than a smartphone and a desktop information terminal include a PDA (Personal Digital Assistant), a laptop information terminal, and a workstation.

Figure 28C:
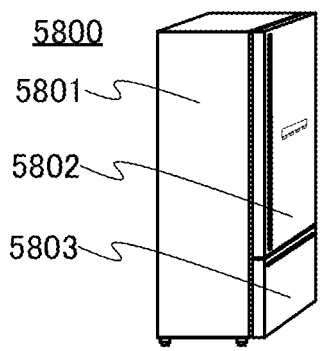

FIG. 28(C) illustrates an electric refrigerator-freezer 5800 which is an example of an electrical appliance. The electric refrigerator-freezer 5800 includes a housing 5801, a refrigerator door 5802, a freezer door 5803, and the like.

Although the electric refrigerator-freezer is described here as an electrical appliance in this example, other examples of electrical appliances include a vacuum cleaner, a microwave oven, an electric oven, a rice cooker, a water heater, an IH cooker, a water server, heating and cooling equipment such as an air conditioner, a washing machine, a drying machine, and an audio visual appliance.

Figure 28D:
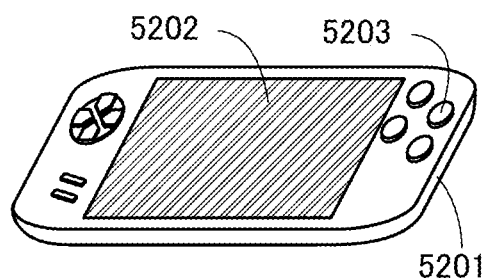
Figure 28D:
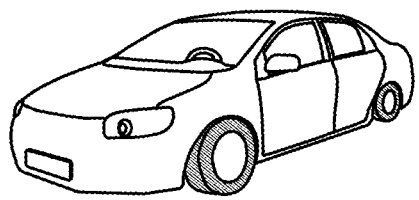
Figure 28D:
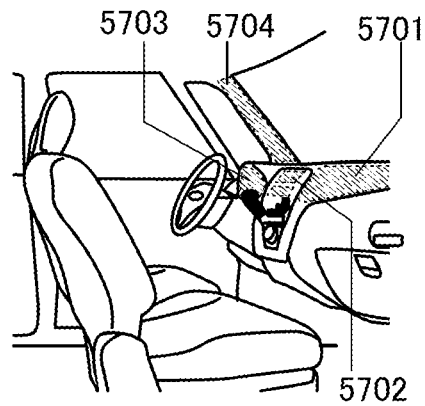

FIG. 28(D) illustrates a portable game machine 5200 as an example of a game machine. The portable game machine includes a housing 5201, a display portion 5202, a button 5203, and the like.

Although the portable game machine is illustrated as an example of a game machine in FIG. 28(D), game machines using the semiconductor device or the computer of one embodiment of the present invention are not limited thereto. Examples of game machines using the semiconductor device or the computer of one embodiment of the present invention include a home stationary game console, an arcade game machine installed in an entertainment facility (a game center, an amusement park, or the like), and a throwing machine for batting practice installed in sports facilities.

FIG. 28(E1) illustrates an automobile 5700 as an example of a moving vehicle, and FIG. 28(E2) is a diagram illustrating the periphery of a windshield inside the automobile. FIG. 28(E1) illustrates a display panel 5701, a display panel 5702, and a display panel 5703 that are attached to a dashboard and a display panel 5704 that is attached to a pillar.

The display panel 5701 to the display panel 5703 can provide a variety of kinds of information such as a speedometer, a tachometer, a mileage, the fuel supply amount, the gear state, and air-condition setting. The content, layout, or the like of the display on the display panels can be changed freely to suit the user's preferences, so that the design can be improved. The display panel 5701 to the display panel 5703 can also be used as lighting devices.

The display panel 5704 can compensate for the view obstructed by the pillar (blind areas) by projecting an image taken by an imaging device (not illustrated) provided for the automobile 5700. That is, displaying an image taken by the imaging device provided on the outside of the automobile 5700 leads to elimination of blind areas and enhancement of safety. In addition, projecting an image so as to compensate for the area which cannot be seen makes it possible to confirm safety naturally and comfortably. The display panel 5704 can also be used as a lighting device.

Although an automobile is described above as an example of a moving vehicle, moving vehicles are not limited to automobiles. Examples of moving vehicles include a train, a monorail train, a ship, and a flying object (a helicopter, an unmanned aircraft (a drone), an airplane, and a rocket), and these moving vehicles can include a system utilizing artificial intelligence when the computer of one embodiment of the present invention is used for the moving vehicles.

The semiconductor device or the computer of one embodiment of the present invention is used in a variety of electronic devices described above, whereby a smaller size, higher speed, or lower power consumption of the electronic devices can be achieved. Furthermore, heat generation from a circuit can be reduced owing to low power consumption; thus, the influence of heat generation on the circuit itself, the peripheral circuit, and the module can be reduced.

This embodiment can be combined with the description of the other embodiments as appropriate.

EXAMPLE

In this example, effects of a structure where the cell array CA is stacked above the sense amplifier array SAA and the like will be described. Here, specifically, the evaluation results of effects of the stacked-layer structure on the operation speed, the circuit area, and the like will be described. Note that in this example, a DRAM using an OS transistor as illustrated in FIG. 2(B-1) to FIG. 2(B-3) is also referred to as a DOSRAM (Dynamic Oxide Semiconductor Random Access Memory).

For the evaluation, four kinds of memory circuits (memory circuits A to D) are used. A memory circuit A is a DRAM using a Si transistor in a memory cell, and memory circuits B, C, and D are DOSRAMs. The memory circuit B is a memory circuit having a structure where the cell array CA and the sense amplifier array SAA are not stacked and are provided in the same layer. The memory circuit C is a memory circuit having a structure where the cell array CA is stacked above the sense amplifier array SAA as illustrated in FIG. 3(A) (a stacked-layer structure A). The memory circuit D is a memory circuit having a structure where the cell array CA is stacked above the driver circuit RD, the sense amplifier array SAA, and the global sense amplifier GSA as illustrated in FIG. 3(B) (a stacked-layer structure B).

First, comparison of the operation speed between the memory circuits A to D is performed. The operation speed of the memory circuit A (DRAM) is calculated assuming that the width of the wiring WL is 25 nm and the length thereof is 140 nm. The operation speed of each of the memory circuits B, C, and D (DOSRAMs) is calculated assuming that the width of the wiring WL is 25 nm and the length thereof is 25 nm. Table 2 shows the evaluation results of the resistance of the memory cell MC, capacitance value $C_{BL}$ of the wiring BL, capacitance value Cs of a capacitor provided in the memory cell MC, and the operation speed of the memory cell MC of each of the memory circuits A to D. The operation speed of the memory cell MC is calculated assuming that the speed of the memory circuit A (DRAM) is 1.

TABLE 2

| Memory circuit | A (DRAM) | B (DOSRAM) | C (DOSRAM) | D (DOSRAM) |
| --- | --- | --- | --- | --- |
| Stacked-layer structure | None | None | Stack A | Stack B |
| Cell resiastance | 230 kΩ | 460 kΩ | 460 kΩ | 460 kΩ |
| $C_{BL}$ | approximately 50 fF | 40 fF | 10 fF | 20 fF |
| $C_S$ | approximately 15 fF | 12 fF | 1.5 fF | 3 fF |
| Cell operation speed | — | approximately × 1 | approximately × 5 | approximately × 2.5 |

As shown in Table 2, it is found that the use of the stacked-layer structure can reduce the capacitance of the wiring BL and the size of the capacitor in the memory cell MC. Thus, it is also found that the memory circuits with the stacked-layer structure (the memory circuits C and D) can operate at high speed.

Table 3 shows the estimation results of the data retention time of the memory cell MC, the number of memory cells MC connected to one wiring BL, and the area reduction rate of each of the memory circuits A to D. Note that the area reduction rate is calculated using the memory circuit A (DRAM) as a reference.

TABLE 3

| Memory circuit | A (DRAM) | B (DOSRAM) | C (DOSRAM) | D (DOSRAM) |
| --- | --- | --- | --- | --- |
| Stacked-layer structure | None | None | Stack A | Stack B |
| Retention time | 64 ms | 10 s or more | 10 s or more | 10 s or more |
| Number of cells per BL | 512 | 512 | 128 | 256 |
| Area reduction rate | — | 0% | approximately 13% | approximately 19% |

As shown in Table 3, it is found that the stacked-layer structure is effective for an area reduction (the memory circuits C and D). It is also found that the use of the structure of the stack B allows a further area reduction compared with the structure of the stack A.

The above indicates that the structure where the memory cell MC is formed using an OS transistor and stacked above the sense amplifier array SAA and the like is effective in increasing the speed of a memory circuit and reducing the area thereof.

REFERENCE NUMERALS

10: semiconductor device, 11: block, 50: computer, 51: processing unit, 52: memory unit, 53: memory unit, 54: input unit, 55: output unit, 56: transmission path, 200: transistor, 400a: transistor, 400b: transistor, 405_1: conductor, 405_1a: conductor, 405_1b: conductor, 405_2: conductor, 405_2a: conductor, 405_2b: conductor, 410: insulator, 412: insulator, 414: insulator, 416: insulator, 418: conductor, 420: insulator, 422: insulator, 424: insulator, 430: oxide, 430_1c: oxide, 430_2c: oxide, 430a: oxide, 430A: oxide film, 430b: oxide, 430B: oxide film, 430c: oxide film, 430_c1: oxide, 430_c2: oxide, 440: conductor, 442: region, 442b: conductor, 442a: conductor, 442A: film, 442b: conductor, 442c: conductor, 443a: region, 443b: region, 443c: region, 444: insulator, 446: conductor, 448: conductor, 450: insulating film, 450_1: insulator, 450_2: insulator, 450a: insulator, 450b: insulator, 453: conductor, 460: conductive film, 460_1: conductor, 460_1a: conductor, 460_1b: conductor, 460_2: conductor, 460_2a: conductor, 460_2b: conductor, 460a: conductor, 460b: conductor, 470: insulating film, 470a: insulator, 470b: insulator, 471: insulating film, 471a: insulator, 471b: insulator, 474: insulator, 475: insulating film, 475a: insulator, 475b: insulator, 480: insulator, 481: insulator, 484: insulator, 490: insulator, 491: insulator, 492a: conductor, 492b: conductor, 500: capacitor, 500a: capacitor, 500b: capacitor, 510: conductor, 510a: conductor, 510b: conductor, 520a: conductor, 520b: conductor, 530: insulator, 540: insulator, 600: transistor, 611: substrate, 613: semiconductor region, 614a: low-resistance region, 614b: low-resistance region, 615: insulator, 616: conductor, 620: insulator, 622: insulator, 624: insulator, 626: insulator, 628: conductor, 630: conductor, 650: insulator, 652: insulator, 654: insulator, 656: conductor, 660: insulator, 662: insulator, 666: conductor, 672: insulator, 674: insulator, 676: conductor, 3001: wiring, 3002: wiring, 3003: wiring, 3004a: wiring, 3004b: wiring, 3005a: wiring, 3005b: wiring, 3006a: wiring, 3006b: wiring, 3007: wiring, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5700: automobile, 5701: display panel, 5702: display panel, 5703: display panel, 5704: display panel, 5800: electric refrigerator-freezer, 5801: housing, 5802: refrigerator door, 5803: freezer door This application is based on Japanese Patent Application Serial No. 2017-170766 filed with Japan Patent Office on Sep. 6, 2017 and Japanese Patent Application Serial No. 2017-171116 filed with Japan Patent Office on Sep. 6, 2017, the entire contents of which are hereby incorporated herein by reference.

The invention claimed is:
1. A semiconductor device comprising:
   a cell array comprising a plurality of memory cells;
   a driver circuit electrically connected to the cell array through a first wiring;
   a first amplifier circuit electrically connected to the cell array through a second wiring; and
   a second amplifier circuit electrically connected to the first amplifier circuit, wherein the first amplifier circuit is configured to amplify a potential input from the cell array through the second wiring, wherein the second amplifier circuit is configured to amplify a potential input from the first amplifier circuit, and wherein each of the driver circuit, the first amplifier circuit, and the second amplifier circuit comprises a region overlapping with the cell array.

2. The semiconductor device according to claim 1, further comprising a control circuit, wherein the control circuit is electrically connected to the driver circuit and the second amplifier circuit.

3. The semiconductor device according to claim 1, wherein each of the plurality of memory cells comprises a transistor and a capacitor electrically connected to the transistor, and wherein the transistor comprises an oxide semiconductor layer comprising a channel formation region.

4. The semiconductor device according to claim 3, wherein the oxide semiconductor layer comprises indium, gallium, and zinc.

5. The semiconductor device according to claim 3, wherein the capacitor comprises:
a first conductor in contact with the oxide semiconductor layer;
a first insulating layer over the first conductor; and
a second conductor over the first insulating layer.

6. The semiconductor device according to claim 5, further comprising:

an insulator in contact with a side surface of a gate electrode of the transistor; and a second insulating layer over the gate electrode, wherein the second insulating layer comprises an opening, wherein the opening of the second insulating layer comprises a region overlapping with the oxide semiconductor layer and a region overlapping with the insulator, and wherein the first conductor is provided in the opening.

7. A semiconductor device comprising:
a cell array comprising a plurality of memory cells;
a first driver circuit electrically connected to the cell array;
a second driver circuit electrically connected to the cell array;
a first amplifier circuit electrically connected to the cell array;
a second amplifier circuit electrically connected to the cell array;
a third amplifier circuit electrically connected to the first amplifier circuit; and
a fourth amplifier circuit electrically connected to the second amplifier circuit, wherein the first driver circuit is adjacent to the second amplifier circuit and the third amplifier circuit, wherein the second driver circuit is adjacent to the first amplifier circuit and the fourth amplifier circuit, wherein the first amplifier circuit is configured to amplify a potential input from the cell array, wherein the second amplifier circuit is configured to amplify a potential input from the cell array, wherein the third amplifier circuit is configured to amplify a potential input from the first amplifier circuit, wherein the fourth amplifier circuit is configured to amplify a potential input from the second amplifier circuit, and wherein each of the first driver circuit, the second driver circuit, the first amplifier circuit, the second amplifier circuit, the third amplifier circuit, and the fourth amplifier circuit comprises a region overlapping with the cell array.

8. The semiconductor device according to claim 7, wherein each of the plurality of memory cells comprises a transistor and a capacitor electrically connected to the transistor, and wherein the transistor comprises an oxide semiconductor layer comprising a channel formation region.

9. The semiconductor device according to claim 8, wherein the oxide semiconductor layer comprises indium, gallium, and zinc.

10. The semiconductor device according to claim 8, wherein the capacitor comprises:
a first conductor in contact with the oxide semiconductor layer;
a first insulating layer over the first conductor; and
a second conductor over the first insulating layer.

11. The semiconductor device according to claim 10, further comprising:

an insulator in contact with a side surface of a gate electrode of the transistor; and a second insulating layer over the gate electrode, wherein the second insulating layer comprises an opening, wherein the opening of the second insulating layer comprises a region overlapping with the oxide semiconductor layer and a region overlapping with the insulator, and wherein the first conductor is provided in the opening.

12. A semiconductor device comprising:
a cell array comprising a plurality of memory cells;
a first driver circuit electrically connected to the cell array;
a second driver circuit electrically connected to the cell array;
a first amplifier circuit electrically connected to the cell array;
a second amplifier circuit electrically connected to the cell array;
a third amplifier circuit electrically connected to the first amplifier circuit; and
a fourth amplifier circuit electrically connected to the second amplifier circuit, wherein the first driver circuit is adjacent to the second amplifier circuit and the third amplifier circuit, wherein the second driver circuit is adjacent to the first amplifier circuit and the fourth amplifier circuit, wherein the first amplifier circuit is configured to amplify a potential input from the cell array, wherein the second amplifier circuit is configured to amplify a potential input from the cell array, wherein the third amplifier circuit is configured to amplify a potential input from the first amplifier circuit, wherein the fourth amplifier circuit is configured to amplify a potential input from the second amplifier circuit, wherein the third amplifier circuit is electrically connected to the fourth amplifier circuit, and wherein each of the first driver circuit, the second driver circuit, the first amplifier circuit, the second amplifier circuit, the third amplifier circuit, and the fourth amplifier circuit comprises a region overlapping with the cell array.

13. The semiconductor device according to claim 12,
wherein each of the plurality of memory cells comprises
a transistor and a capacitor electrically connected to the
transistor, and
wherein the transistor comprises an oxide semiconductor layer comprising a channel formation region.

14. The semiconductor device according to claim 13,
wherein the oxide semiconductor layer comprises indium, gallium, and zinc.

15. The semiconductor device according to claim 13,
wherein the capacitor comprises:
a first conductor in contact with the oxide semiconductor layer;
a first insulating layer over the first conductor; and
a second conductor over the first insulating layer.

16. The semiconductor device according to claim 15, further comprising:
an insulator in contact with a side surface of a gate electrode of the transistor; and
a second insulating layer over the gate electrode,
wherein the second insulating layer comprises an opening,
wherein the opening of the second insulating layer comprises a region overlapping with the oxide semiconductor layer and a region overlapping with the insulator, and
wherein the first conductor is provided in the opening.

* * * * *